(12) United States Patent
Takeuchi

(10) Patent No.: US 7,269,073 B2
(45) Date of Patent: Sep. 11, 2007

(54) NONVOLATILE SEMICONDUCTOR MEMORY

(75) Inventor: Ken Takeuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/417,248

(22) Filed: May 4, 2006

(65) Prior Publication Data

US 2006/0215458 A1 Sep. 28, 2006

Related U.S. Application Data

(62) Division of application No. 10/899,160, filed on Jul. 27, 2004.

(30) Foreign Application Priority Data

Mar. 22, 2004 (JP) ............................. 2004-082730

(51) Int. Cl.
*G11C 16/06* (2006.01)
(52) U.S. Cl. ........................... 365/185.25; 365/185.21; 365/149
(58) Field of Classification Search ........... 365/185.21, 365/185.25, 149
See application file for complete search history.

(56) References Cited

U.S. PATENT DOCUMENTS

| | | | |
|---|---|---|---|
| 5,781,473 A | 7/1998 | Javanifard et al. | |
| 5,801,992 A * | 9/1998 | Hirano | 365/185.25 |
| 5,986,933 A | 11/1999 | Takeuchi et al. | |
| 6,055,188 A | 4/2000 | Takeuchi et al. | |
| 6,067,248 A | 5/2000 | Yoo | |
| 6,301,153 B1 | 10/2001 | Takeuchi et al. | |
| 6,373,746 B1 | 4/2002 | Takeuchi et al. | |
| 6,744,680 B2 | 6/2004 | Namekawa et al. | |
| 2002/0114207 A1 | 8/2002 | Takeuchi et al. | |
| 2002/0162098 A1 | 10/2002 | Suzuki | |

* cited by examiner

Primary Examiner—David Lam
(74) Attorney, Agent, or Firm—Oblon, Spivak, McClelland, Maier & Neustadt, P.C.

(57) ABSTRACT

A system includes a nonvolatile semiconductor memory and an electronic device which includes the nonvolatile semiconductor memory. The nonvolatile semiconductor memory selects a first operation mode while the nonvolatile semiconductor memory is connected to a first capacitor having a first capacity, and the nonvolatile semiconductor memory selects a second operation mode while the nonvolatile semiconductor memory is connected to a second capacitor having a second capacity higher than a first capacity. The nonvolatile semiconductor memory operates in the selected one of the first and second operation modes. The first operation mode is a mode in which a peak of current consumption takes a first value, and a second operation mode is a mode in which a peak of current consumption takes a second value lower than the first value.

20 Claims, 44 Drawing Sheets

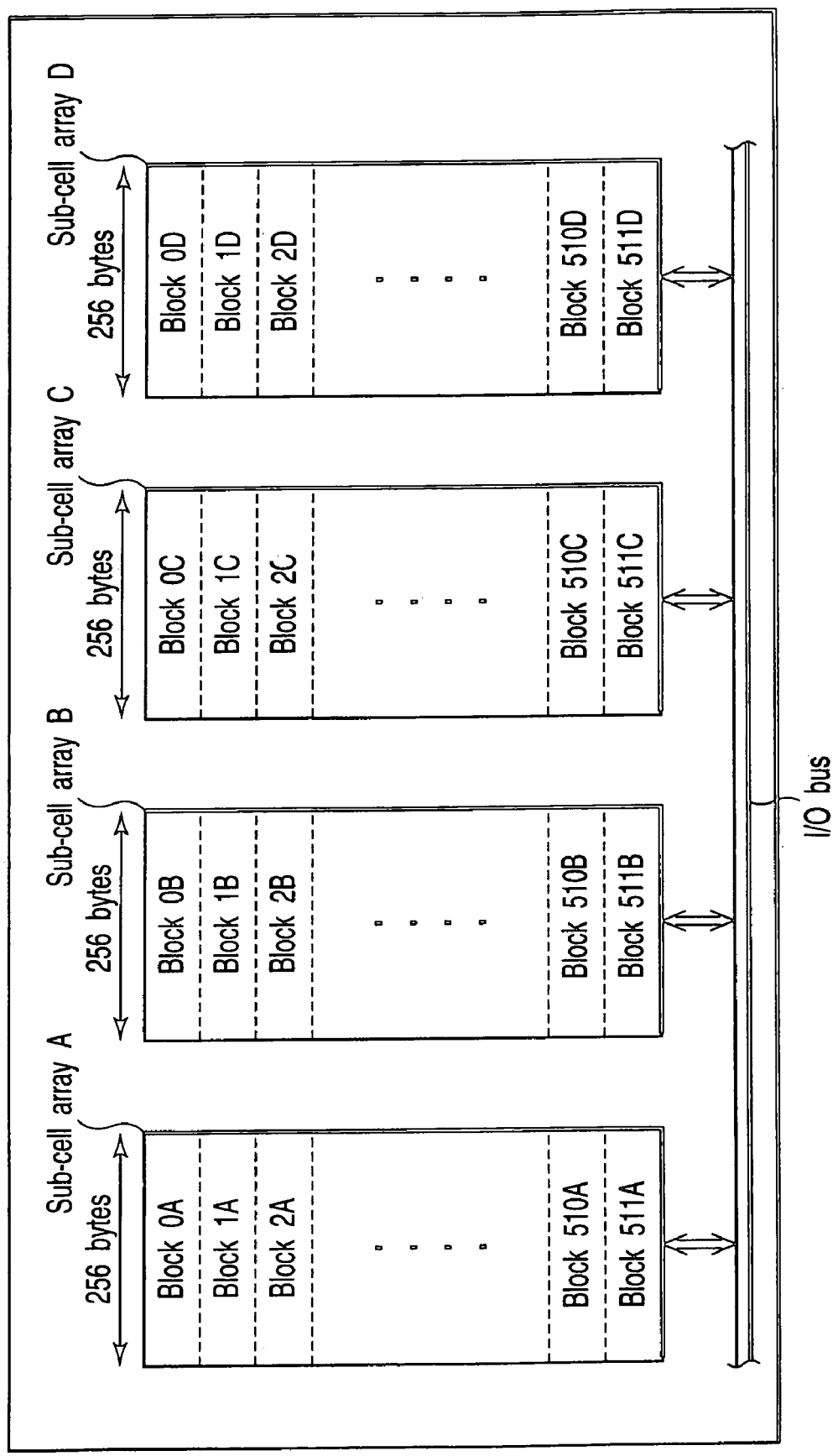
F I G. 6

Mode decision example 1

Mode decision example 2

Mode decision example 3

Mode decision example 4

Mode decision example 5

* Control signal is directly input from the outside of chip. The control signal includes a signal whose value is fixed during wafer process or during chip bonding (such as packaging, direct mounting onto print circuit board) in addition to signal from another chip. (ex. Vdd,Vss)

Mode switch example 1 (control from BLCRL side)

Mode switch example 2 (control from BLCRL side)

Mode switch example 3 (control from BLCRL side)

Mode switch example 4 (control from data circuit side)

Mode switch example 5 (control from data circuit side)

Mode switch example 7

Mode switch example 8

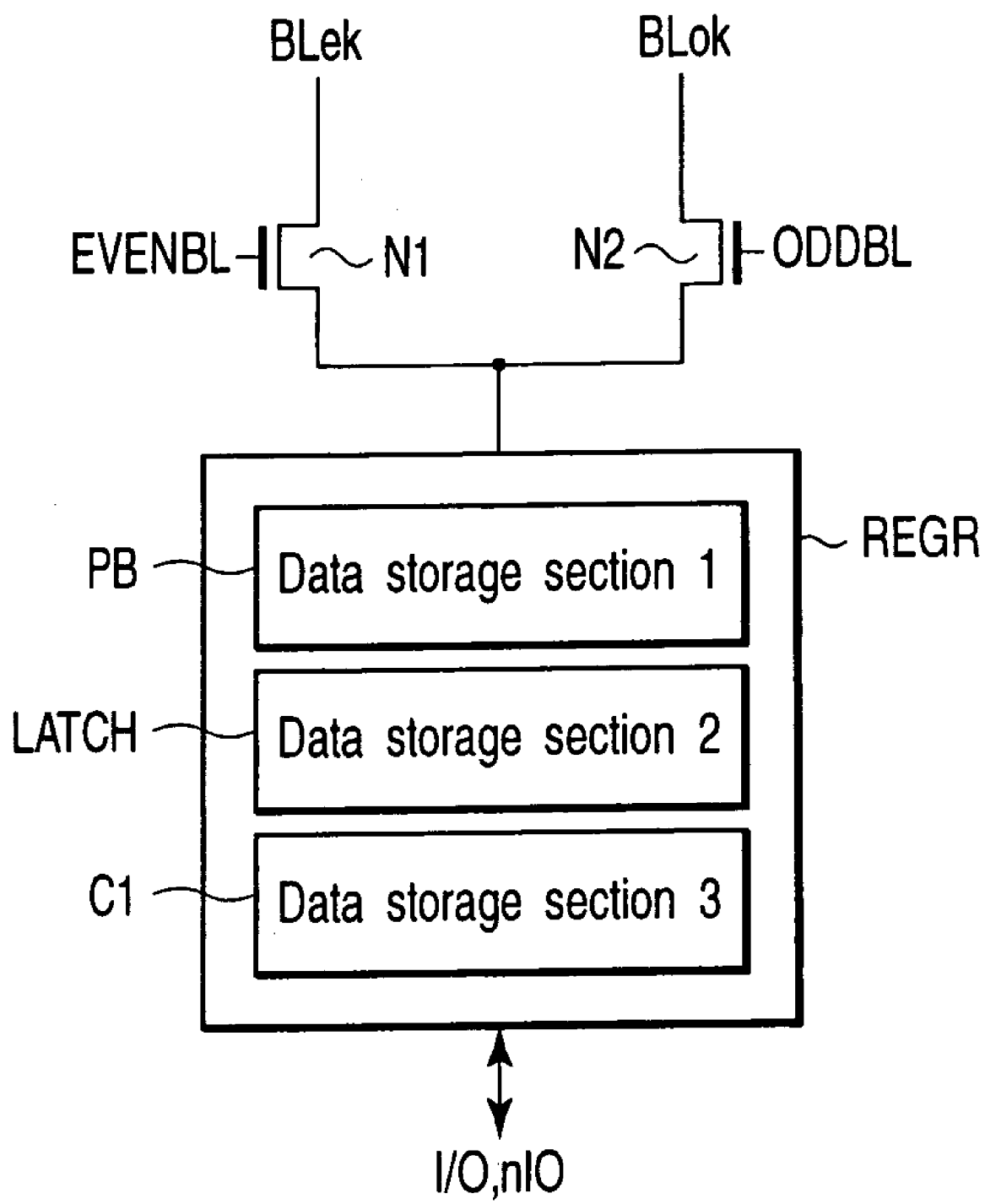
F I G. 3 7

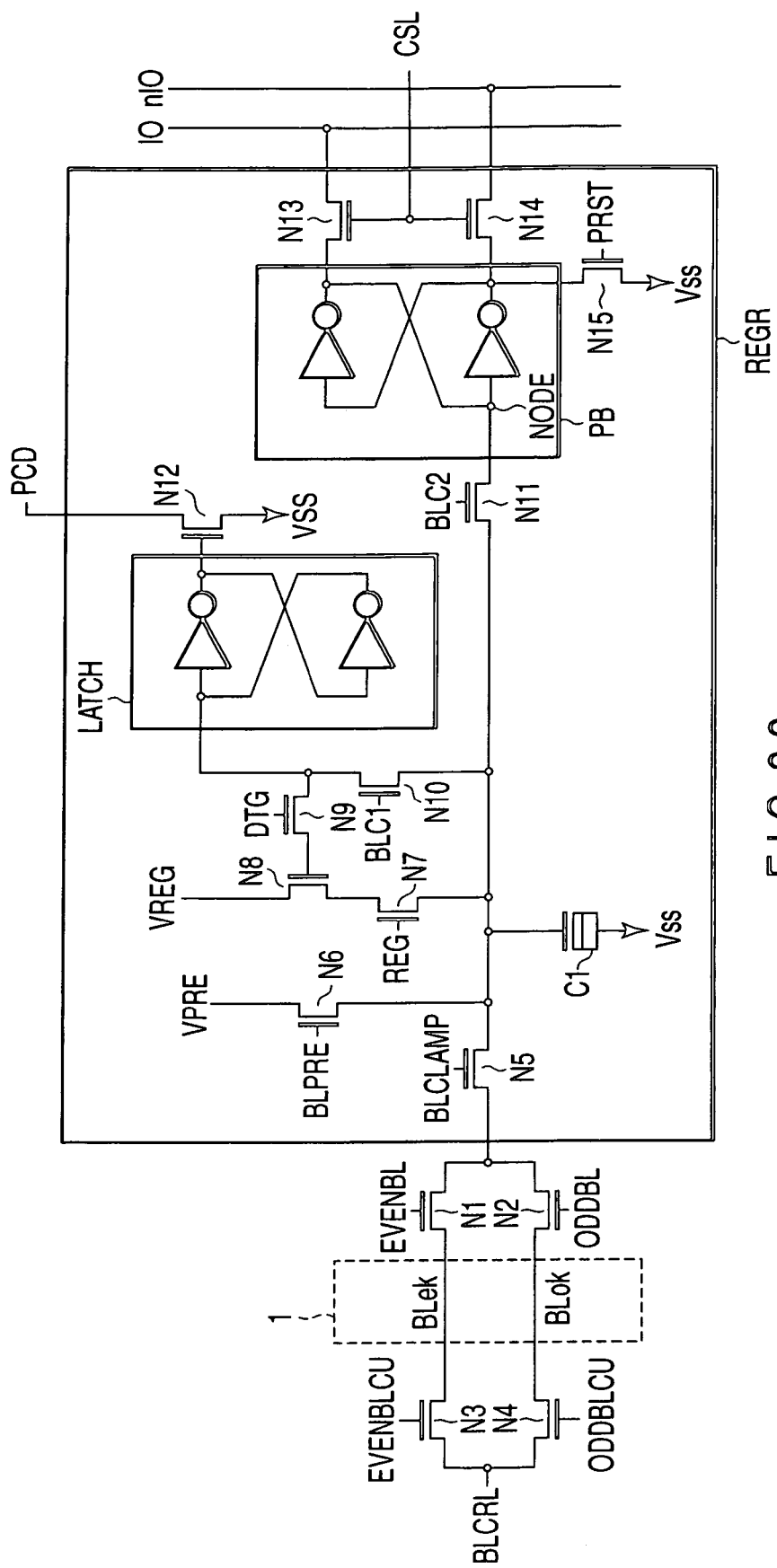
F I G. 38

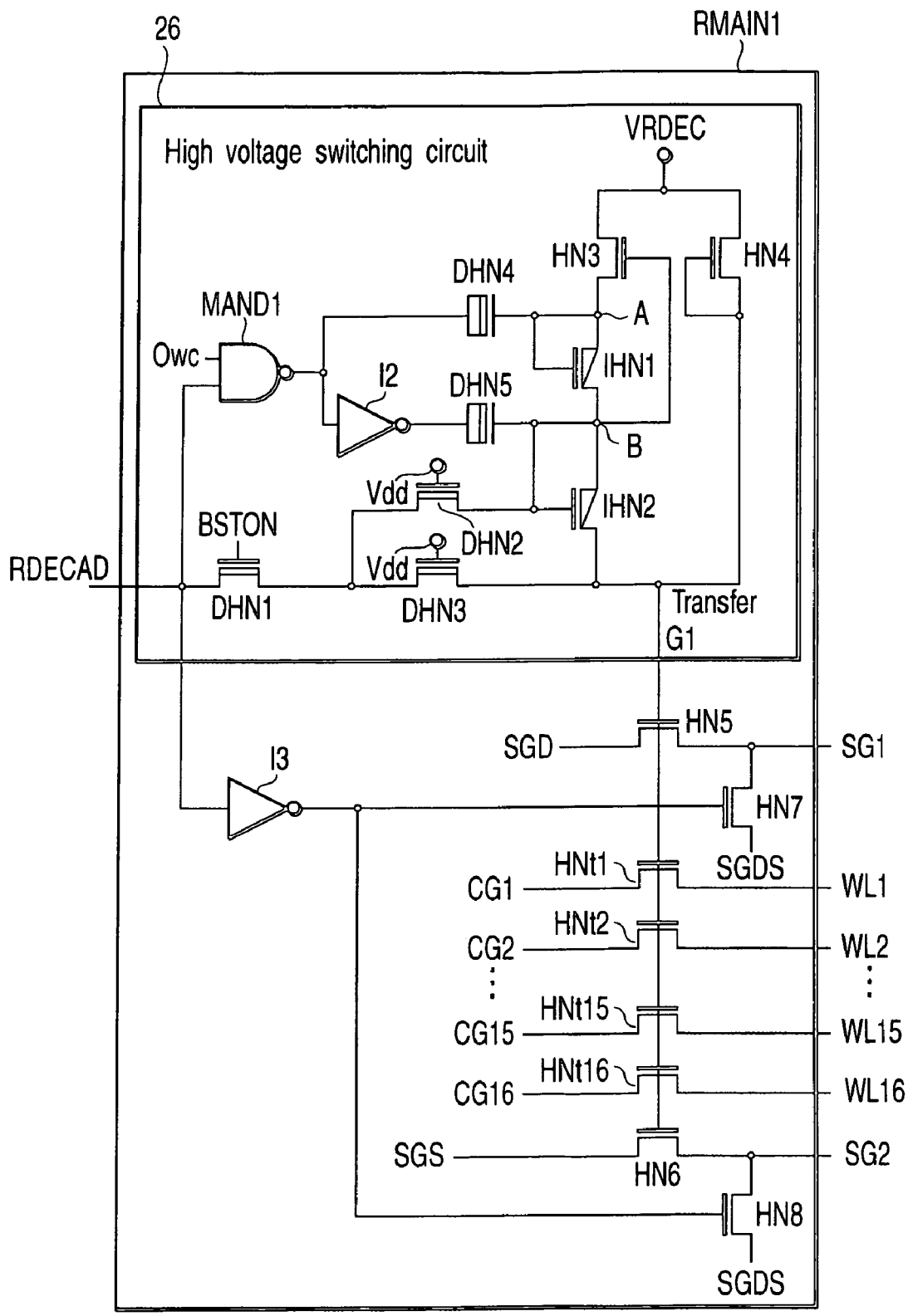
F I G. 41

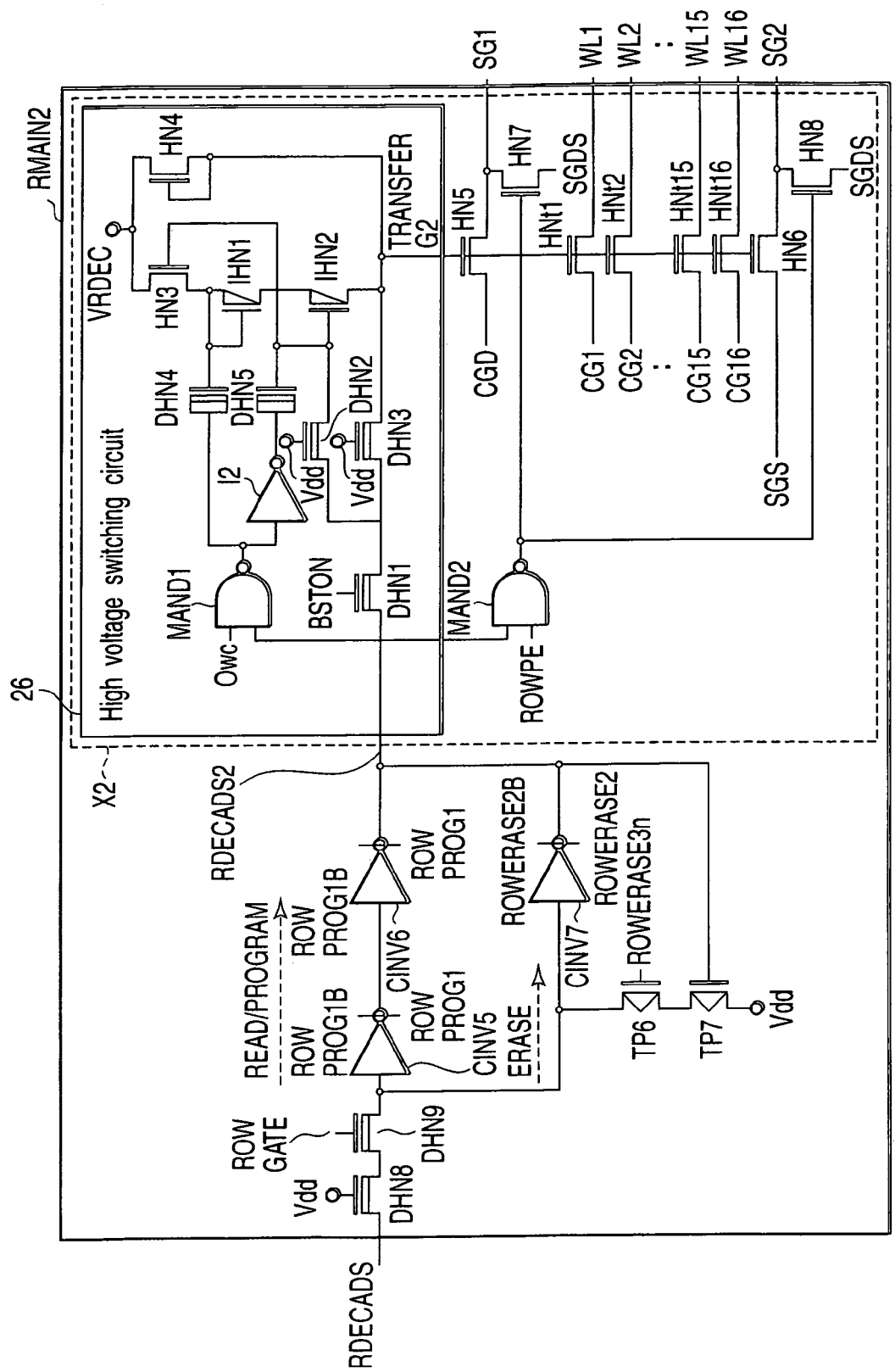
F I G. 43

Program of logical higher-level page

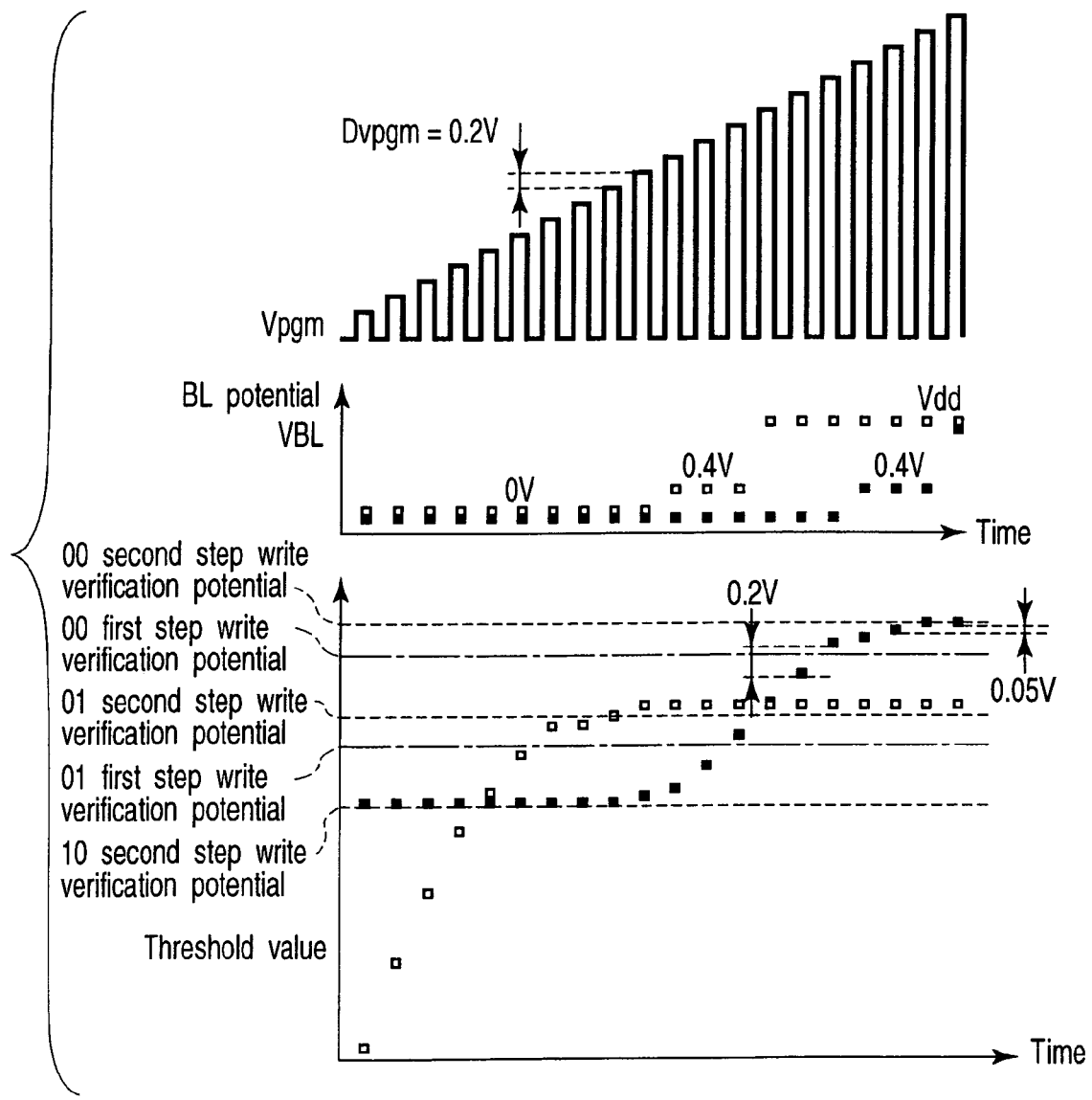
F I G. 4 9

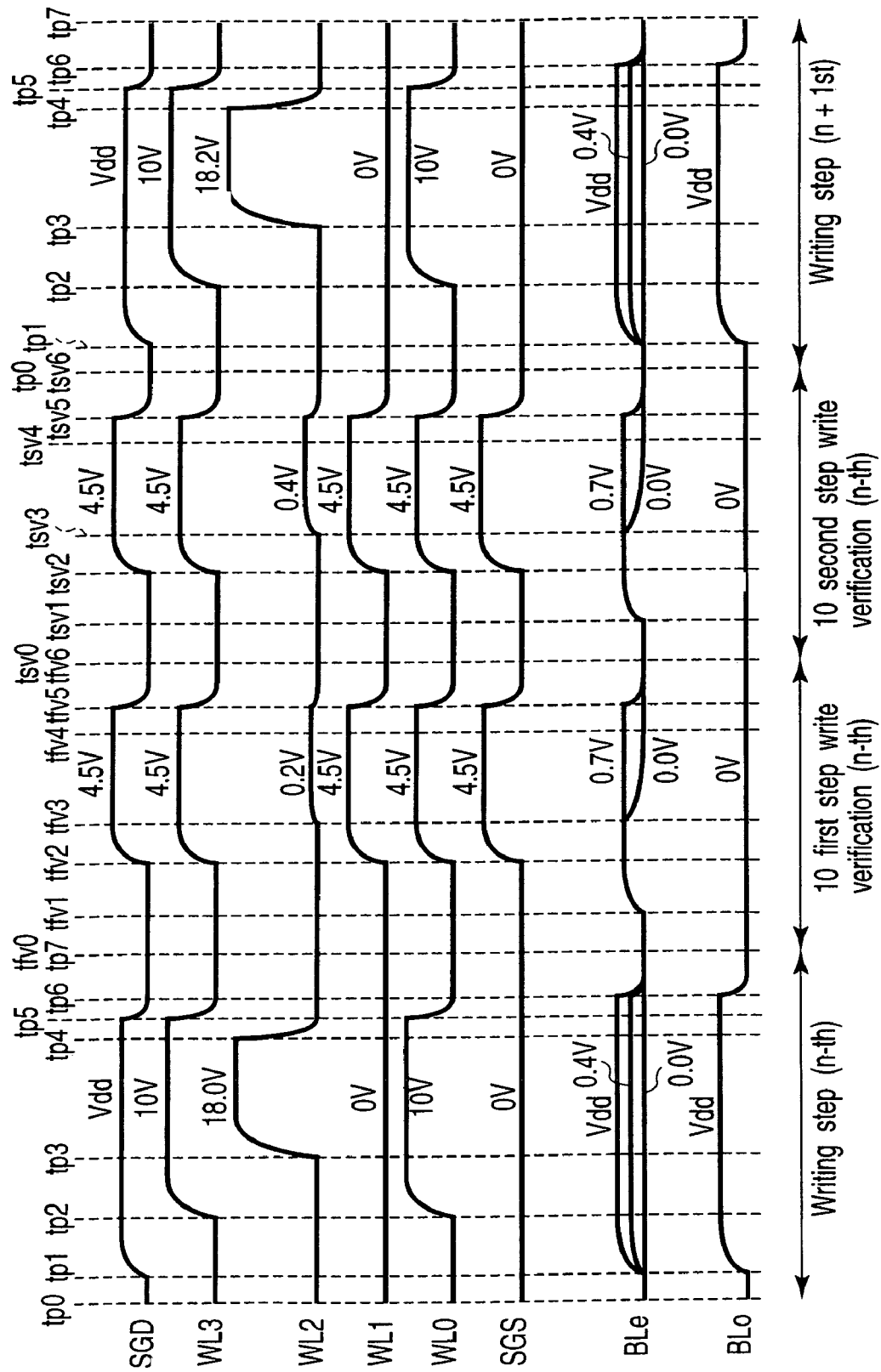
F I G. 5 0

Before writing into memory cell linked to odd bit line

After writing into memory cell linked to odd bit line

NONVOLATILE SEMICONDUCTOR MEMORY

CROSS-REFERENCE TO RELATED APPLICATIONS

This application is a Divisional of U.S. patent application Ser. No. 10/899,160, filed Jul. 27, 2004, and is based upon and claims the benefit of priority from prior Japanese Patent Application No. 2004-082730, filed Mar. 22, 2004. The entire contents of these applications are incorporated herein by reference.

BACKGROUND OF THE INVENTION

1. Field of the Invention

The present invention is related to a nonvolatile semiconductor memory, and is particularly related to a multi-level NAND-structured flash memory.

2. Description of the Related Art

A flash memory changes the amount of electric charges stored in a floating gate electrode of a memory cell to vary its threshold value, and stores data. For example, "1" corresponds to the threshold value of the memory cell being negative, and "0" corresponds to the threshold value being positive (e.g., refer to Jpn. Pat. Appln. KOKAI Publication No. 10-177797).

Recently, in order to decrease the value per bit or to increase a storage capacity, so-called multi-level flash memories have been developed to store multiple bit data in one memory cell. When 2-bit data is stored in one memory cell, four threshold distributions of the memory cell exist in accordance with quaternary data.

(1) By the way, the flash memory has basic modes: write, erase and read (including verification reading. Hereinafter the same.). At the start of these modes, it is necessary to generate a high voltage (e.g., a write potential Vpgm, a transfer potential Vpass, an erase potential Vera), and charge a bit line.

Therefore, at the start of writing, erasing and reading, an amount of current consumption increases, and its peak value, that is, peak current value also increases.

However, if a high peak current is generated in the flash memory, an adverse effect can be exerted to a system including the flash memory.

For example, the peak current generated in the flash memory in a portable device such as a digital camera and mobile telephone causes a decrease in a value of a power supply voltage of the entire system including the flash memory, which poses a problem of erroneous operations of other chips such as a microprocessor in the system.

(2) Some flash memories have a configuration in which a page size (or a block size) can be changed for various uses.

For example, when the flash memory is used in the system requiring high-speed writing, erasing and reading, the page size of the flash memory is increased.

However, the large page size of the flash memory means a high load capacity generated in one bit line.

Therefore, the amount of current consumed at the start of writing, erasing and reading increases, and the peak current value also increases. As described above, the peak current causes a decrease in the value of the power supply voltage of the entire system including the flash memory, leading to the erroneous operations of other chips such as the microprocessor in the system.

On the other hand, when the page size of the flash memory is reduced, the load capacity generated in one bit line is decreased, so that problems such as a decrease in the power supply voltage hardly occur.

However, the reduced page size means a smaller number of bit lines in which writing, erasing and reading can be performed at a time, which is a disadvantage for a high-speed operation as far as the entire system is concerned.

BRIEF SUMMARY OF THE INVENTION

A nonvolatile semiconductor memory according to an example of the present invention comprises: an internal circuit which writes, erases or reads in one of a high-speed operation mode in which a peak of current consumption takes a first value and a low current consumption mode having a second value lower than the first value; and a mode switch control circuit which controls a switchover between the high-speed operation mode and the low current consumption mode.

A nonvolatile semiconductor memory according to an example of the present invention comprises: a page size switching circuit which switches between a first mode in which writing, erasing or reading is performed in memory cells having a first page size and a second mode in which the writing, erasing or reading is performed in memory cells having a second page size larger than the first page size; and a mode switch control circuit which changes pre-charge time of a bit line, step-up capability of a booster circuit, or write time, between the first mode and the second mode.

BRIEF DESCRIPTION OF THE SEVERAL VIEWS OF THE DRAWING

FIG. 6 is a diagram showing a configuration example of a cell array in the memory of FIG. 5;

FIG. 37 is a diagram showing an example of a data circuit;

FIG. 38 is a diagram showing an example of the data circuit;

FIG. 41 is a diagram showing a circuit example of a RMAIN1 of FIG. 39;

FIG. 43 is a diagram showing a circuit example of the RMAIN2 of FIG. 39;

FIG. 49 is a diagram showing an example of the method of controlling writing into a higher-level page and the threshold value;

FIG. 50 is a diagram showing operating waveforms in writing lower-level page data;

DETAILED DESCRIPTION OF THE INVENTION

Figure 1:
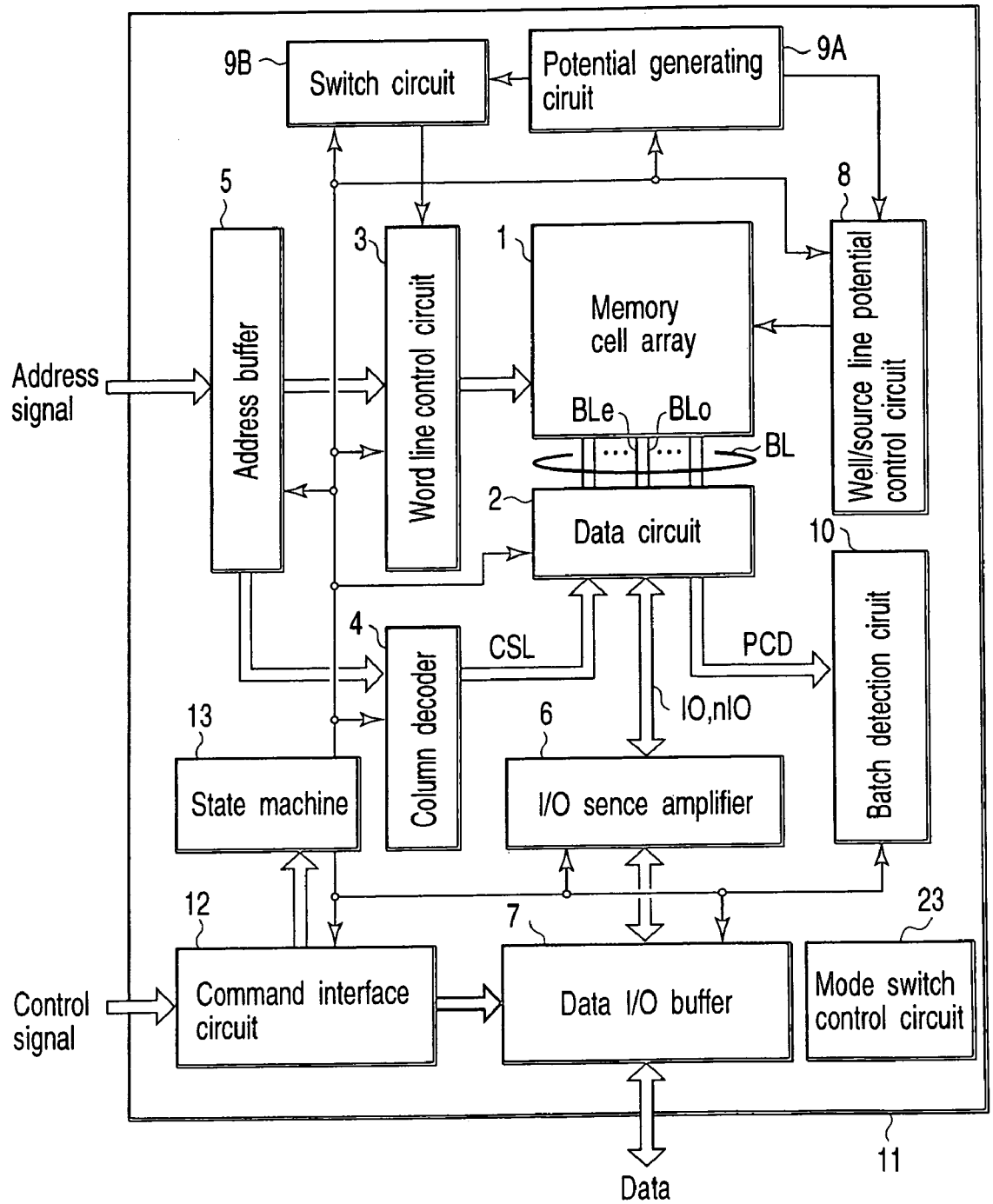
FIG. 1 is a diagram showing main parts of a flash memory according to an example the present invention.

A nonvolatile semiconductor memory of an aspect of the present invention will be described below in detail with reference to the accompanying drawing.

1. Outline

Whether or not a peak current generated in a flash memory causes an erroneous operation of a system is dependent upon characteristics of the system.

For example, it is conceived that in a portable device (such as a digital camera) having a capacitor with high capacity, a power supply voltage of the entire system does not decrease or slightly decreases even if a high peak current is generated in the flash memory. In other words, it is less likely that the peak current generated in the flash memory causes the erroneous operation of the system.

On the contrary, in the portable device such as a mobile telephone having a small size and a small number of components that can be mounted, the power supply voltage of the entire system largely decreases if the peak current is generated in the flash memory because of a small capacity of the capacitor which can be mounted. It is therefore highly likely that the peak current generated in the flash memory causes the erroneous operation of the system.

Furthermore, when a plurality of flash memories is mounted in one system and the plurality of flash memories is simultaneously operated to increase a write speed, a higher peak current is generated than when one flash memory is operated. The erroneous operation of the system is thus highly likely to be caused.

As described above, whether or not the peak current generated in the flash memory causes the erroneous operation of the system is dependent upon characteristics of the system. It is therefore considered to be convenient, for example, to operate the flash memory so as to reduce a peak current value when the flash memory is used in a system which easily causes an erroneous operation, and operate the flash memory giving priority to the high-speed operation when the flash memory is used in a system which does not easily cause an erroneous operation.

Therefore, in examples of the present invention, the flash memory is provided with a function to switch between a high-speed operation mode which gives priority to the high-speed operation, and a low current consumption mode having a peak current lower than a peak current generated in the high-speed operation mode. These two modes are separately used depending upon the characteristics of the system. The mode is switched on the basis of a command from the outside of a chip or data stored in memory cells or a fuse element.

For example, in a system in which the power supply voltage of the entire system is expected to decrease due to a high peak current, such as a system which can only be equipped with a capacitor having a small capacity or a system equipped with a plurality of flash memories that are simultaneously operated, the flash memory is used in the low current consumption mode, thereby preventing the erroneous operation of the system.

In other systems, the flash memory is used in the high-speed operation mode to achieve the high-speed operation of the entire system.

Furthermore, if the flash memory having a mode to switch a page size (or a block size) is set in a mode to write, erase or read in a large page size, the power supply voltage of the entire system is expected to decrease due to the peak current.

Thus, in such a flash memory, pre-charge time of a bit line, step-up capability of a booster circuit, or write time is controlled so that the peak current is always constant even if the page size (or block size) is changed.

As described above, according to the examples of the present invention, since the flash memory is operated in the low current consumption mode or the high-speed operation mode depending upon the characteristics of the system in which the flash memory is used, the erroneous operation can be prevented in the system in which the power supply voltage easily decreases due to the peak current, whereas the high-speed operation can be achieved in other systems.

Furthermore, in the flash memory having the mode to switch the page size (or block size), the pre-charge time of the bit line, the step-up capability of the booster circuit, or the write time is controlled so that the peak current is always constant even if the page size (or block size) is changed.

2. Circuit Example

Circuit examples of the flash memory according to an example of the present invention will be specifically described below.

(1) Overall Picture

[1] FIRST EXAMPLE

FIG. 1 shows main parts of a NAND-structured flash memory according to an example of the present invention.

A memory cell array 1 has, for example, a NAND cell unit composed of a plurality of memory cells connected in series, and two select transistors connected to both ends thereof. The circuit examples and structure examples of the memory cell array 1 will be described later.

A data circuit 2 has a plurality of storage circuits (including a page buffer). Circuit examples of the data circuit 2 will be described later. Here, a function of the data circuit 2 will be simply described.

The data circuit 2 temporarily stores 2-bit (quaternary) write data during writing, and 2-bit (quaternary) read data during reading. Accordingly, at least two storage circuits are provided for one bit line connected to a selected memory cell targeted for a write/read operation. One of the two storage circuits stores logical lower-level page data, and the other stores logical higher-level page data.

A word line control circuit 3 includes a row address decoder and a word line driver. The word line control circuit 3 controls potentials of a plurality of word lines in the memory cell array 1, on the basis of an operation mode (such as write, erase or read) and an address designated by a row address signal. Circuit examples of the word line control circuit 3 will be described later.

A column decoder 4 selects a column of the memory cell array 1 on the basis of a column address signal.

During writing, the write data is input into the storage circuit in the data circuit 2 belonging to the selected column, via a data I/O buffer 7 and an I/O sense amplifier 6. During reading, the read data is temporarily stored in the storage circuit in the data circuit 2 belonging to the selected column, and then output to the outside of a memory chip 11 via the I/O sense amplifier 6 and the data I/O buffer 7.

The row address signal is input to the word line control circuit 3 via an address buffer 5. The column address signal is input to the column decoder 4 via the address buffer 5.

A well/source line potential control circuit 8 controls potentials of a plurality of well areas (e.g., a double well area composed of an n-well and a p-well) corresponding to a plurality of blocks that constitute the memory cell array 1, and a potential of a source line, on the basis of the operation mode (such as write, erase or read).

A potential generating circuit (booster circuit) 9A, for example, generates a write potential (e.g., about 20V) Vpgm and a transfer potential (e.g., about 10V) Vpass during writing. The potentials Vpgm and Vpass are allocated by a switch circuit 9B, for example, to a plurality of word lines in the selected block among a plurality of blocks that constitute the memory cell array 1.

Furthermore, the potential generating circuit 9A generates, for example, an erase potential (e.g., about 20V) Vera during erasing, and this potential Vera is given to one or two or more well areas (both the n-well and p-well) corresponding to one or two or more selected blocks among a plurality of blocks that constitute the memory cell array 1.

Here, when the write potential Vpgm, the transfer potential Vpass and the erase potential Vera are generated, the power supply voltage of the entire system can decrease depending on the characteristics of the system (capacity of capacitor) or the mode (page size) of the flash memory.

Therefore, in the example of the present invention, a mode switch control circuit 23 is provided in the memory chip 11. The mode switch control circuit 23 controls a switchover between the high-speed operation mode and the low current consumption mode.

In the high-speed operation mode, an operation is performed giving priority to high-speed writing, erase or reading, and a peak of a consumed current (peak current) at this time is a first value. In the low current consumption mode, a current consumed during writing, erasing or reading takes a second value lower than the first value.

The switchover between the high-speed operation mode and the low current consumption mode can be performed, for example, by controlling the speed of charging or discharging the bit line, or controlling an operating speed of the booster circuit which generates potentials such as the write potential Vpgm, the transfer potential Vpass and the erase potential Vera. Specific operations in the high-speed operation mode and the low current consumption mode will be described later.

The mode (one of the high-speed operation mode and the low current consumption mode) is decided, for example, on the basis of a control signal (command) from the outside of the flash memory chip 11, data stored in the memory cell array 1 or data stored in the fuse element. The mode may be decided by wiring during a wafer process or during chip bonding.

Figure 2:
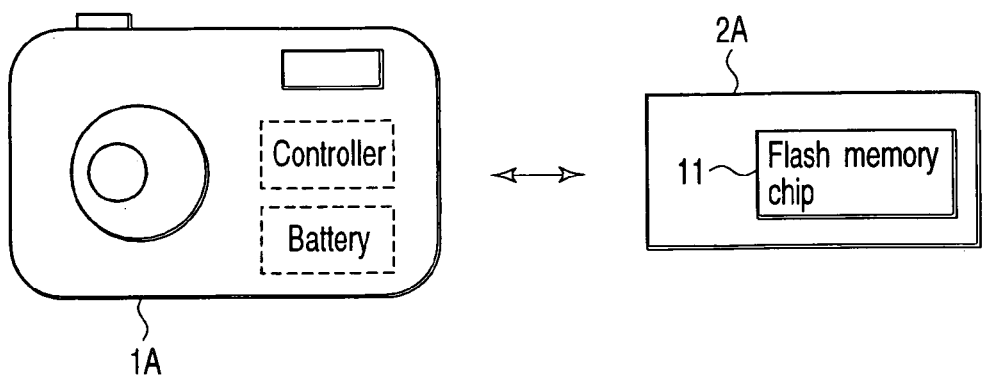
FIG. 2 is a diagram showing an example of a system to which the memory of FIG. 1 is applied.
Figure 3:
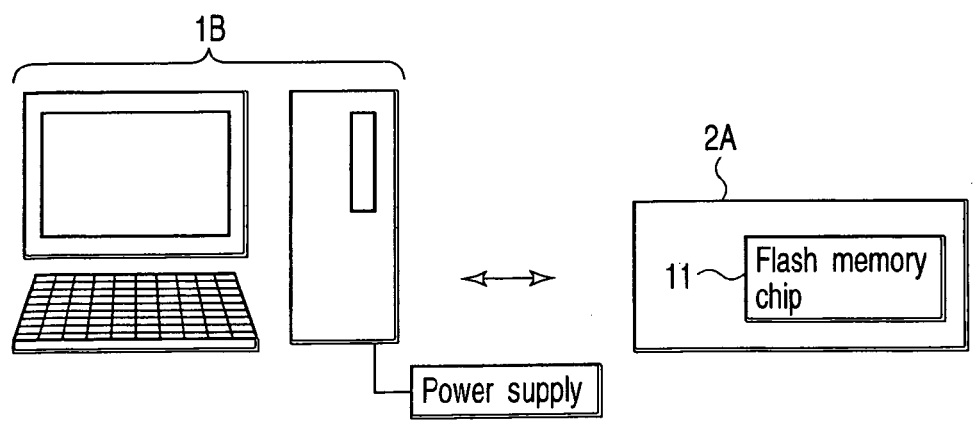
FIG. 3 is a diagram showing an example of a system to which the memory of FIG. 1 is applied.

For example, since a digital camera 1A as shown in FIG. 2 has a high-capacity capacitor therein, the peak current generated in the flash memory chip 11, which is included in the memory card 2A, is less likely to cause the erroneous operation of the system. Moreover, since a computer system 1B as shown in FIG. 3 is connected to a stable power supply, the erroneous operation of the system is also less likely to occur.

Therefore, the flash memories used in these systems are operated in the high-speed operation mode by the mode switch control circuit 23.

Figure 4:
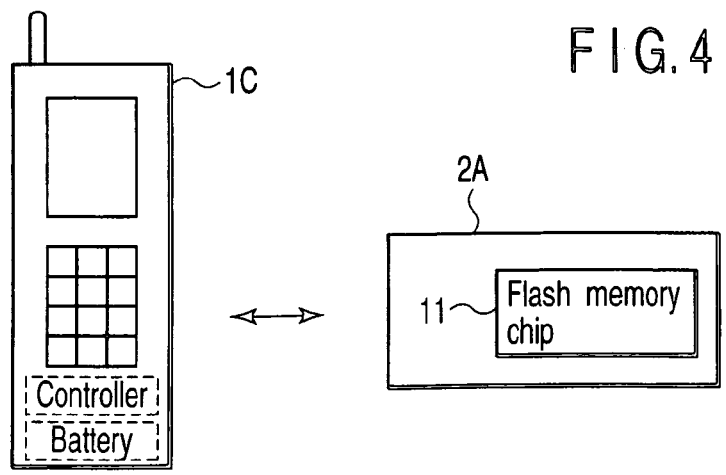
FIG. 4 is a diagram showing an example of a system to which the memory of FIG. 1 is applied.

On the contrary, a mobile telephone 1C as shown in FIG. 4 has a small device size and a small number of components that can be mounted, so that the capacity of the capacitor mounted therein is small. Thus, if the peak current is generated in the flash memory chip 11, a decrease in the power supply voltage of the entire system is highly likely to cause the erroneous operation of the system.

Therefore, the flash memory used in such a system is operated in the low current consumption mode by the mode switch control circuit 23.

A batch detection circuit 10 verifies whether or not predetermined data is accurately written into the memory cells during writing, and verifies whether or not the data in the memory cell is properly erased during erasing.

A command interface circuit 12 judges whether or not data input to the data I/O buffer 7 is command data provided from a host microcomputer, on the basis of a control signal generated by a chip (e.g., host microcomputer) which is different from the flash memory chip 11. If the data input to the data I/O buffer 7 is the command data, the command interface circuit 12 transfers the command data to a state machine (control circuit) 13.

The state machine 13 decides the operation mode (such as write, erase or read) of the flash memory on the basis of the command data, and controls, on the basis of the operation mode, the entire operation of the flash memory, more specifically, the operation of the data circuit 2, the word line control circuit 3, the column decoder 4, the address buffer 5, the I/O sense amplifier 6, the data I/O buffer 7, the well/source line potential control circuit 8, the potential generating circuit 9A, the switch circuit 9B, and the batch detection circuit 10.

[2] SECOND EXAMPLE

Figure 5:
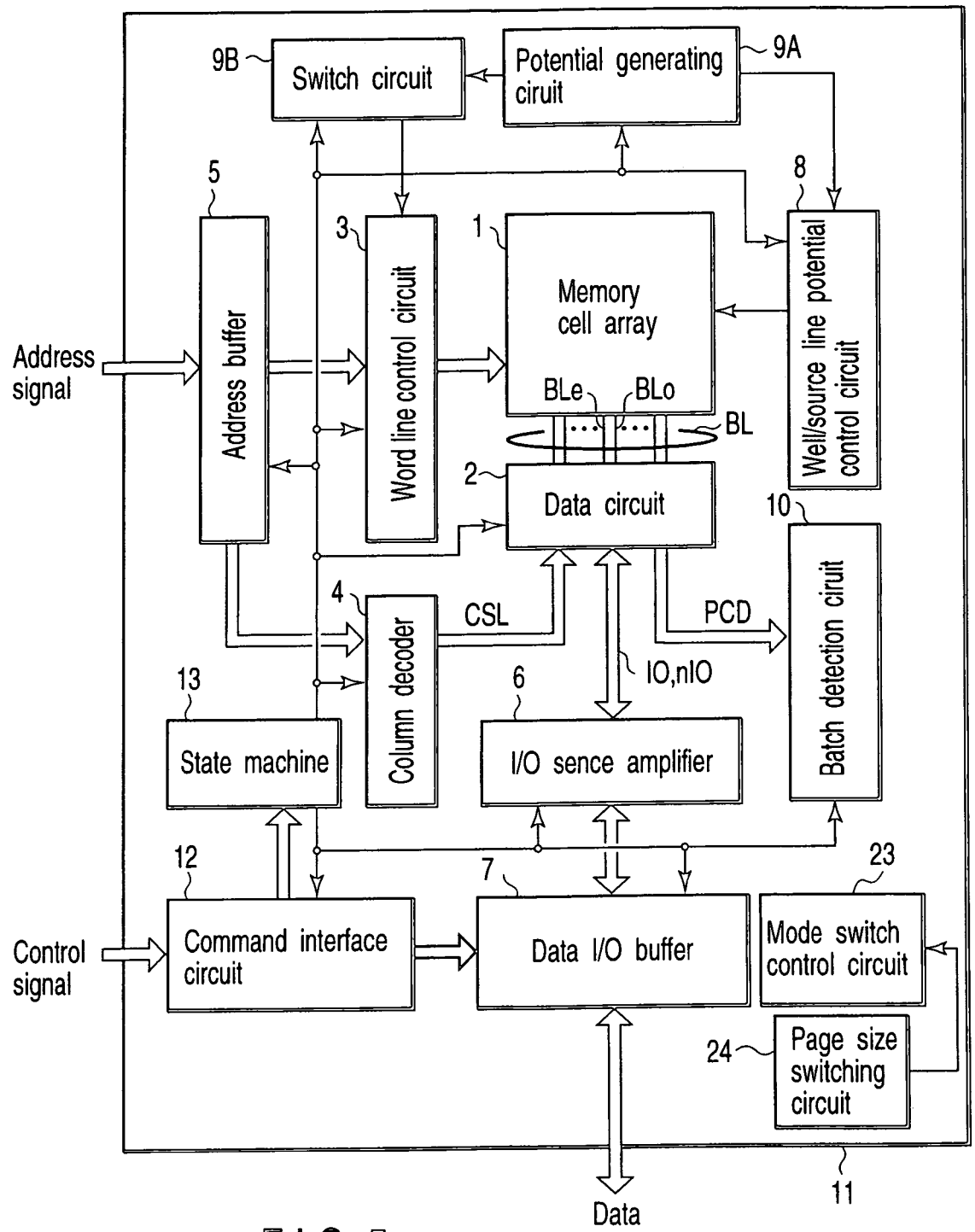
FIG. 5 is a diagram showing the main parts of the flash memory according to an example the present invention.

FIG. 5 shows the main parts of the NAND-structured flash memory according to an example the present invention.

This example is applied to the flash memory having a function to switch between a first mode in which writing, erasing or reading is performed in the memory cell having a first page size, and a second mode in which the writing, erasing or reading is performed in the memory cell having a second page size larger than the first page size.

These days, some flash memories have a configuration in which the page size (or block size) can be changed for various uses.

For example, when the flash memory is used in the system requiring high-speed writing, erasing and reading, the page size of the flash memory is increased.

However, the large page size of the flash memory means a high load capacity generated in one bit line.

In this case, an amount of current consumed at the start of writing, erasing and reading increases, and the peak current value also increases. In other words, the peak current causes a decrease in the value of the power supply voltage of the entire system, which is likely to cause the erroneous operations of other chips such as the microprocessor in the system.

Therefore, in the example of the present invention, the mode switch control circuit 23 is provided in the memory chip 11. The mode switch control circuit 23 controls the pre-charge time of the bit line, the step-up capability of the booster circuit, or the write time so that the peak current is always constant even if the page size (or block size) is changed.

For example, in the mode in which the page size is small, the pre-charge time of the bit line is reduced to enhance the step-up capability of the booster circuit, or write time is reduced. Further, in the mode having the large page size, the pre-charge time of the bit line is increased to decrease the step-up capability of the booster circuit, or write time is increased. In this way, the peak current is always constant.

The switchover in the pre-charge time of the bit line, the step-up capability of the booster circuit or the write time is decided on the basis of an output signal of a page size switching circuit 24. A value of the output signal of the page size switching circuit 24 may be fixed by the decision of the page size during the wafer process or during the chip bonding.

The memory cell array 11 of the flash memory capable of switching the page size is composed of, for example, a plurality of sub-cell arrays A, B, C and D as shown in FIG. 6.

In this example, each sub-cell array is composed of 512 blocks, and the number of pages in each block (here, meaning the number of bytes connected to one word line and simultaneously read in one block) is 256 bytes.

First, attention is focused on a case where the page size switching circuit 24 selects the first mode.

Figure 7:
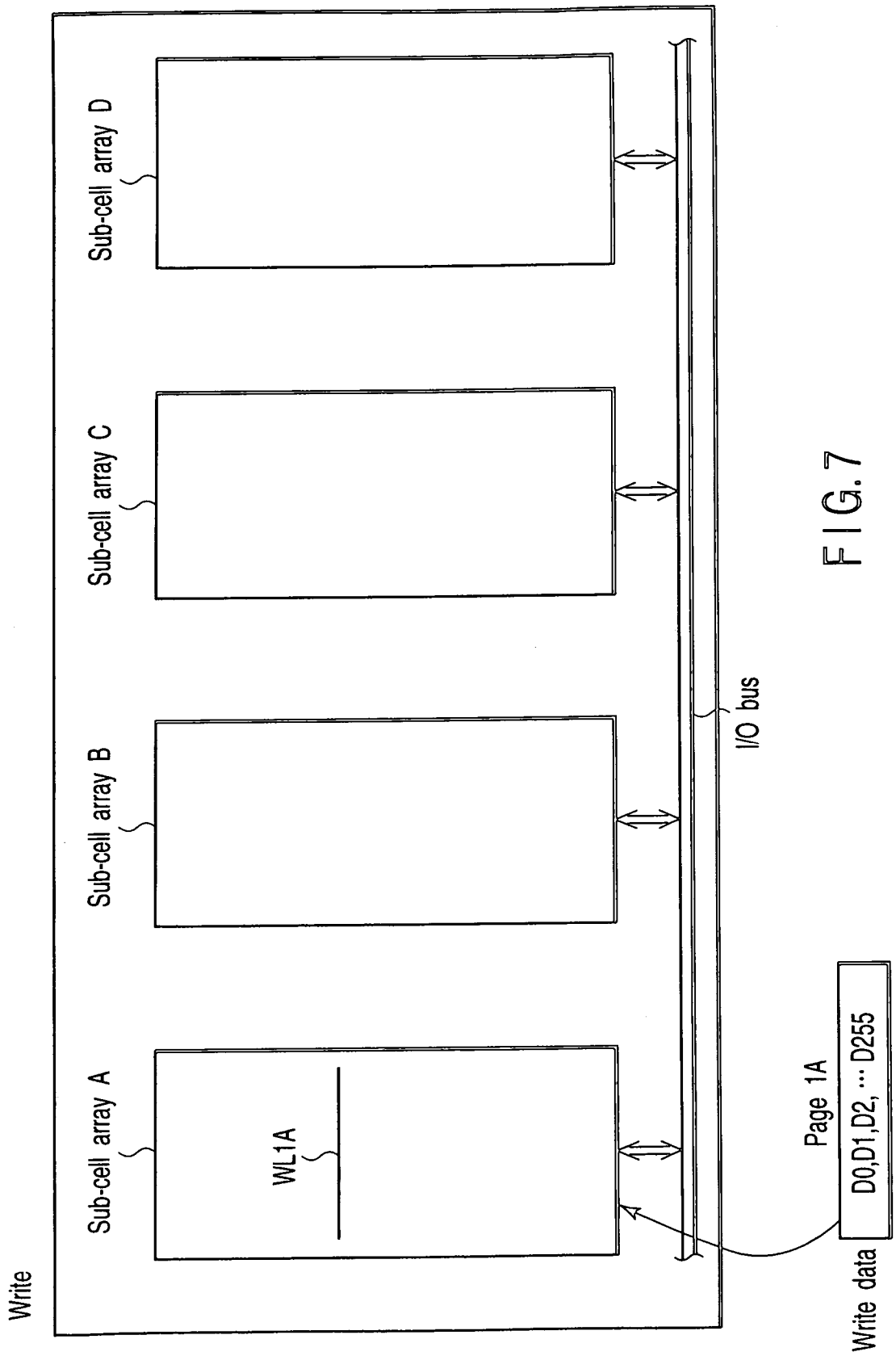
FIG. 7 is a diagram showing a state in writing into the cell array of FIG. 6.
Figure 8:
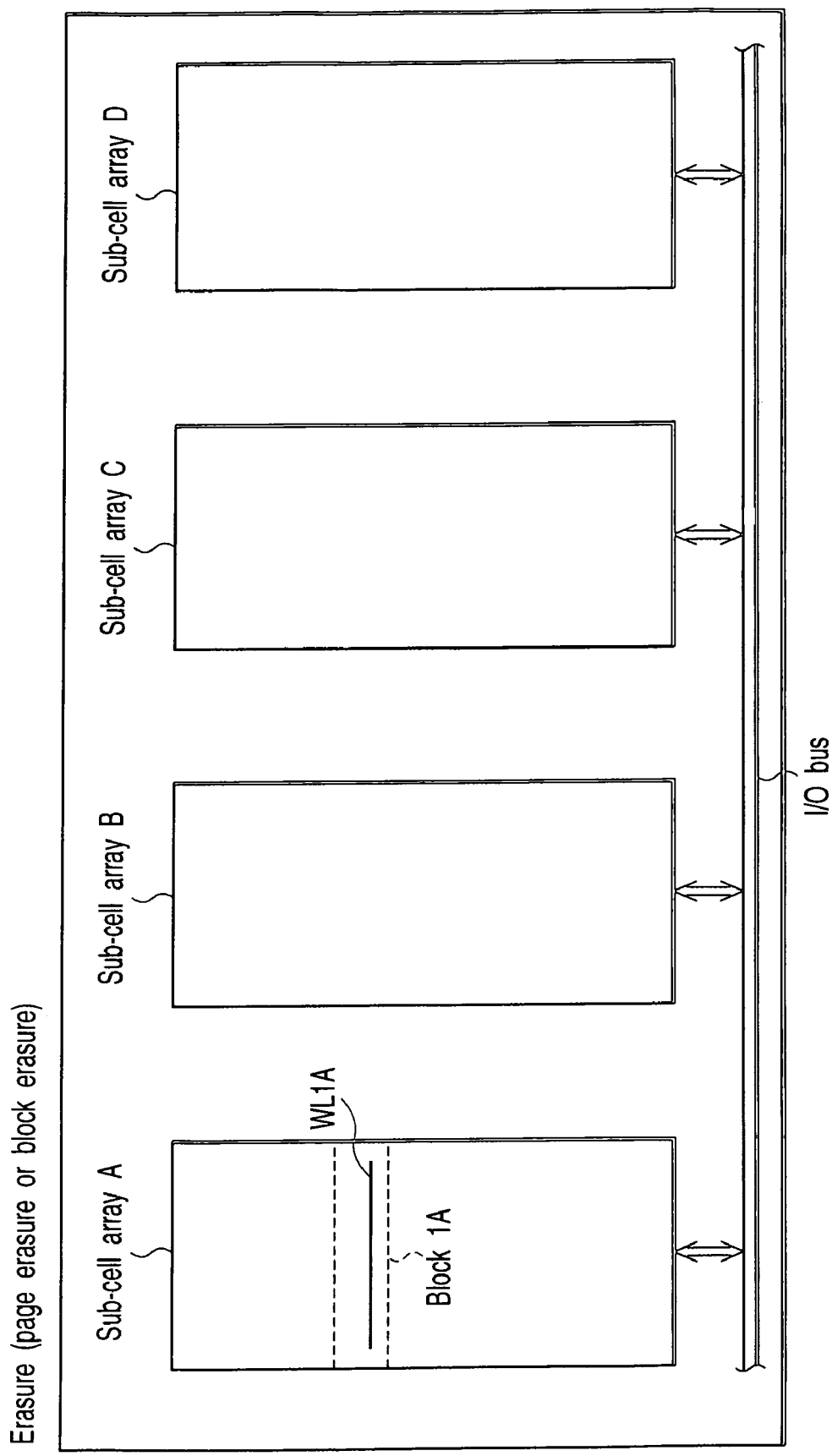
FIG. 8 is a diagram showing a state during erasing in the cell array of FIG. 6.
Figure 9:
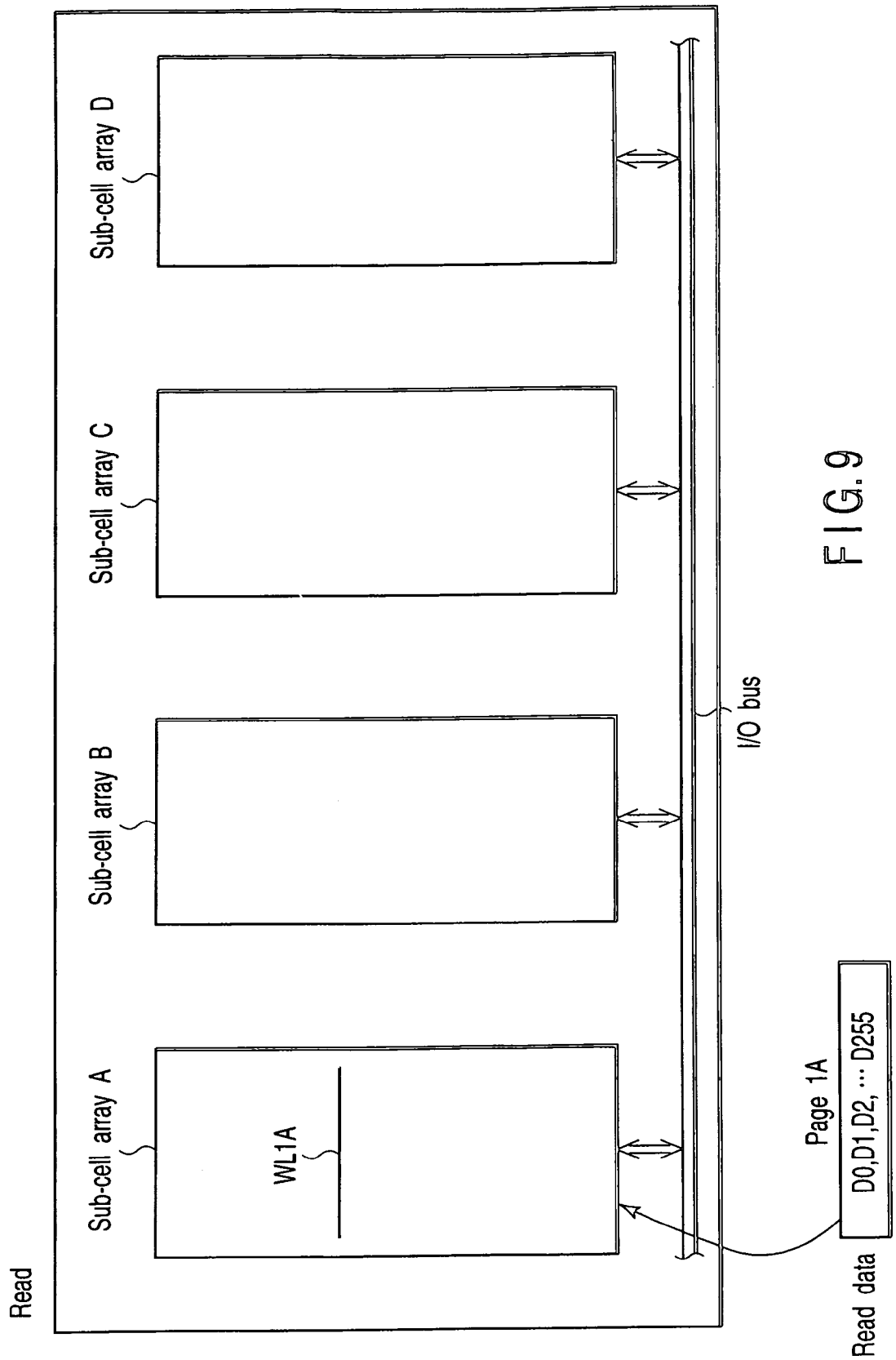
FIG. 9 is a diagram showing a state in reading from the cell array of FIG. 6.

In the first mode, for example, writing, erasing or reading is performed in the memory cells having the first page size (256 bytes), as shown in FIG. 7 to FIG. 9.

For example, data D0, D1, D2, ... D255 are written into the one-page amount (256 bytes) memory cells connected to a word line (control gate line) WL1A in a selected sub-cell array A. Further, data is simultaneously erased from the one-page amount memory cells connected to the word line WL1A in the selected sub-cell array A or in the memory cells in a block 1A in the sub-cell array A. Still further, the data D0, D1, D2, ... D255 is simultaneously read from the one-page amount memory cells connected to the word line WL1A in the selected sub-cell array A.

In this way, when the first mode in which writing, erasing or reading is performed in the memory cell having the first page size (or block size) is selected, the mode switch control circuit 23 further switches the mode so that the pre-charge time of the bit line, the step-up capability of the booster circuit, or the write time will take the first value. At this point, the peak current generated in the flash memory chip 11 has a level of value that does not cause the erroneous operation of the system.

Next, attention is focused on a case where the page size switching circuit 24 selects the second mode.

Figure 10:
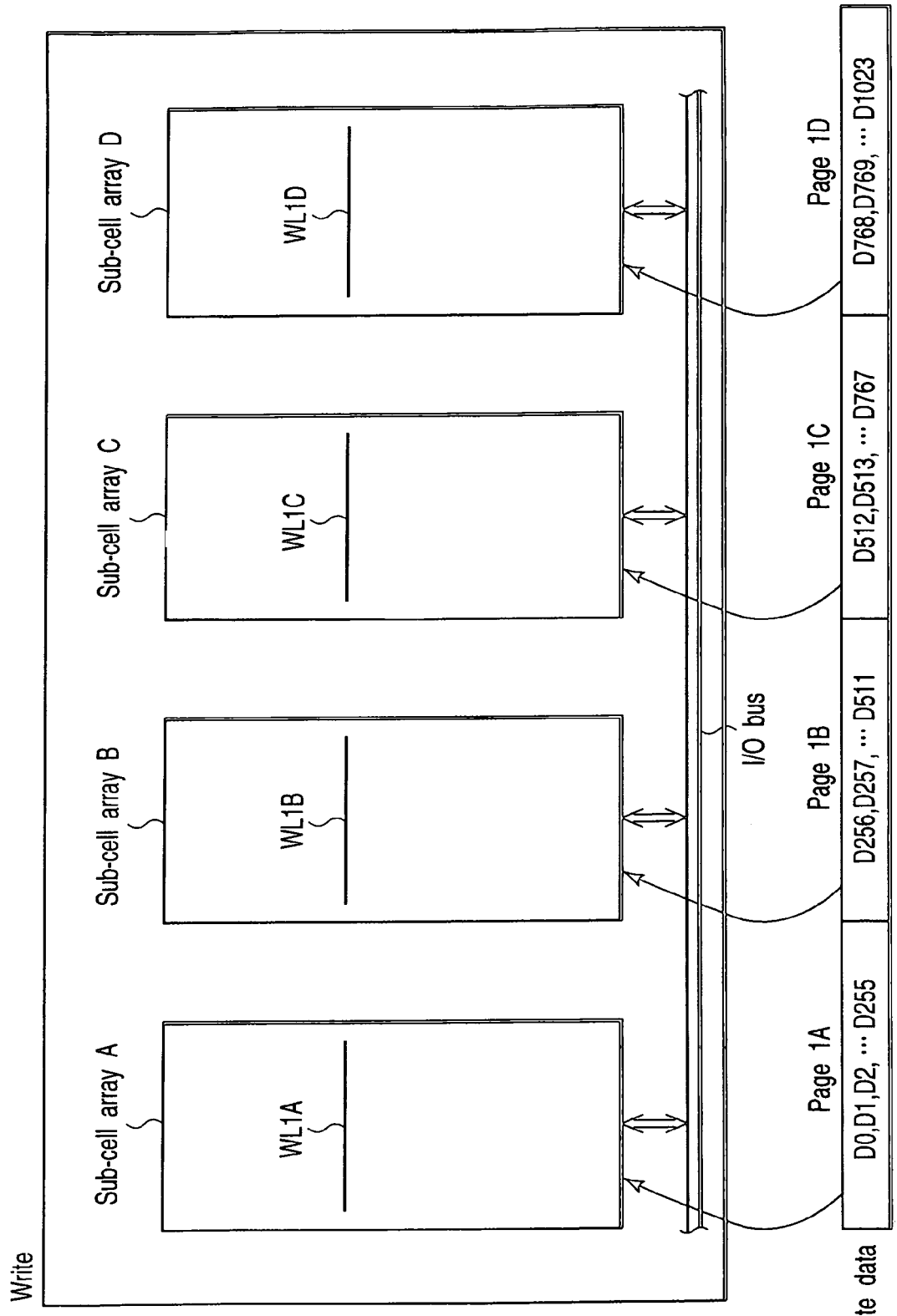
FIG. 10 is a diagram showing a state in writing into the cell array of FIG. 6.
Figure 11:
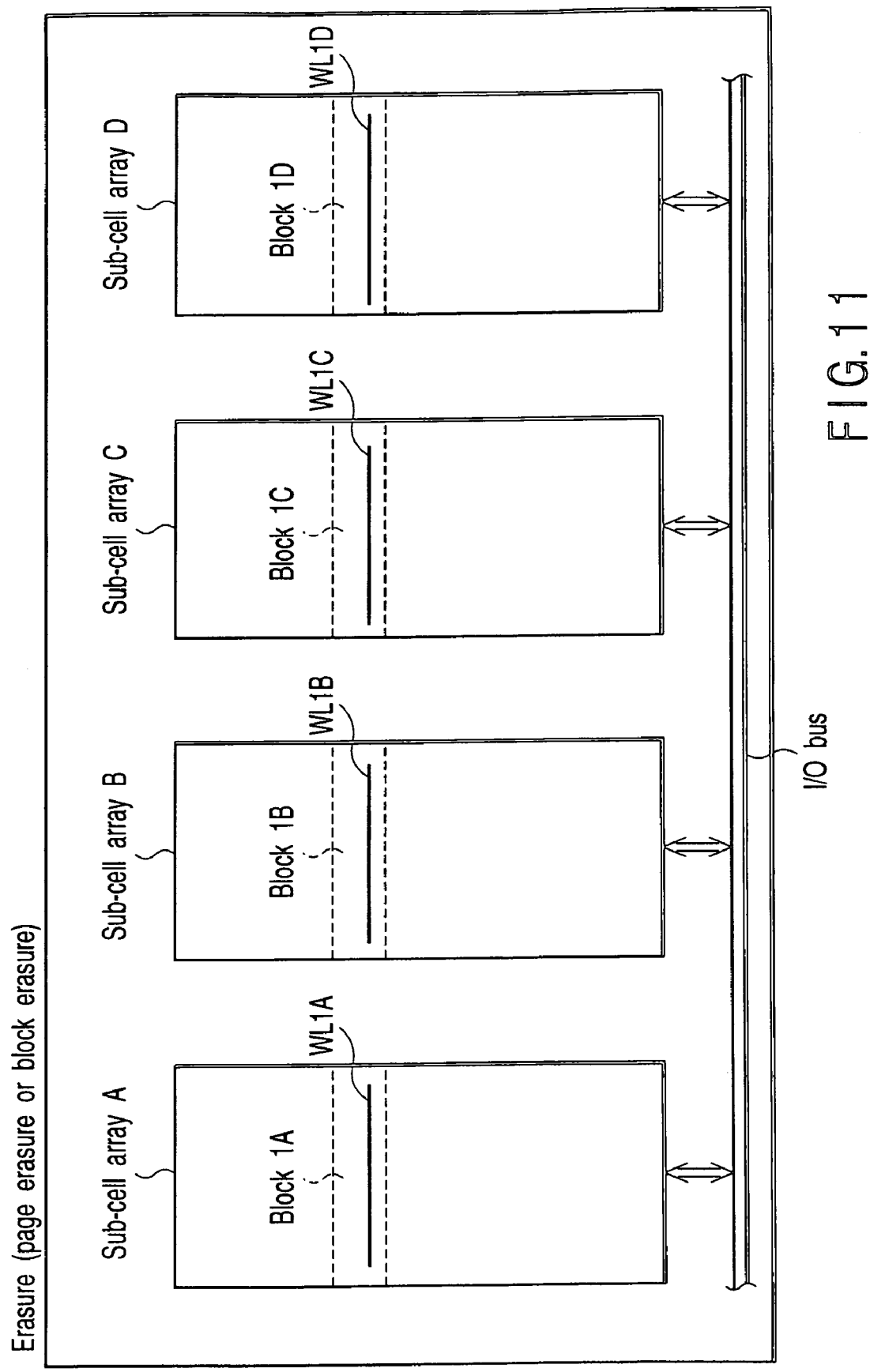
FIG. 11 is a diagram showing a state during erasing in the cell array of FIG. 6.
Figure 12:
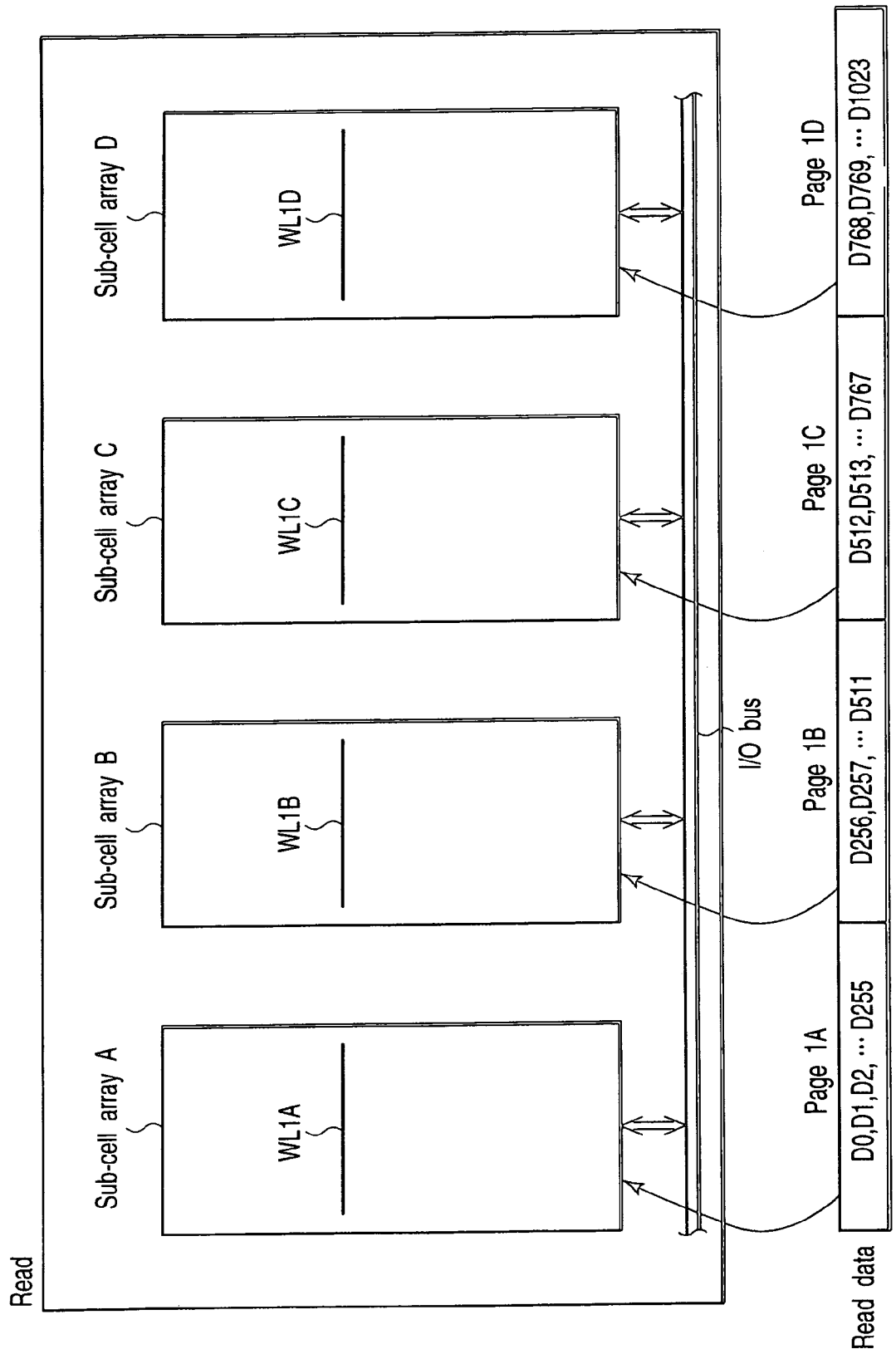
FIG. 12 is a diagram showing a state in reading from the cell array of FIG. 6.

In the second mode, for example, writing, erasing or reading is performed in the memory cell having the second page size (256×4 bytes) larger than the first page size, as shown in FIG. 10 to FIG. 12.

For example, data D0, D1, D2, ... D1023 are written into the one-page amount (256×4 bytes) memory cells connected to word lines WL1A, WL1B, WL1C and WL1D in four sub-cell arrays A, B, C and D. Further, data is simultaneously erased from the one-page amount memory cells connected to the word lines WL1A, WL1B, WL1C and WL1D in the sub-cell arrays A, B, C and D or in the memory cells in blocks 1A, 1B, 1C and 1D in the sub-cell arrays A, B, C and D. Still further, the data D0, D1, D2, . . . D1023 are simultaneously read from the one-page amount memory cells connected to the word lines WL1A, WL1B, WL1C and WL1D in the sub-cell arrays A, B, C and D.

In this way, when the second mode in which writing, erasing or reading is performed in the memory cell having the second page size (or block size) is selected, the mode switch control circuit 23 further switches the mode so that the pre-charge time of the bit line, the step-up capability of the booster circuit, or the write time will take the second value. At this point, the peak current generated in the flash memory chip 11 has a level of value that does not cause the erroneous operation of the system, as in the first mode.

[3] ANOTHER EXAMPLES

According to an example of the present invention, the first example and the second example described above can be combined. Table 1 shows a mode selecting method when the first example and the second example are combined.

TABLE 1

|  | Small page size | Large page size |
|---|---|---|
| System A | High-speed operation mode | High-speed operation mode or Low current consumption mode |
| System B | High-speed operation mode or Low current consumption mode | Low current consumption mode |

System A: system that does not easily cause voltage decrease due to peak current
System B: system that easily causes voltage decrease due to peak current A system A has a large capacitor, and thus has such a characteristic that the erroneous operation is not easily caused due to the peak current in the flash memory. When the flash memory is used in this system A, the flash memory is set in the high-speed operation mode in principle. However, when the page size targeted for writing, erasing or reading is large, there is a possibility that the power supply voltage of the entire system A is decreased due to the peak current, so that the flash memory is used in the low current consumption mode, as required.

A system B can only be equipped with a small capacitor, and thus has such a characteristic that the erroneous operation is easily caused due to the peak current in the flash memory. When the flash memory is used in this system B, the flash memory is set in the low current consumption mode in principle. However, when the page size targeted for writing, erasing or reading is small, the power supply voltage of the entire system B is not easily decreased due to the peak current, so that the flash memory is used in the high-speed operation mode, as required.

It is, however, necessary to pay attention to the fact that the purpose of the second example is definitely to always keep the constant peak current irrespective of the page size. It has been described here that because the first example and the second example are combined, the high-speed operation mode or the low current consumption mode is selected depending on the page size, but what is meant here is that, for example, the mode selecting method in the first example can be applied to always keep the constant peak current irrespective of the page size.

(2) Circuit Examples for Mode Decision

Circuit examples for a mode decision, that is, for selecting one of the high-speed operation mode and the low current consumption mode, or circuit examples for changing the pre-charge time of the bit line, the step-up capability of the booster circuit, or the write time will be described.

[1] EXAMPLE 1

Figure 13:
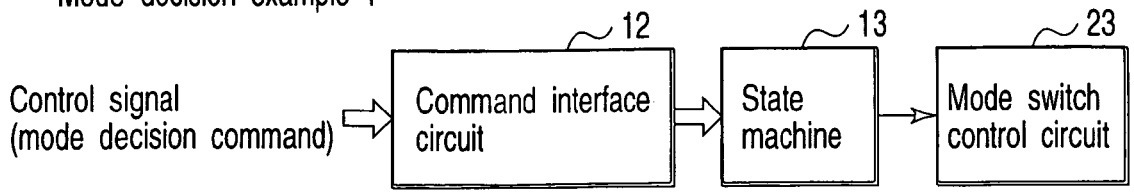
FIG. 13 is a diagram showing a mode decision example 1.

FIG. 13 shows a mode decision example 1.

In this example, the mode is decided on the basis of a control signal (command) from a chip which is different from the flash memory chip, for example, a microprocessor.

The control signal is input to the state machine 13 via the command interface circuit 12. The state machine 13 decodes the control signal, and gives a result thereof to the mode switch control circuit 23. The mode switch control circuit 23 decides the mode on the basis of an output signal of the state machine 13.

For example, when the control signal instructs to select the high-speed operation mode, the mode switch control circuit 23 sets the function of the flash memory into the high-speed operation mode on the basis of the output signal of the state machine 13. When the control signal instructs to select the low current consumption mode, the mode switch control circuit 23 sets the function of the flash memory to the low current consumption mode on the basis of the output signal of the state machine 13.

[2] EXAMPLE 2 TO EXAMPLE 4

Figure 14:
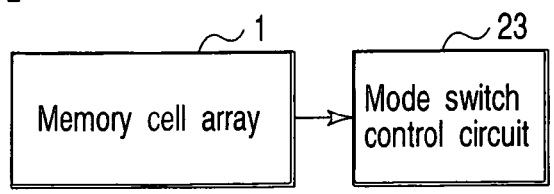
FIG. 14 is a diagram showing a mode decision example 2.
Figure 15:
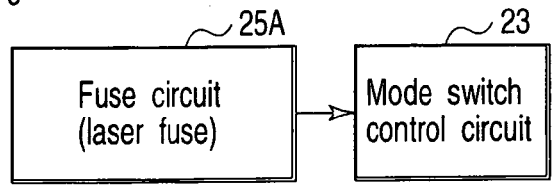
FIG. 15 is a diagram showing a mode decision example 3.
Figure 16:
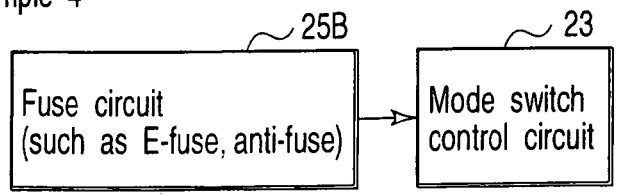
FIG. 16 is a diagram showing a mode decision example 4.

FIG. 14 to FIG. 16 show mode decision examples 2 to 4.

In these examples, the mode is decided on the basis of data stored in a memory element in the flash memory chip.

In an example of FIG. 14, part of the memory cell array 1 is used as the memory element. In other words, data for the mode decision is previously stored in the part of the memory cell array 1, and the data is supplied to the mode switch control circuit 23.

In an example of FIG. 15, a fuse circuit (laser fuse) 25A is used as the memory element. In this case, the mode is decided during the wafer process.

On the contrary, in an example of FIG. 16, a fuse circuit (such as E (electrically)-fuse, anti-fuse) 25B is used as the memory element. In this case, the mode can be decided not only during the wafer process, but also after an assembly process or a packaging process.

[3] EXAMPLE 5

Figure 17:
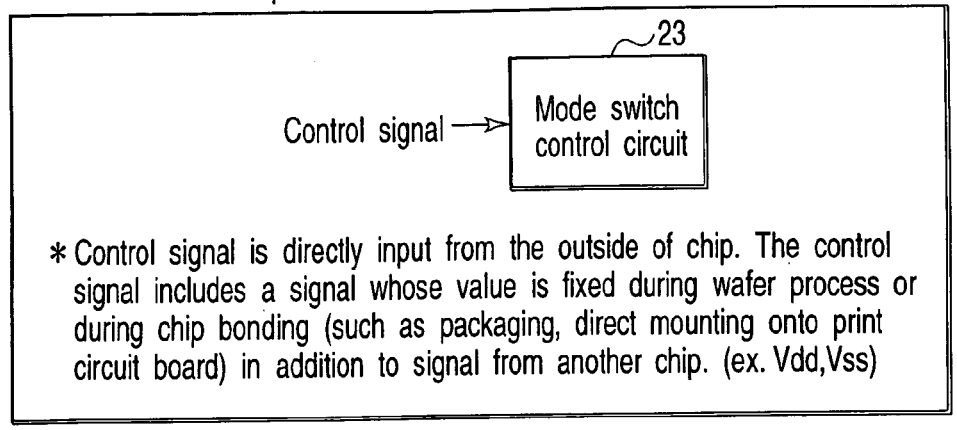
FIG. 17 is a diagram showing a mode decision example 5.

FIG. 17 shows a mode decision example 5.

In this example, the mode is decided by inputting the control signal from the outside of the flash memory chip directly into the mode switch control circuit 23.

The control signal includes a signal whose value is fixed (such as a power supply potential Vdd, Vss) during the wafer process or during chip bonding in addition to the signal from the different chip (such as the microprocessor).

(3) Circuit Examples for Mode Switch

Circuit examples for a mode switch, that is, circuit examples for executing one of the high-speed operation mode and the low current consumption mode, or circuit examples for changing the pre-charge time of the bit line, the step-up capability of the booster circuit, or the write time will be described.

[1] EXAMPLE 1 TO EXAMPLE 5

FIG. 18 to FIG. 22 show mode switch examples 1 to 5.

In these examples, the mode is switched by controlling the speed of charging or discharging the bit line in the memory cell array.

For example, the high-speed operation mode is attained if the bit line is charged or discharged at a high speed, because high-speed writing, erasing and reading can be performed. On the contrary, the low current consumption mode is attained if the bit line is charged or discharged at a low speed, because the peak current value is decreased. In the low current consumption mode, because of its nature, the operating speed is lower than in the high-speed operation mode.

Figure 18:
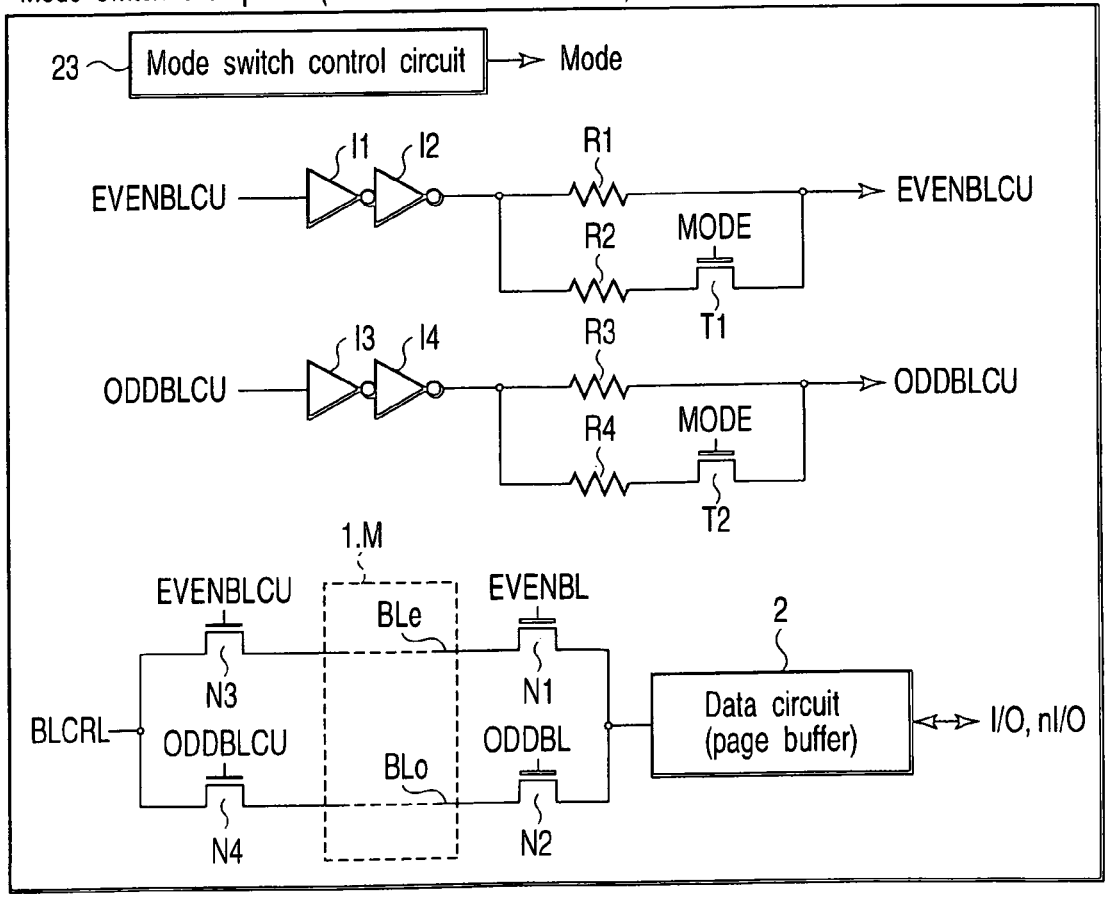
FIG. 18 is a diagram showing a mode switch example 1.

In an example of FIG. 18, the speed of charging a shield bit line with a shield potential BLCRL is controlled.

For example, if an even bit line BLe is an unselected shield bit line and an odd bit line BLo is a selected bit line, an EVENBLCU and an ODDBL are "H", and an ODDBLCU and an EVENBL are "L". As a result, the even bit line BLe is charged with the shield potential (e.g., the power supply potential Vdd) BLCRL, and the data circuit (page buffer) 2 is electrically connected to the odd bit line BLo.

Here, for example, an output signal MODE of the mode switch control circuit 23 is "H" in the high-speed operation mode. Therefore, N-channel transistors T1 and T2 are turned on. In other words, since the EVENBLCU rises from "L" to "H" at a high speed, the shield bit line BLe can be charged with the shield potential BLCRL at a high speed.

On the contrary, for example, the output signal MODE of the mode switch control circuit 23 is "L" in the low current consumption mode. Therefore, the N-channel transistors T1 and T2 are turned off. In other words, the EVENBLCU rises from "L" to "H" at a lower speed in the low current consumption mode than in the high-speed operation mode. As a result, the shield bit line BLe is charged with the shield potential BLCRL at a lower speed, allowing the peak current value to be low.

Figure 19:
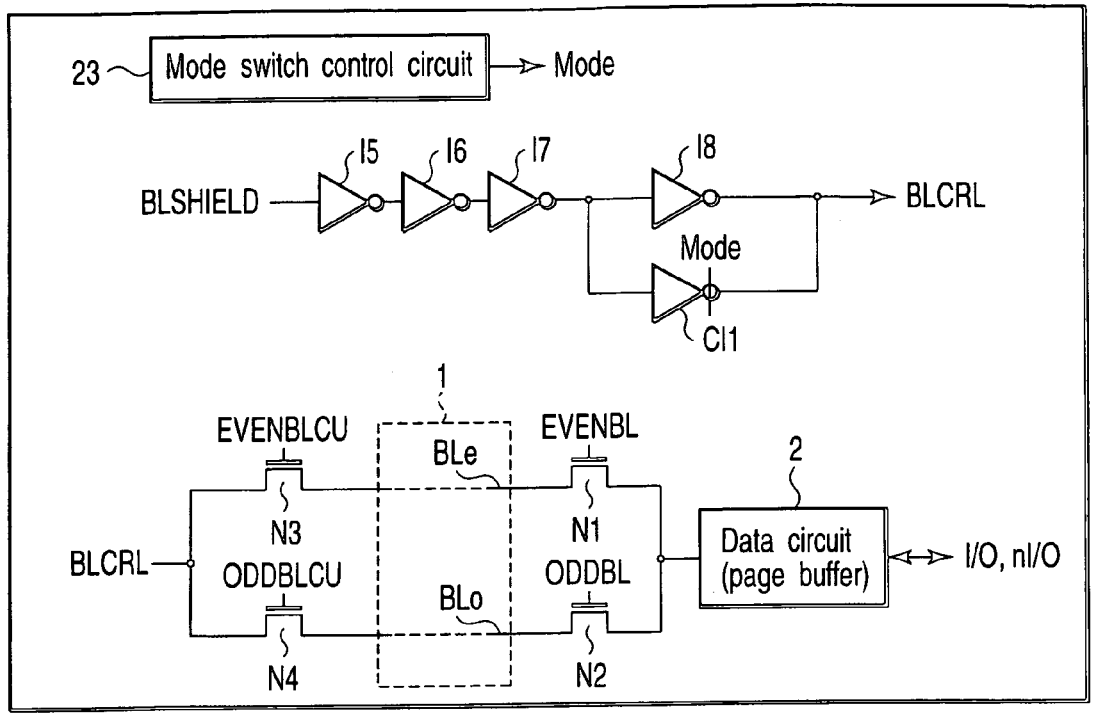
FIG. 19 is a diagram showing a mode switch example 2.

In an example of FIG. 19, the speed itself of raising the shield potential BLCRL from "L" to "H" is controlled.

For example, the even bit line BLe is an unselected shield bit line and the odd bit line BLo is the selected bit line. Then, the EVENBLCU and the ODDBL are "H", and the ODDBLCU and the EVENBL are "L". The bit line BLe is charged with the shield potential BLCRL, and the data circuit 2 is electrically connected to the bit line BLo.

Here, for example, in the high-speed operation mode, the output signal MODE of the mode switch control circuit 23 is "H", and a clocked inverter CI1 is in an active state. Therefore, the shield bit line BLe is driven by an inverter 18 and the clocked inverter CI1, and the shield bit line BLe is charged to the shield potential BLCRL at a high speed.

On the contrary, for example, in the low current consumption mode, the output signal MODE of the mode switch control circuit 23 is "L", and the clocked inverter CI1 is in a non-active state. Therefore, the shield bit line BLe is driven only by the inverter 18. In other words, the shield bit line BLe is charged to the shield potential BLCRL at a lower speed in the low current consumption mode than in the high-speed operation mode, thereby allowing the peak current value to be low.

Figure 20:
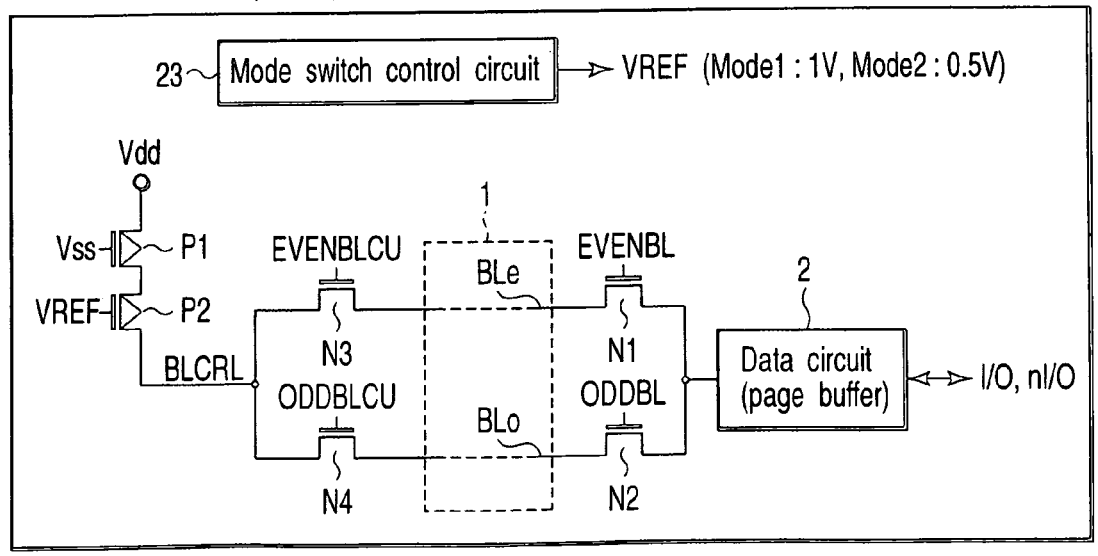
FIG. 20 is a diagram showing a mode switch example 3.

In an example of FIG. 20, the speed itself of raising the shield potential BLCRL from "L" to "H" is controlled as in the example of FIG. 19.

For example, the even bit line BLe is the unselected shield bit line and the odd bit line BLo is the selected bit line. Then, the EVENBLCU and the ODDBL are "H", and the ODDBLCU and the EVENBL are "L". The bit line BLe is charged with the shield potential BLCRL, and the data circuit 2 is electrically connected to the bit line BLo.

Here, for example, in the high-speed operation mode, a value of a VREF output from the mode switch control circuit 23 is 1V (mode 1), and this VREF is given to a gate of a P-channel MOS transistor P2 for charging the shield bit line BLe to the power supply potential Vdd. Therefore, the P-channel MOS transistor P2 charges the shield bit line BLe at a high speed.

On the contrary, for example, in the low current consumption mode, the value of the VREF output from the mode switch control circuit 23 is 0.5V (mode 2), and this VREF is given to the gate of the P-channel MOS transistor P2 for charging the shield bit line BLe to the power supply potential Vdd. Therefore, the P-channel MOS transistor P2 charges the shield bit line BLe at a lower speed in the low current consumption mode than in the high-speed operation mode, thereby allowing the peak current value to be low.

Figure 21:
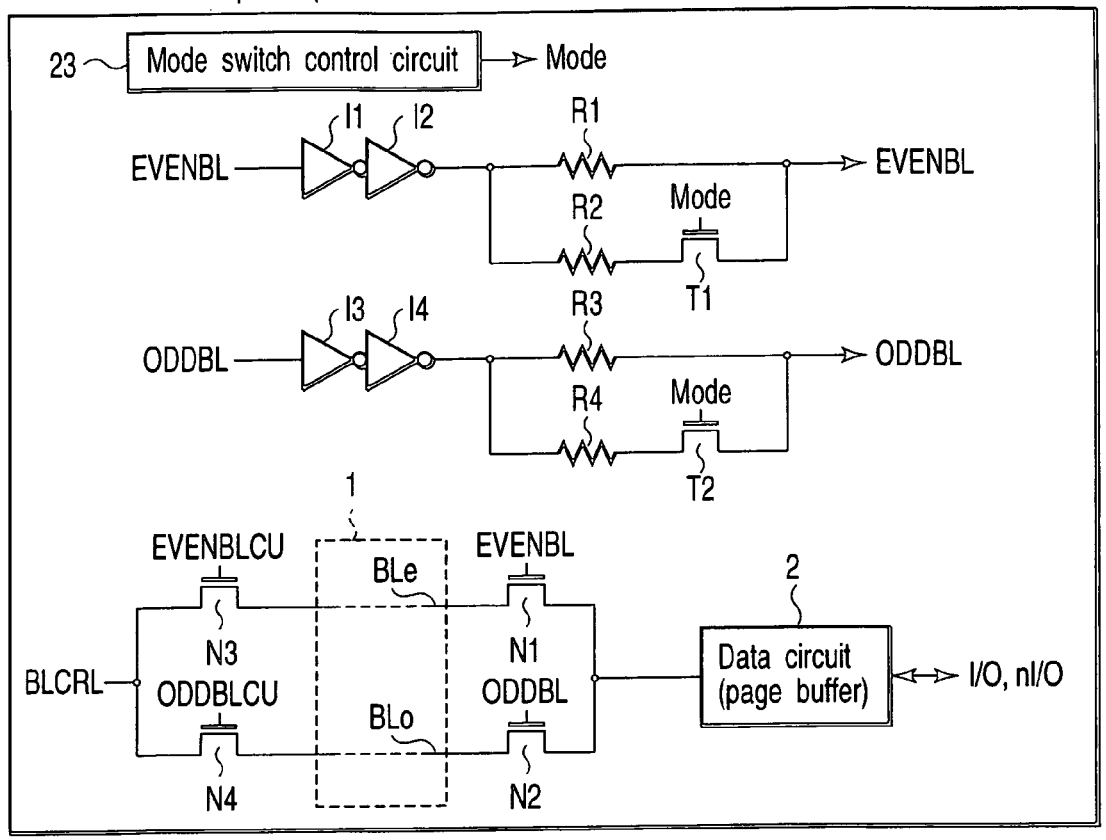
FIG. 21 is a diagram showing a mode switch example 4.

In an example of FIG. 21, the speed of charging the selected bit line with the potential is controlled.

For example, if the even bit line BLe is the unselected shield bit line and the odd bit line BLo is the selected bit line, the EVENBLCU and the ODDBL are "H", and the ODDBLCU and the EVENBL are "L". As a result, the even bit line BLe is charged with the shield potential (e.g., the power supply potential Vdd) BLCRL, and the data circuit (page buffer) 2 is electrically connected to the odd bit line BLo.

Here, for example, the output signal MODE of the mode switch control circuit 23 is "H" in the high-speed operation mode. Therefore, the N-channel transistors T1 and T2 are turned on. In other words, since the ODDBL rises from "L" to "H" at a high speed, the selected bit line BLe can be charged with the potential at a high speed.

On the contrary, for example, the output signal MODE of the mode switch control circuit 23 is "L" in the low current consumption mode. Therefore, the N-channel transistors T1 and T2 are turned off. In other words, the ODDBL rises from "L" to "H" at a lower speed in the low current consumption mode than in the high-speed operation mode. As a result, the selected bit line BLo is charged with the potential at a lower speed, allowing the peak current value to be low.

Figure 22:
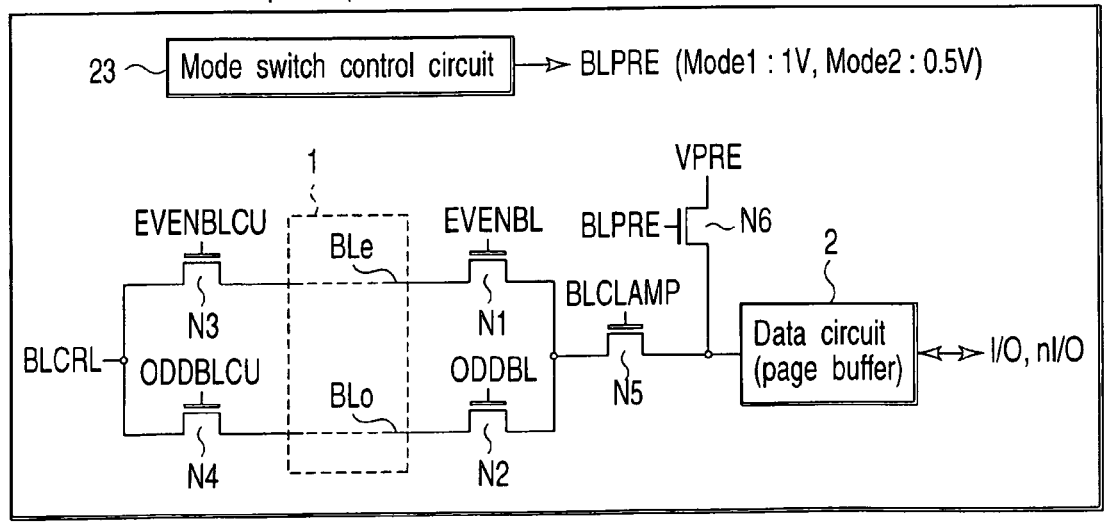
FIG. 22 is a diagram showing a mode switch example 5.

In an example of FIG. 22, the speed itself of raising the potential of the selected bit line from "L" to "H" is controlled.

For example, the even bit line BLe is the unselected shield bit line and the odd bit line BLo is the selected bit line. Then, the EVENBLCU and the ODDBL are "H", and the ODDBLCU and the EVENBL are "L". The bit line BLe is charged with the shield potential BLCRL, and the data circuit 2 is electrically connected to the bit line BLo.

Here, for example, in the high-speed operation mode, a value of a pre-charge signal BLPRE output from the mode switch control circuit 23 is 1V (mode 1), and this BLPRE is given to a gate of an N-channel MOS transistor N6 for pre-charging the bit line BLo with a pre-charge potential VPRE. Therefore, the N-channel MOS transistor N6 charges the selected bit line BLo at a high speed.

On the contrary, for example, in the low current consumption mode, the value of the pre-charge signal BLPRE output from the mode switch control circuit 23 is 0.5V (mode 2), and this BLPRE is given to the gate of the N-channel MOS transistor N6 for pre-charging the bit line BLo to the pre-charge potential VPRE.

Therefore, the N-channel MOS transistor N6 charges the selected bit line BLo at a lower speed in the low current consumption mode than in the high-speed operation mode, thereby allowing the peak current value to be low.

[2] EXAMPLE 6

Figure 23:
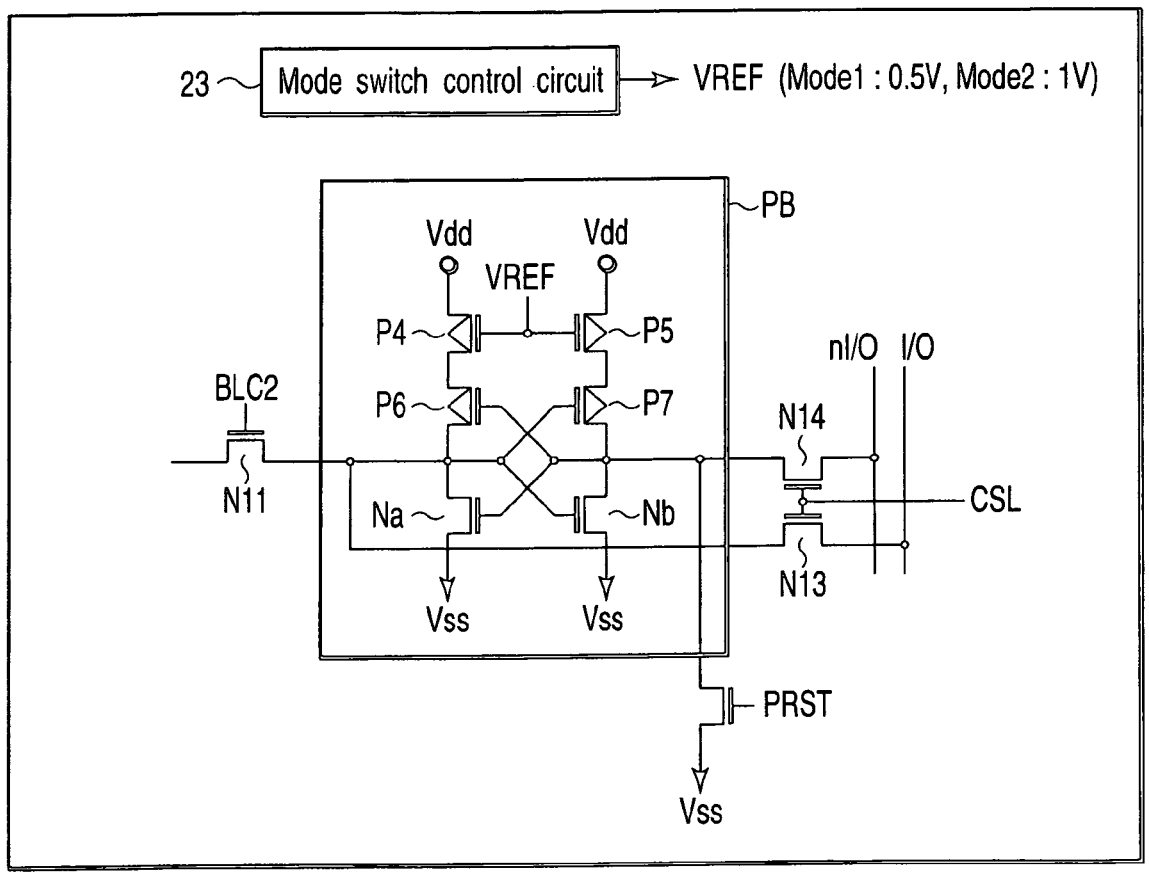
FIG. 23 is a diagram showing a mode switch example 6.

FIG. 23 shows a mode switch example 6.

In this example, the mode is switched by controlling the characteristics of the page buffer PB in the data circuit.

The page buffer PB is composed of P-channel MOS transistors P4, P5, P6 and P7, and N-channel MOS transistors Na and Nb. The transistors P6, P7, Na and Nb constitute a latch circuit comprising flip-flop-connected two inverters, and this latch circuit temporarily stores data. The reference potential VREF to decide the capability of the page buffer PB is input to the gates of transistors P4 and P5.

It should be noted that circuit examples of the data circuit including the page buffer PB will be described later.

In such a page buffer PB, the value of the reference potential VREF or the value of the power supply potential Vdd can be controlled to switch the mode.

For example, in the high-speed operation mode, the value of the reference potential VREF output from the mode switch control circuit 23 is set to 0.5V (mode 1), and this VREF is given to the gates of the P-channel MOS transistors P4 and P5. Therefore, the page buffer PB operates at a high speed, thereby performing a high-speed operation in, for example, transferring the write data to the bit line or latching the read data.

On the contrary, for example, in the low current consumption mode, the value of the reference potential VREF output from the mode switch control circuit 23 is set to 1V (mode 2), and this VREF is given to the gates of the P-channel MOS transistors P4 and P5. Therefore, the page buffer PB operates at a low speed, so that a low-speed operation is performed in, for example, transferring the write data to the bit line or latching the read data, thus lowering the peak current value.

In addition, the value of the power supply potential Vdd can be controlled instead of the reference potential VREF to switch the mode. In other words, the value of the power supply potential Vdd in the low current consumption mode may be set lower than the value of the power supply potential Vdd in the high-speed operation mode.

[3] EXAMPLE 7 AND EXAMPLE 8

Figure 24A:
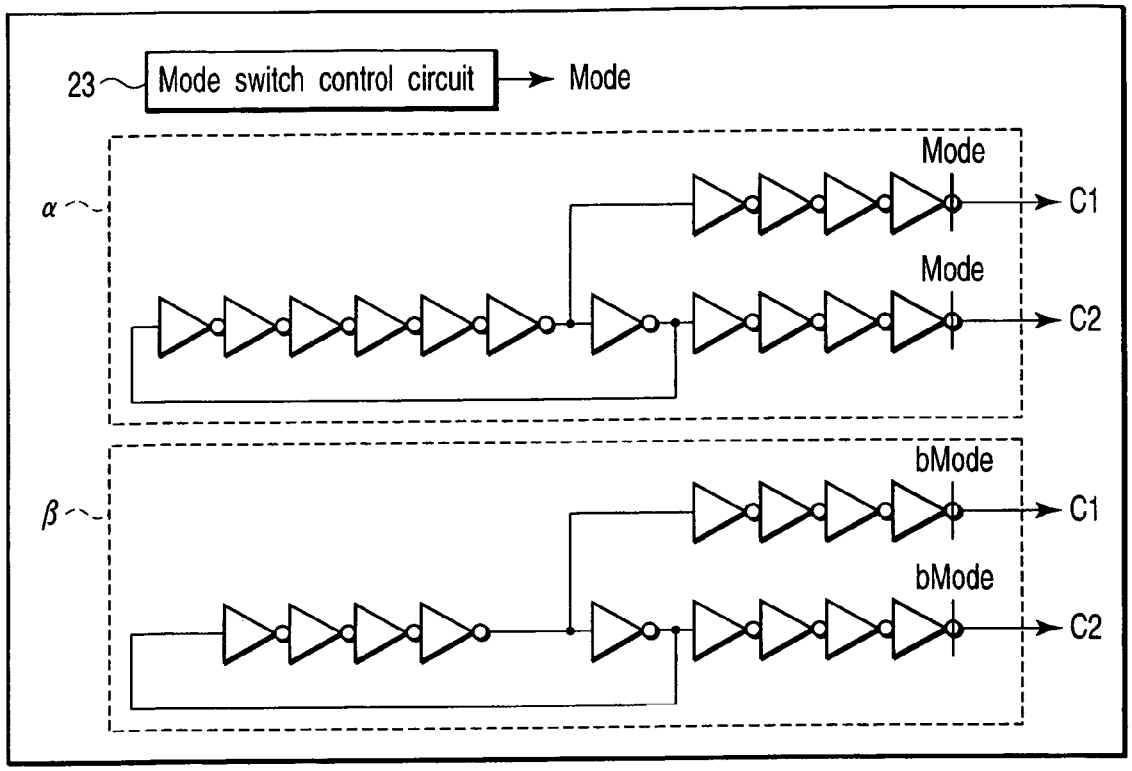
FIG. 24A and FIG. 24B are diagrams showing a mode switch example 7.
Figure 24B:
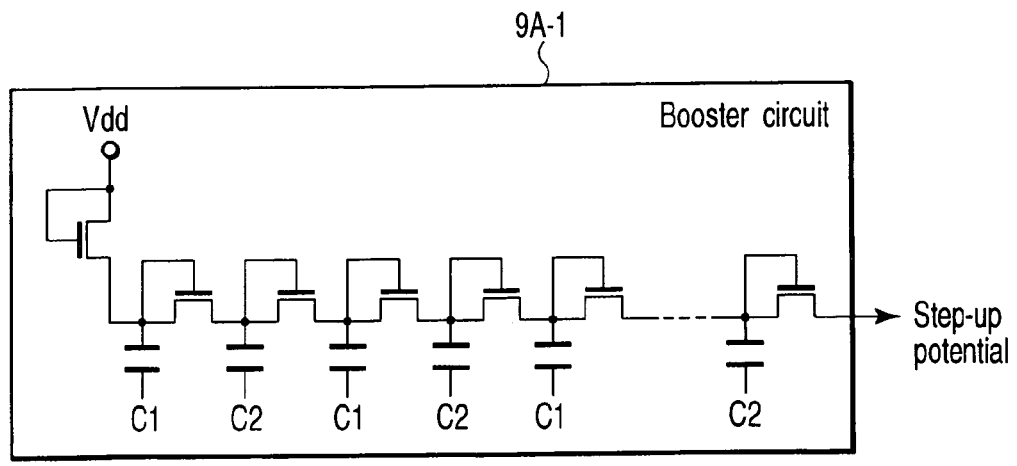
Figure 25:
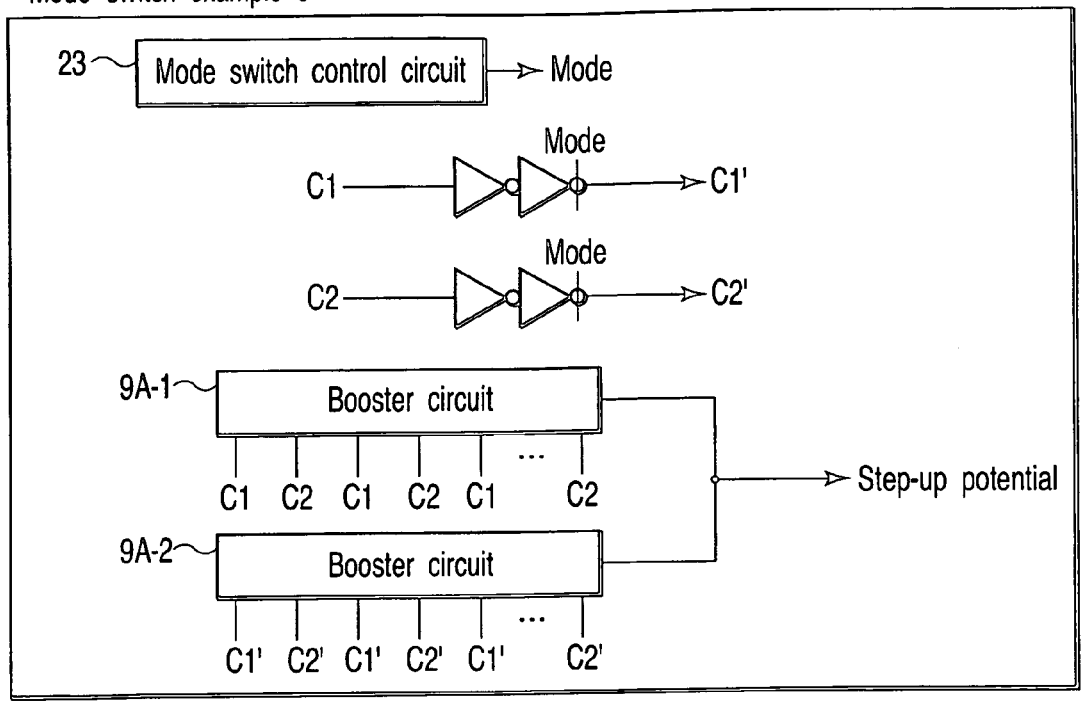
FIG. 25 is a diagram showing a mode switch example 8.

FIGS. 24A, 24B and 25 show mode switch examples 7 and 8.

In these examples, the mode is switched by controlling the characteristics of the booster circuit in potential generating circuit which generates the potential needed for writing, erasing or reading.

In the examples of FIGS. 24A and 24B, a value of a clock frequency driving a booster circuit 9A-1 is controlled by use of two kinds of ring oscillators α and β to switch the mode.

For example, in the high-speed operation mode, the output signal MODE of the mode switch control circuit 23 is "H", so that clock signals C1 and C2 are output from the ring oscillator α, and the clock signals C1 and C2 are given to the booster circuit 9A-1. Here, as the frequency of the clock signals C1 and C2 output from the ring oscillator α is higher than the frequency output from the ring oscillator β, the booster circuit 9A-1 generates a step-up potential at a high speed.

On the contrary, for example, in the low current consumption mode, the output signal MODE of the mode switch control circuit 23 is "L", so that the clock signals C1 and C2 are output from the ring oscillator β, and the clock signals C1 and C2 are given to the booster circuit 9A-1. Here, as the frequency of the clock signals C1 and C2 output from the ring oscillator β is lower than the frequency output from the ring oscillator α, the booster circuit 9A-1 generates a step-up potential at a low speed. Thus, the peak current value during writing, erasing and reading can be reduced.

In addition, for example, the value of the power supply potential Vdd in the booster circuit 9A-1 can be controlled instead of the frequency of the clock signals C1 and C2 to switch the mode. In other words, the value of the power supply potential Vdd in the low current consumption mode may be set lower than the value of the power supply potential Vdd in the high-speed operation mode.

In an example of FIG. 25, a plurality (two in the present example) of booster circuits 9A-1 and 9A-2 is prepared, and the number of booster circuits 9A-1 and 9A-2 to be operated is controlled to switch the mode.

For example, in the high-speed operation mode, the output signal MODE of the mode switch control circuit 23 is "H", so that clock signals C1 and C2' are generated from the clock signals C1 and C2. Therefore, the booster circuits 9A-1 and 9A-2 are operated and these two booster circuits generate the step-up potential, thus generating the step-up potential at a high speed.

On the contrary, for example, in the low current consumption mode, the output signal MODE of the mode switch control circuit 23 is "L", so that the clock signals C1' and C2' are not generated. Therefore, only the booster circuit 9A-1 is operated and the step-up potential is generated only by this booster circuit, thus generating the step-up potential at a low speed. As a result, the peak current value during writing, erasing and reading can be reduced.

(4) Relationship Between Current Consumption and Writing, Erasing or Reading Period The flash memory according to the first example (see FIG. 1) of the present invention is characterized by having the function to switch between the high-speed operation mode giving priority to the high-speed operation, and the low current consumption mode aimed at reducing the peak current value.

Figure 26:
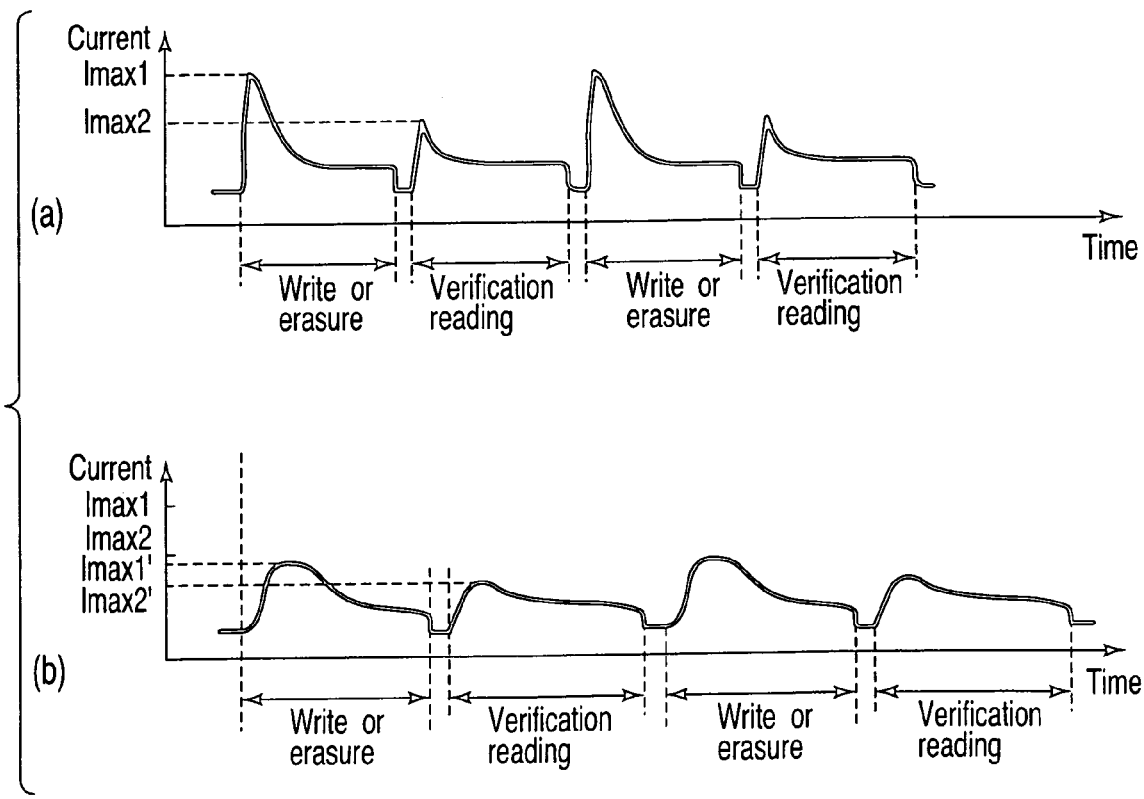
FIG. 26 is a diagram showing current consumption during writing/erasing in high-speed operation/low current consumption modes.
Figure 27:
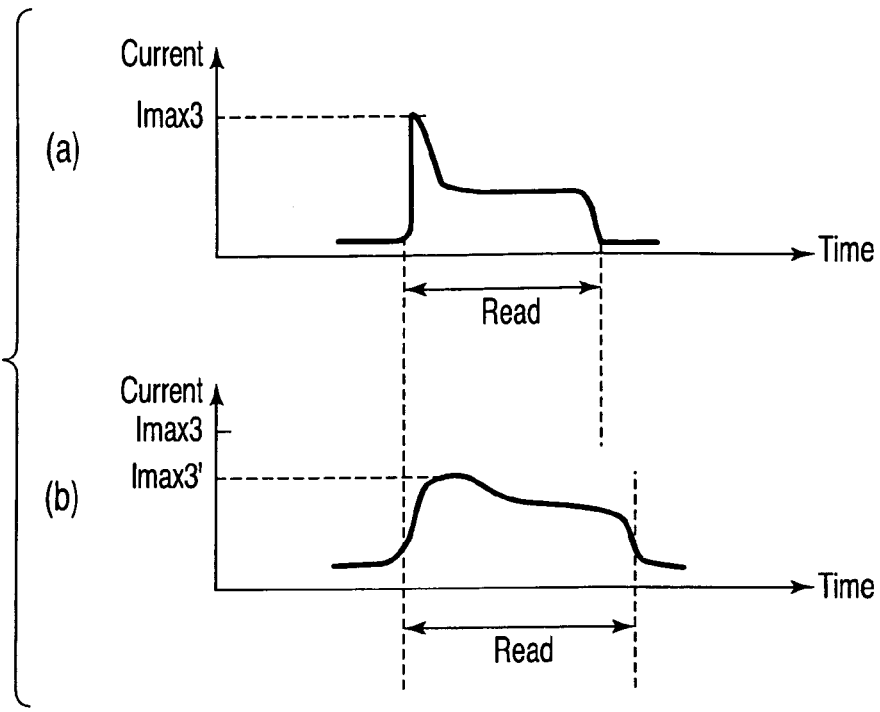
FIG. 27 is a diagram showing the current consumption during reading in the high-speed operation/low current consumption modes.

As shown in FIG. 26 and FIG. 27, the peak current is easily generated at the start of the operation (FIG. 26(a)), in the writing, erasing or reading (including verification reading) operation. The higher the peak current value is, the more likely that the power supply potential of the entire system is reduced and the erroneous operation is caused.

Therefore, in the low current consumption mode, time to charge or discharge the bit line is increased or the operation speed of the page buffer or the booster circuit is decreased as described above, so as to increase a writing, erasing or reading period and reduce the peak current value (FIG. 26(b)).

In addition, for example, in a system which is not easily affected by the peak current, the high-speed operation mode is performed, that is, the high-speed operation is given priority as shown in FIG. 26 and FIG. 27(a).

Figure 28:
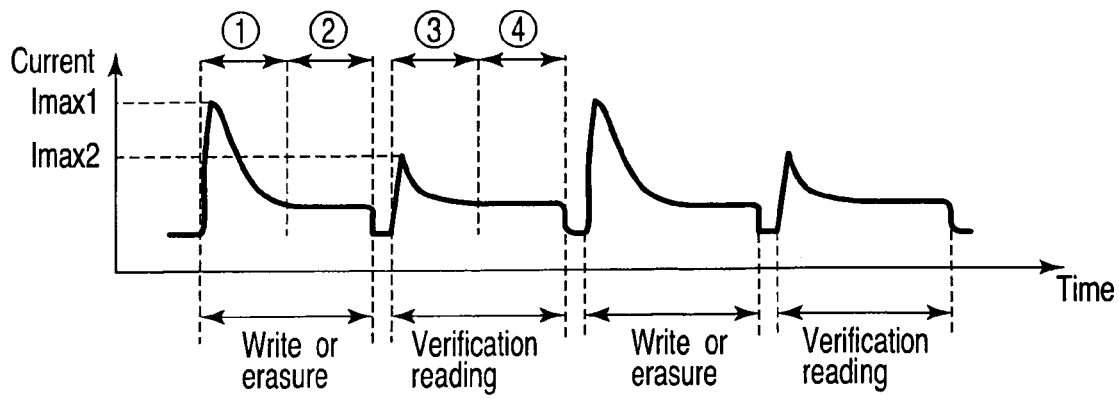
FIG. 28 is a diagram showing an example of switching between the high-speed operation/low current consumption modes during writing/erasing.
Figure 29:
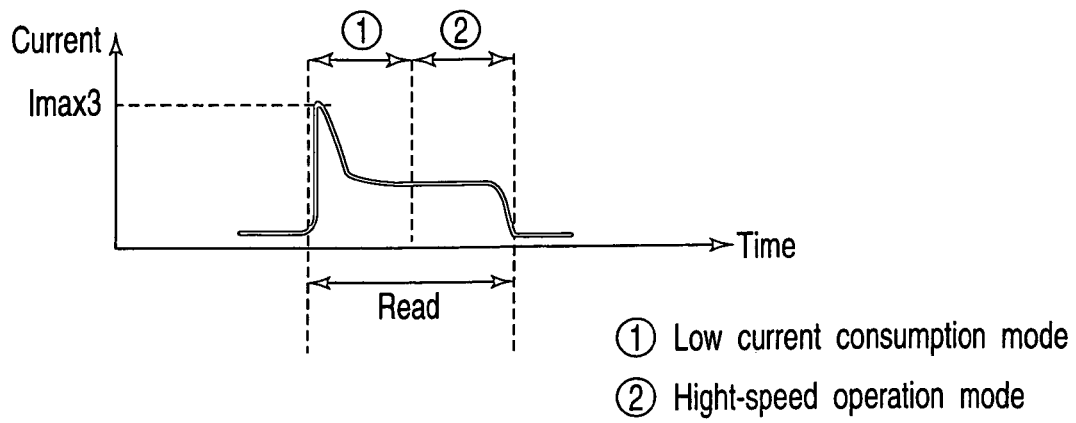
FIG. 29 is a diagram showing an example of switching between the high-speed operation/low current consumption modes during reading.

Moreover, as shown in FIG. 28 and FIG. 29, the first half of the writing, erasing or reading period when the peak current is easily generated may be in the low current consumption mode, and the second half of the writing, erasing or reading period may be in the high-speed operation mode.

In other words, the mode can be freely switched as needed without fixing the mode in one system to simultaneously satisfy desires for the high-speed operation and low current consumption.

(5) Example of Memory Cell Array Configuration

Figure 30:
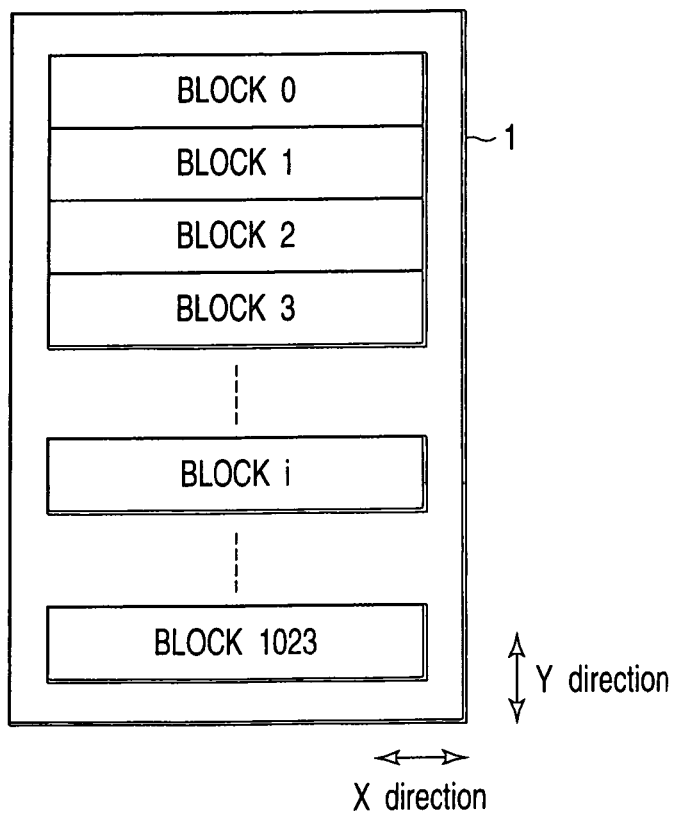
FIG. 30 is a diagram showing an example of the memory cell array.
Figure 31:
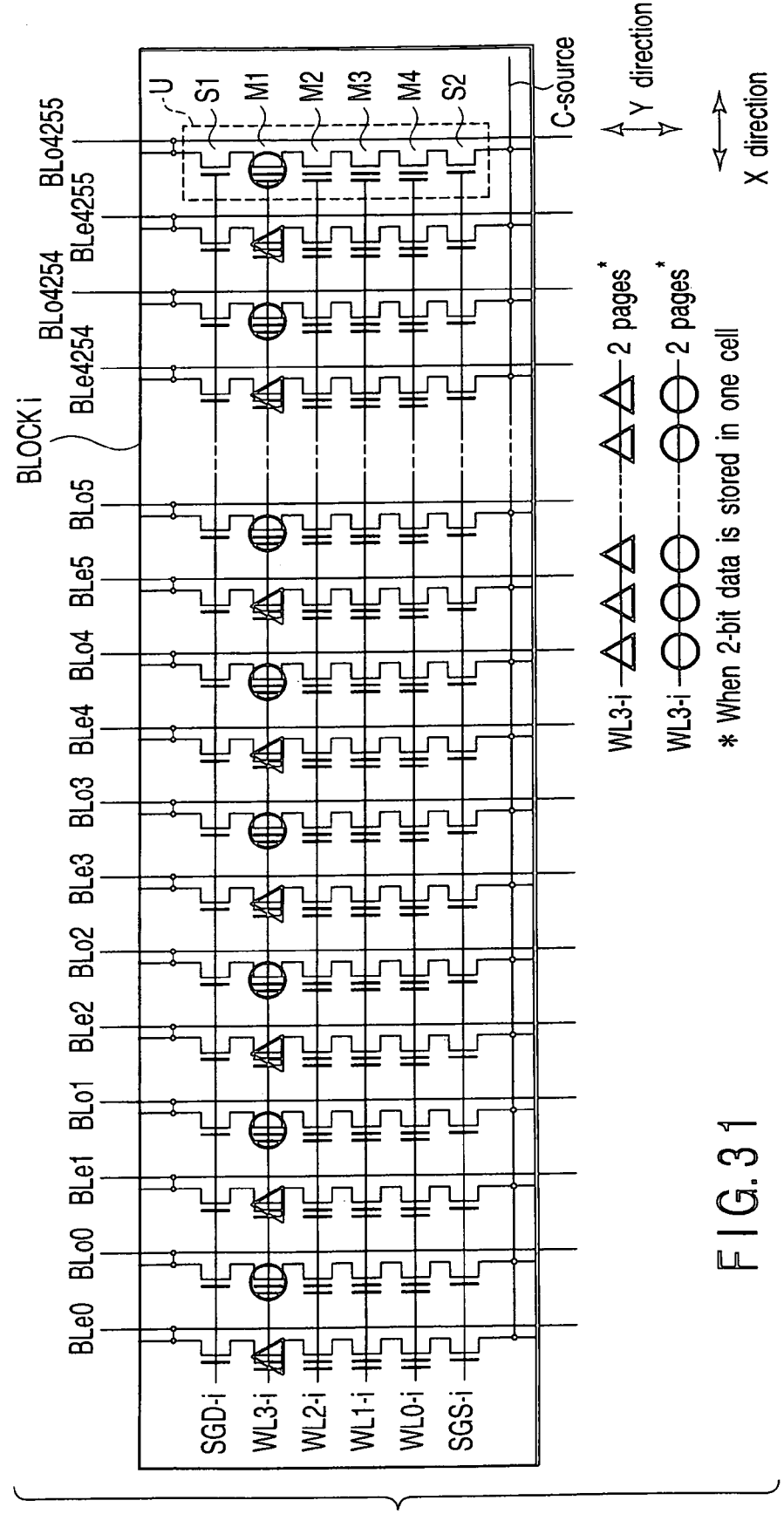
FIG. 31 is a diagram showing an example of the memory cell array.

FIG. 30 shows an example of a memory array configuration. FIG. 31 shows one block BLOCKi among a plurality of blocks shown in FIG. 30.

The memory cell array 1 is composed of a plurality (1024 in the present example) of blocks BLOCK0 to BLOCK1023. The plurality of blocks BLOCK0 to BLOCK1023 is arranged in a Y direction. The block means a minimum unit for erase, that is, the minimum number of memory cells from which data can be erased at a time.

The one block BLOCKi is composed of a plurality (8512 in the present example) of NAND cell units U arranged in an X direction. One NAND cell unit U is constituted of a NAND string including four memory cells M1, M2, M3 and M4 connected in series, a select gate transistor S1 connected to one end of the NAND string, and a select gate transistor S2 connected to the other end of the NAND string.

In the present example, the NAND string is comprised of the four memory cells M1, M2, M3 and M4, but the NAND string may be comprised of one or two or more memory cells, and is not particularly limited to four memory cells.

The select gate transistor S1 is connected to the bit line BLek or the bit line BLok (k=0, 1 . . . 4255), and the select gate transistor S2 is connected to a common source line C-source.

Word lines (control gate lines) WL0-$i$, WL1-$i$, is WL2-$i$ and WL3-$i$ extend in the X direction, and are commonly connected to a plurality of memory cells in the X direction. A select gate line SGD-$i$ extends in the X direction, and is commonly connected to the plurality of select gate transistors S1 in the X direction. A select gate line SGS-$i$ also extends in the X direction, and is commonly connected to the plurality of select gate transistors S2 in the X direction.

In the present example, in the write/read operation, a plurality of even bit lines BLe0, BLe1, . . . BLe4255 from one end of the block BLOCKi, and a plurality of odd bit lines BLo0, BLo1, . . . BLo4255 (ODD) from one end thereof are driven independently from each other. However, the bit lines are counted from 0.

In other words, the write/read operation is performed simultaneously for 4256 memory cells (indicated by triangles) connected to the plurality of even bit lines BLe0, BLe1, . . . BLe4255, among 8512 memory cells connected to one word line, for example, the word line WL3-$i$. Further, the write/read operation is performed simultaneously for 4256 memory cells (indicated by circles) connected to the plurality of odd bit lines BLo0, BLo1, . . . BLo4255, among the 8512 memory cells connected the word line WL3-$i$.

When one memory cell stores 1-bit data, 4256 memory cells (indicated by triangles) located at an intersection of one word line, for example, the word line WL3-$i$ and the plurality of even bit lines BLe0, BLe1, . . . BLe4255 constitute a unit called a page. In the same manner, 4256 memory cells (indicated by circles) located at an intersection of the word line WL3-$i$ and the plurality of odd bit lines BLo0, BLo1, . . . BLo4255 also constitute a unit called the page.

Furthermore, when one memory cell stores 2-bit data as in the present example, the 4256 memory cells (indicated by triangles) store data of two pages, and the 4256 memory cells (indicated by circles) also store data of two pages.

(6) Example of Device Configuration
[1] Example of Well Configuration

Figure 32:
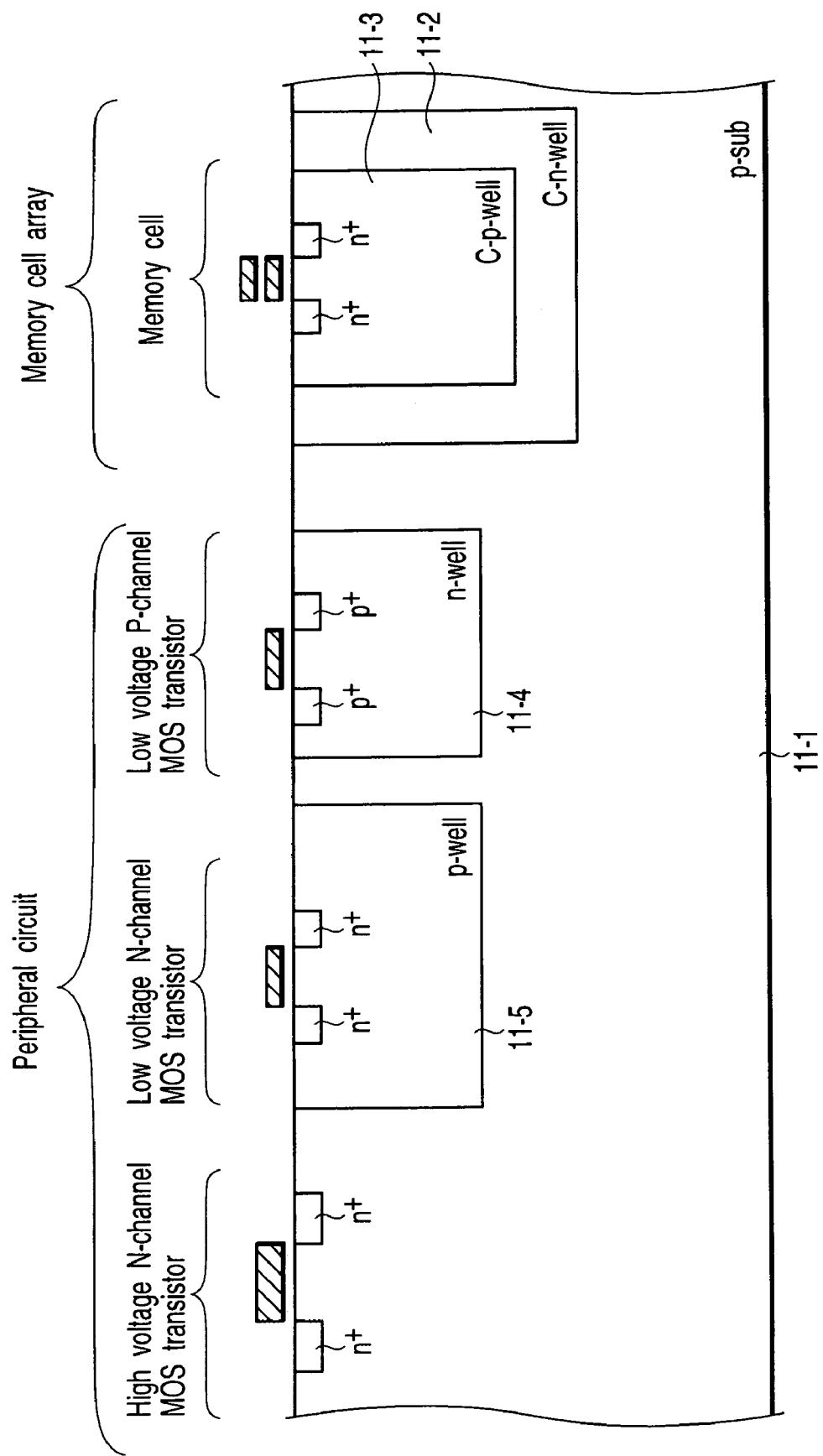
FIG. 32 is a sectional view showing an example of a device structure.

FIG. 32 shows an example of a well configuration of a NAND cell type flash memory.

In a p-type silicon substrate (p-sub) 11-1, there are formed a so-called double well area composed of an n-type well area (C-n-well) 11-2 and a p-type well area (C-p-well) 11-3; an n-type well area (n-well) 11-4; and a p-type well area (p-well) 11-5.

The double well area is formed in a memory cell array section, and the n-type well area 11-4 and the p-type well area 11-5 are formed in a peripheral circuit section.

The memory cell includes an N-channel MOS transistor, and is disposed in the p-type well area 11-3. The n-type well area 11-2 and the p-type well area 11-3 are set at the same potential.

A high voltage N-channel MOS transistor to which a voltage higher than the power supply voltage is applied is formed in a P-type silicon substrate (p-sub) 11-1. A low voltage P-channel MOS transistor to which the power supply voltage is applied is formed in the n-type well area (n-well) 11-4, and a low voltage N-channel MOS transistor to which the power supply voltage is applied is formed in the p-type well area (p-well) 11-5.

[2] Example of Cell Array Configuration

Figure 33:
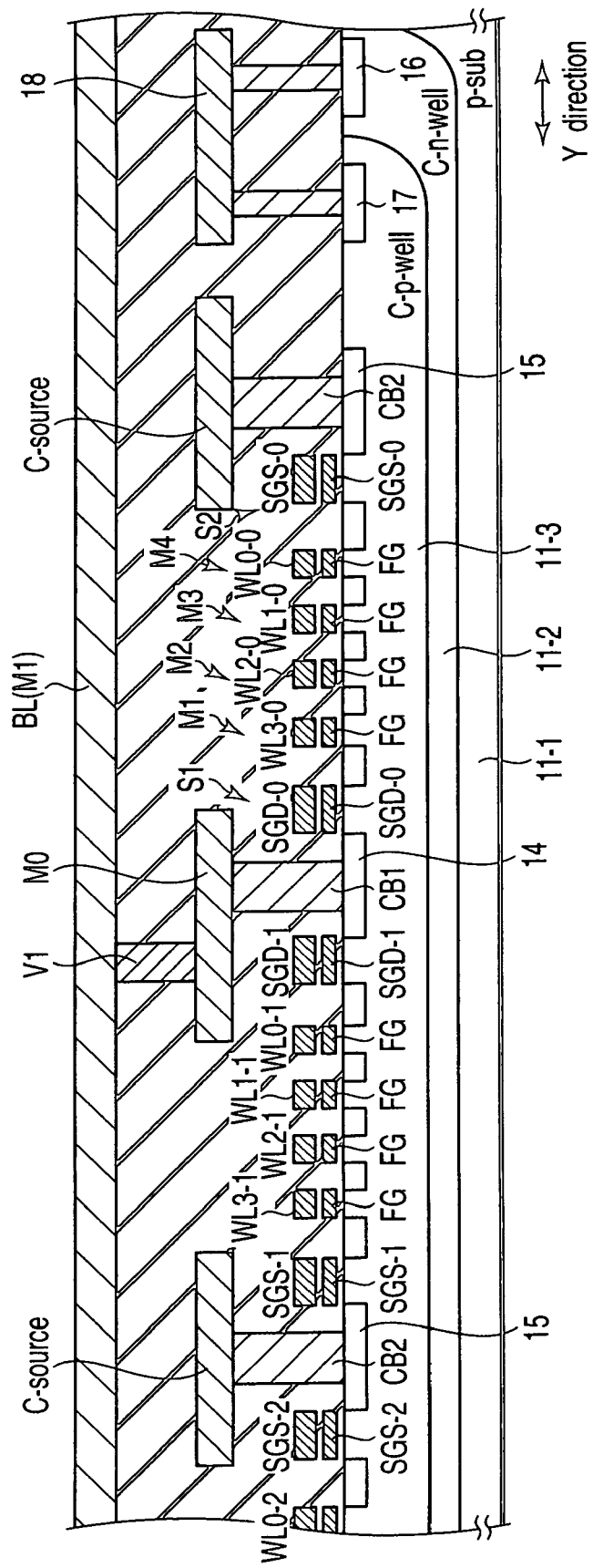
FIG. 33 is a sectional view showing an example of the device structure.

FIG. 33 shows an example of a Y-direction sectional configuration of the memory cell array section of the NAND cell type flash memory.

The double well area composed of the n-type well area 11-2 and the p-type well area 11-3 is formed in the p-type silicon substrate 11-1.

The four memory cells M1, M2, M3 and M4 connected in series are disposed in the p-type well area 11-3. The four memory cells M1, M2, M3 and M4 include N-channel MOS transistors, and have a stack gate configuration comprised of a floating gate electrode FG and control gate electrodes WL0-$i$, WL1-$i$, WL2-$i$ and WL3-$i$.

The select gate transistor S1 is connected to one end of the NAND string comprised of the serially connected four memory cells M1, M2, M3 and M4, and the select gate transistor S2 is connected to the other end thereof. The select gate transistors S1 and S2 include the N-channel MOS transistors, and have a configuration approximate to the memory cells M1, M2, M3 and M4, that is, the double-structured select gate lines SGS-$i$ and SGD-$i$.

One end of the NAND cell unit, that is, a diffused layer (drain diffused layer) 14 of the select gate transistor S1 is connected to a first metal wiring layer M0 through a contact plug CB1. Further, the first metal wiring layer M0 is connected to a second metal wiring layer M1 as a bit line BL through a via plug V1. The bit line BL is connected to the data circuit.

The other end of the NAND cell unit, that is, a diffused layer (source diffused layer) 15 of the select gate transistor S2 is connected to the first metal wiring layer M0 as a common source line C-source through a contact plug CB2. The common source line C-source is connected to a source potential control circuit.

The n-type well area (C-n-well) 11-2 is connected to a C-p-well potential setting line 18 through an n-type diffused layer 16, and the p-type well area (C-p-well) 11-3 is connected to the C-p-well potential setting line 18 through a p-type diffused layer 17. In other words, the n-type well area 11-2 and the p-type well area 11-3 are set at the same potential. The C-p-well potential setting line 18 is connected to a well potential control circuit.

In addition, the floating gate electrode FG, the control gate electrodes WL0-$i$, WL1-$i$, WL2-$i$ and WL3-$i$, and the select gate lines SGS-$i$ and SGD-$i$ are made of, for example, conductive polysilicon containing impurities. Moreover, the first and second metal wiring layers M0 and M1 are made of, for example, aluminum, copper or an alloy of these metals.

Figure 34:
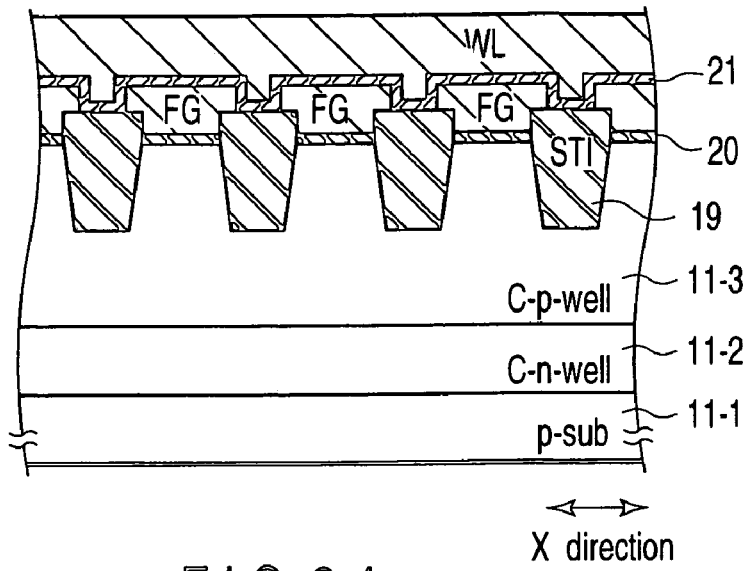
FIG. 34 is a sectional view showing an example of the device structure.
Figure 35:
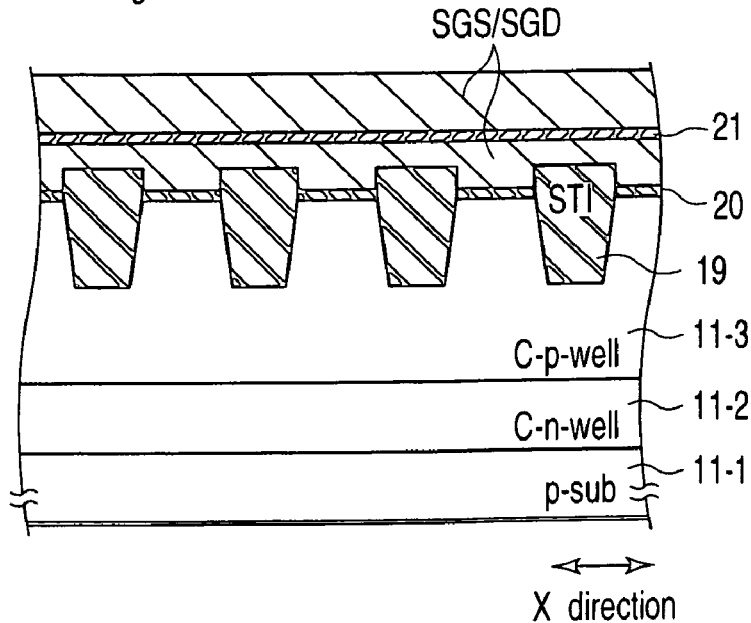
FIG. 35 is a sectional view showing an example of the device structure.

FIG. 34 shows an example of an X-direction sectional configuration of the memory cell, and FIG. 35 shows an example of an X-direction sectional configuration of the select gate transistor.

A plurality of memory cells (FG+WL) in the X direction is electrically separated from each other by an element separation layer 19 having an STI (shallow trench isolation) configuration. The floating gate electrode FG is disposed on the p-type well area 11-3 via a very thin tunnel oxide film 20. The control gate electrode WL is disposed on the floating gate electrode FG via an ONO (oxide/nitride/oxide) film 21.

The select gate line SGS/SGD has a double-structure. The lower select gate line SGS/SGD and the upper select gate line SGS/SGD are electrically connected to each other at the end of the memory cell array, and also in the memory cell array, are electrically connected to each other at certain intervals, for example, every 512 bit lines.

(7) Example of Configuration of Batch Detection Circuit

Figure 36:
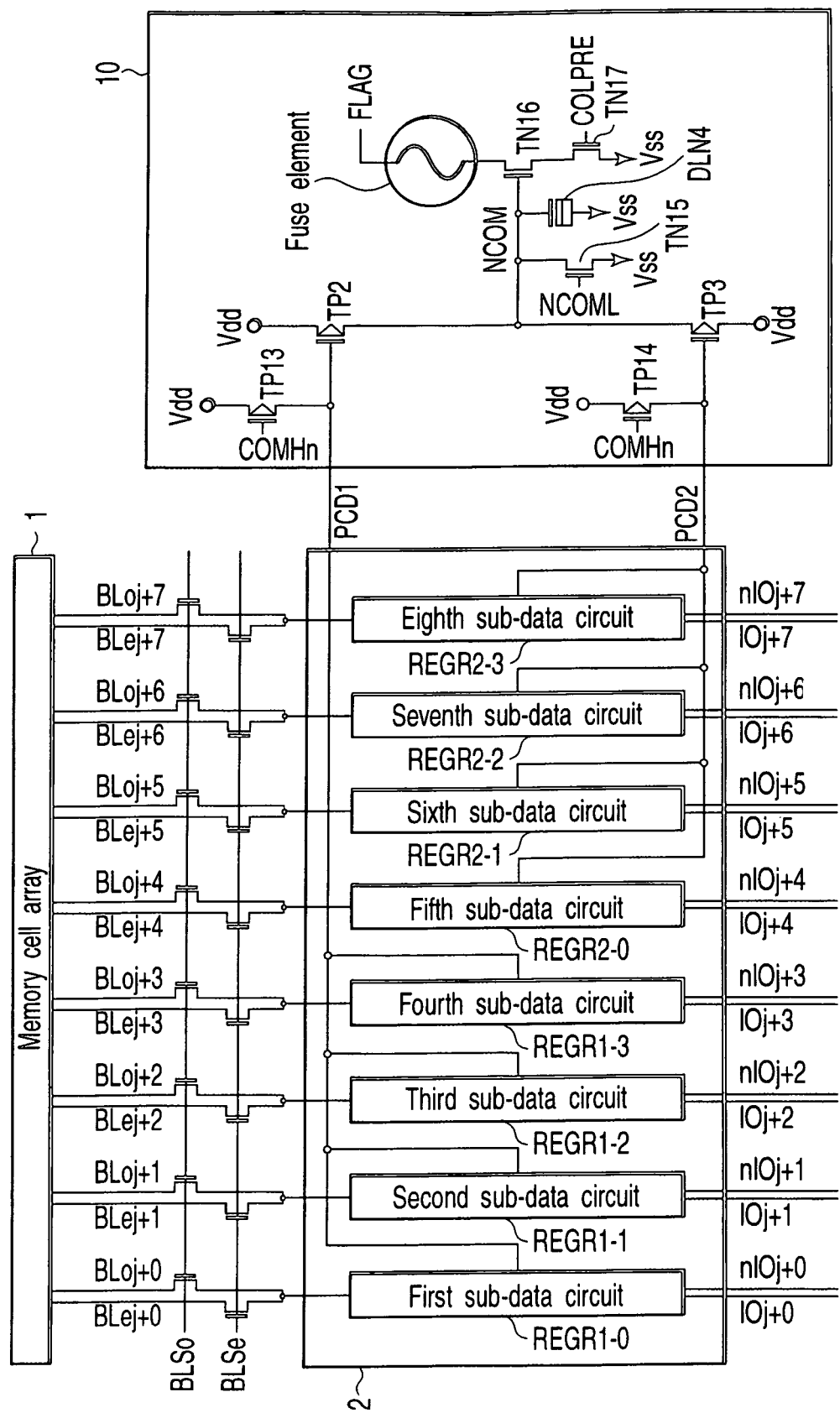
FIG. 36 is a circuit diagram showing an example of a batch detection circuit.

FIG. 36 shows an example of configuration of the batch detection circuit.

The batch detection circuit 10 has a function to check whether or not writing or erasing has been properly performed in all the selected memory cells after a verification reading (completion detection).

As has also been described in connection with the configuration example of the memory cell, the present example is based on the premise that, in the write/read operation, the plurality of even bit lines and the plurality of odd bit lines are driven independently from each other. Therefore, one sub-data circuit is provided for two bit lines including one even bit line and one odd bit line.

More specifically, as the 8512 bit lines BLek, BLok (k=0, 1 . . . 4225) are present, the data circuit 2 is composed of 4256 sub-data circuits. It is to be noted that configuration examples of the sub-data circuits in the data circuit 2 will be described later.

In the present example, only 8 sub-data circuits REGR1-0, REGR1-1, REGR1-2, REGR1-3, REGR2-0, REGR2-1, REGR2-2 and REGR2-3 among the 4256 sub-data circuits are shown.

A sub-data circuit REGR1-$y$ is connected to two bit lines BLej+y and BLoj+y, and also connected to an I/O line pair IOj+y and nIOj+y. Further, a sub-data circuit REGR2-$y$ is connected to two bit lines BLej+y+4 and BLoj+y+4, and also connected to an I/O line pair Ioj+y+4 and nIOj+y+4. However, y=0, 1, 2, 3.

An output node PCD1 of the first to fourth sub-data circuits REGR1-0, REGR1-1, REGR1-2 and REGR1-3 is commonly connected, and the connection node PCD1 is connected to a gate of a P-channel MOS transistor TP2. In the same manner, an output node PCD2 of the fifth to eighth sub-data circuits REGR2-0, REGR2-1, REGR2-2 and REGR2-3 is commonly connected, and the connection node PCD2 is connected to a gate of a P-channel MOS transistor TP3.

P-channel MOS transistors TP13 and TP14 have a function to pre-charge the nodes PCD1 and PCD2 on the basis of a control signal COMHn at the completion detection. In other words, after the control signal COMHn is set to "L" to set the nodes PCD1 and PCD2 to the power supply potential Vdd, the control signal COMHn is set to "L" to bring the nodes PCD1 and PCD2 into a floating state. At this moment, the P-channel MOS transistors TP2 and TP3 are in an off-state.

An N-channel MOS transistor TN15 has a function to bring a node NCOM into a floating state at the completion detection after setting the node NCOM to the ground potential Vss. The MOS transistor TN15 is controlled by a control signal NCOML. A capacitor DLN4 is connected to the node NCOM.

At the completion detection, potential level of the common node PCD1 or the common node PCD2 is lowered from "H" to "L" for the sub-data circuits corresponding to the memory cells in which writing/erasing has not been adequately accomplished.

Therefore, if at least one memory cell is present in which writing/erasing has not been adequately accomplished, the P-channel MOS transistor TP2 or TP3 is in an on-state, and the node NCOM turns from "L" to "H", and then a FLAG turns to "L".

On the other hand, if the writing/erasing has been adequately accomplished in all the memory cells, all the sub-data circuits keep the potential level of the common nodes PCD1 and PCD2 at "H". Therefore, the node NCOM remains at "L", and the FLAG is "H".

In this way, it is possible to check whether or not the writing/erasing has been performed properly in all the selected memory cells by detecting the potential level of the FLAG.

In the present example, eight sub-data circuits are combined into one, and the completion detection, that is, the detection of the potential level of the FPAG is performed for each of the eight sub-data circuits.

The eight sub-data circuits are thus combined into one because the memory cells are replaced by a redundancy circuit in units of eight columns corresponding to the eight sub-data circuits. That is, if a fuse element is blown, the memory cells connected to these eight sub-data circuits are always in an unselected state, and preliminary memory cells in a redundancy area are selected instead.

Therefore, if the memory cells are replaced by the redundancy circuit in units of n columns corresponding to n (n is a natural number) sub-data circuits, the n sub-data circuits are combined into one.

In addition, the FRAG is a common node adapted to all the columns. For example, when the data circuit 2 is composed of 4256 sub-data circuits, 532 circuits as shown in FIG. 36 are present in the chip if the eight sub-data circuits are one unit for redundancy replacement. These 532 circuits are connected to the common node FRAG.

(8) Example of Configuration of Data Circuit

FIG. 37 shows a configuration example of the sub-data circuit in the data circuit.

In the present example, the data circuit is composed of a plurality (e.g., 4256) of sub-data circuits, and each sub-data circuit has a configuration shown in FIG. 37.

A sub-data circuit REGR has three data storage sections PB, LATCH and C1. The data storage sections PB, LATCH and C1 are used to perform a writing or reading operation of 2-bit data in the selected one memory cell.

Furthermore, one sub-data circuit is provided for two bit lines including one even bit line and one odd bit line. The even bit line BLek is connected to the sub-data circuit REGR via an N-channel MOS transistor N1, and the one odd bit line BLok is connected to the sub-data circuit REGR via a via an N-channel MOS transistor N2.

Since the N-channel MOS transistor N1 is in an on-state when the control signal EVENBL is "H" and the control signal ODDBL is "L", the even bit line BLek is electrically connected to the sub-data circuit REGR. Further, since the N-channel MOS transistor N2 is in an on-state when the control signal EVENBL is "L" and the control signal ODDBL is "H", the odd bit line BLok is electrically connected to the sub-data circuit REGR.

In addition, the control signal EVENBL is commonly input to a gate of the MOS transistor N1 connected to the even bit line BLek, and the control signal ODDBL is commonly input to a gate of the MOS transistor N2 connected to the odd bit line BLok.

FIG. 38 shows an example of the sub-data circuit of FIG. 37.

In the present example, the sub-data circuit for one column (corresponding to the two bit lines BLek and BLok) is shown in a manner corresponding to FIG. 37.

The sub-data circuit REGR has the three data storage sections PB, LATCH and C1.

The data storage section C1 includes a depression type N-channel MOS capacitor. The data storage section LATCH includes a CMOS flip-flop circuit comprising two inverters, and the data storage section PB also includes a CMOS flip-flop circuit comprising two inverters. The data storage section PB corresponds to the page buffer PB of FIG. 23.

The MOS capacitor C1 has one end connected to the bit lines BLek and BLok via the N-channel MOS transistors N5, N1 and N2, and the other end connected to the ground point Vss. The N-channel MOS transistor N5 is a transcript transistor to electrically connect/cut off the bit lines BLek and BLok and the sub-data circuit REGR.

The MOS transistor N5 is in an on-state when a control signal BLCLAMP is "H", and for example, the even bit line BLek is electrically connected to the one end of the MOS capacitor C1. At this point, the control signal EVENBL is set to "H", and the control signal ODDBL is set to "L". Moreover, at this point, the control signal EVENBLCU is set to "L", and the control signal ODDBLCU is set to "H", and a bias potential (e.g., ground potential) BLCRL is supplied to the odd bit line BLok.

If the odd bit line BLok is electrically connected to the one end of the MOS capacitor C1, the control signal EVENBL is set to "L", and the control signal ODDBL is set to "H". Moreover, at this point, the control signal EVENBLCU is set to "H", and the control signal ODDBLCU is set to "L", and the bias potential (e.g., ground potential) BLCRL is supplied to the even bit line BLek.

As to a method of supplying the bias potential BLCRL, the control signal EVENBLCU, ODDBLCU or the bias potential BLCRL itself can be controlled to switch, for example, between the high-speed operation mode and the low current consumption mode, as described above (FIG. 18 to FIG. 20).

Since the MOS transistor N5 is in an off-state when the control signal BLCLAMP is "L", the bit lines BLek and BLok and the sub-data circuit REGR are electrically cut off.

An N-channel MOS transistor N6 is connected to the one end of the MOS capacitor C1. The MOS transistor N6 is an element to charge the one end of the MOS capacitor C1 to the pre-charge potential VPRE. When the control signal BLPRE is "H", the one end of the MOS capacitor C1 is charged to the pre-charge potential VPRE.

Here, as to the pre-charge of the bit lines BLek and BLok, the control signal EVENBL, ODDBL or the pre-charge potential VPRE itself can be controlled to switch, for example, between the high-speed operation mode and the low current consumption mode, as described above (FIG. 21 to FIG. 22).

An N-channel MOS transistor N8 is connected to the one end of the MOS capacitor C1 via an N-channel MOS transistor N7. When a control signal REG is "H", that is, when the MOS transistor N7 is in an on-state, the MOS transistor N8 compulsorily turns the potential of the one end of the MOS capacitor C1 to the VREG on the basis of a gate level (data value) thereof.

For example, when the gate level of the MOS transistor N8 is "H", that is, when the data value is "1", the one end of the MOS capacitor C1 is compulsorily set to the VREG if the control signal REG is "H". Moreover, when the gate level of the MOS transistor N8 is "L", that is, when the data value is "0", the potential of the one end of the MOS capacitor C1 is not affected by VREG.

The data storage sections LATCH and PB both include the CMOS flip-flop circuits, as described above.

An N-channel MOS transistor N10 as a switch element is connected between the data storage section C1 and the data storage section LATCH. The MOS transistor N10 is controlled by a control signal BLC1, and used to transfer data between the data storage section C1 and the data storage section LATCH.

An N-channel MOS transistor N9 as a switch element is connected between a gate of the MOS transistor N8 and the data storage section LATCH. The MOS transistor N9 is controlled by a control signal DTG, and used to transfer data stored in the data storage section LATCH to the gate of the MOS transistor N8.

An N-channel MOS transistor N11 as a switch element is connected between the data storage section C1 and the data storage section PB. The MOS transistor N11 is controlled by a control signal BLC2, and used to transfer data between the data storage section C1 and the data storage section PB.

An N-channel MOS transistor N15 is an element to reset data in the data storage section PB. For example, in the writing operation, before the write data is input to the data storage section PB, the MOS transistor N15 sets the state of the data storage section PB into a state retaining "1", that is, sets a node NODE to a "H" state.

The data storage section PB is connected to I/O lines (data lines) IO and nIO via the N-channel MOS transistors N13 and N14 as column selection switches.

Since a column selection signal CSLk (k=0, 1 . . . 4255) is "H" in the column selected by the column address signal, the data storage section PB in the selected column and the I/O lines IO and nIO are electrically connected.

It should be noted that the data storage section PB corresponds to the page buffer PB of FIG. 23. In other words, the characteristics of this storage section PB can be controlled to switch, for example, between the high-speed operation mode and the low current consumption mode.

An N-channel MOS transistor N12 is an element to decide a level of a common node PCD on the basis of the data stored in the data storage section LATCH.

For example, in writing "0", "0" is stored in the data storage section LATCH. In other words, the N-channel MOS transistor N12 is in an on-state, and the level of the common node PCD is turned to "L". In the verification reading, because the read data will be "1" if "0" is properly written into the memory cell, "1" is stored in the data storage section PB. In other words, the N-channel MOS transistor N12 is in an off-state, and the level of the common node PCD is turned to "H".

In the above description, the data includes "0" and "1", and the level of the node includes "L" and "H", wherein "0" corresponds to "L", and "1" corresponds to "H".

Furthermore, in the present example, the two bit lines BLek and BLok are disposed in one column, and one sub-data circuit is connected to the two bit lines BLek and BLok. In this way, the two bit lines BLek and BLok are connected to one sub-data circuit, for such purposes as to (1)

prevent noise from being produced due to a coupling capacitance between adjacent bit lines during reading (apply a technique of shield bit line reading), and (2) reduce the number of data circuits and reduce a chip area.

(9) Example of Configuration of Word Line Control Circuit

Figure 39:
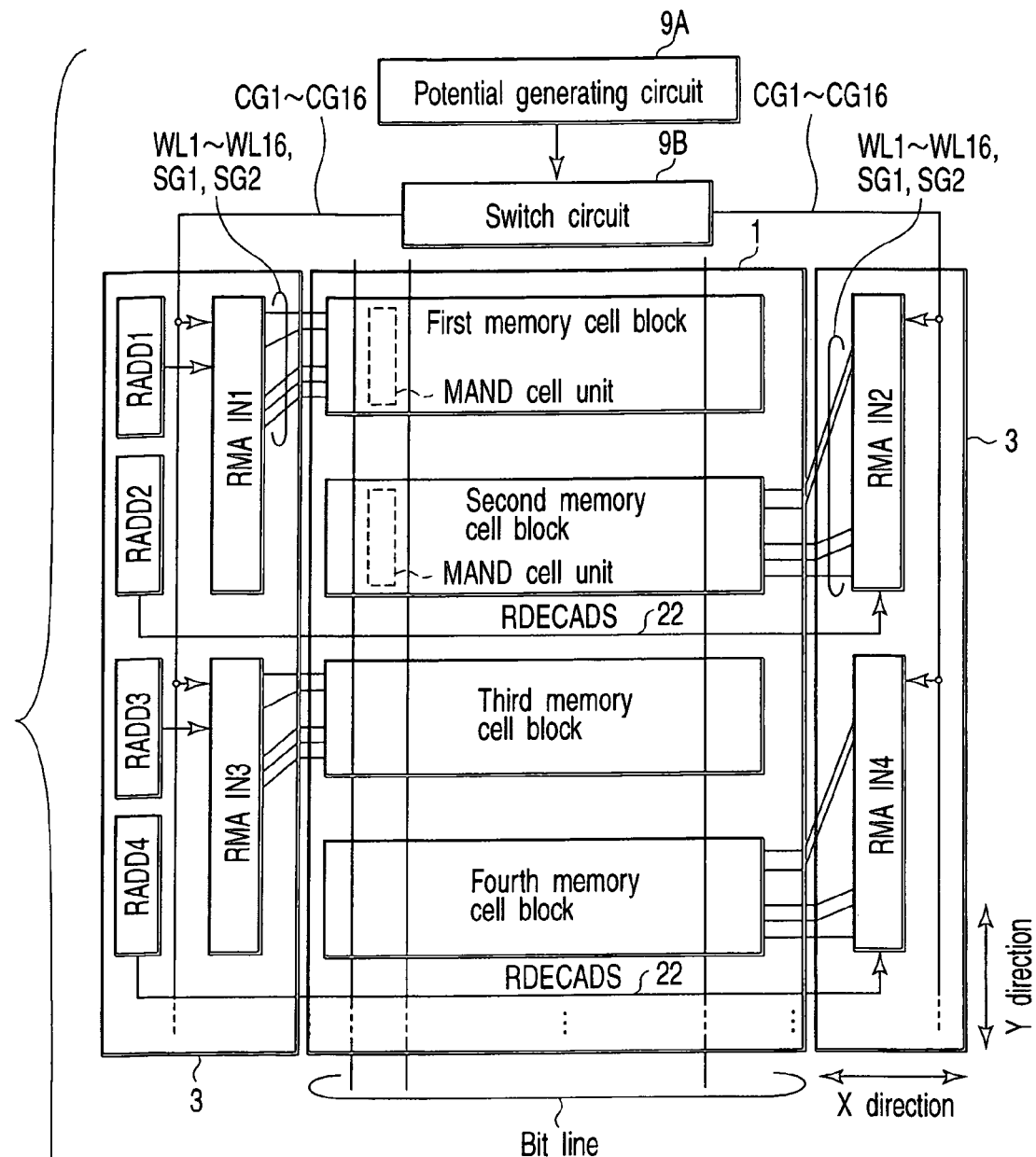
FIG. 39 is a diagram showing an example of a word line control circuit.

FIG. 39 shows a configuration example of the word line control circuit.

The memory cell array 1 is composed of a plurality of memory cell blocks arranged in the Y direction. Each memory cell block has a plurality of NAND cell units arranged in the X direction. Circuit examples of the memory cell array and the NAND cell units are as shown in FIG. 31.

However, the present example is based on the premise that the number of word lines WL1, . . . WL16 in one block is 16, and is different from the example described above (FIG. 31). This is, however, not particularly an important point, so that the description will be simply continued.

In the present example, one row address decoder and one word line driver are provided to correspond to one memory cell block.

For example, the word lines WL1, . . . WL16 and select gate lines SG1 and SGD2 in a first memory cell block are connected to a first word line driver RMAIN1, and the first word line driver RMAIN1 receives an output signal (decoding result) of a first row address decoder RADD1 that decides whether or not to select the first memory cell block.

In this way, the word lines WL1, . . . WL16 and select gate lines SG1 and SGD2 in an i-th (i=1, 2 . . . ) memory cell block are connected to an i-th word line driver RMAINi, and the i-th word line driver RMAINi receives an output signal (decoding result) of an i-th row address decoder RADDi that decides whether or not to select an i-th memory cell block.

Here, the word line drivers are disposed on both sides (two ends in the X direction) of the memory cell array 1 in the present example.

More specifically, the word line drivers RMAIN1, RMAIN3, . . . corresponding to the odd memory cell array blocks are disposed at one (left) of the two ends in the X direction of the memory cell array 1, and the word line drivers RMAIN2, RMAIN4, . . . corresponding to the even memory cell array blocks are disposed at the other (right) of the two ends in the X direction of the memory cell array 1.

Thus, the word line drivers RMAINi can be disposed on both sides of the memory cell array 1 to facilitate the designing of (or to more freely lay out) the word line driver RMAINi. In other words, in the present example, one word line driver can secure a space to lay out two memory cell blocks in the Y direction.

Furthermore, since the word lines WL1, WL16 and the select gate lines SG1 and SG2 in one memory cell block are always driven from one side (or the other side) of the memory cell array 1 by the word line driver corresponding to this memory cell block, there is no difference in timing in supplying drive signals to the memory cells and select transistors in one predetermined NAND cell unit within the selected block.

On the other hand, the row address decoder RADDi (i=1, 2 . . . ) is disposed at only one (one side) of the two ends in the X direction of the memory cell array 1. In this case, because a signal line (address bus) for supplying the row address signal to the row address decoder RADDi may be disposed at only one side of the memory cell array 1, the area of the address bus can be reduced, resulting in a contribution to chip area reduction.

In other words, if the row address decoders RADDi are disposed respectively at the two ends in the X direction of the memory cell array 1 similarly to the word line drivers RMAINi, the address buses also need to be disposed respectively at the two ends in the X direction of the memory cell array 1, which is a disadvantage for the chip area reduction.

As a result of disposing the row address decoder RADDi at only one (one side) of the two ends in the X direction of the memory cell array 1, a signal line 22 is disposed on the memory cell array 1, in the present example. The signal line 22 is used to supply the word line drivers RMAIN2, RMAIN4, . . . with an output signal (decoding result) RDECADS of row address decoders RADD2, RADD4, . . . corresponding to the even memory cell array block.

The signal RDECADS is transmitted to the signal line 22 in an ordinary operation. It is therefore necessary to prevent the potential of the signal line 22 from causing an adverse effect on the operation of the memory cell in the ordinary operation. It should be noted that the row address decoder RADDi and the word line driver RMAINi that prevent the potential of the signal line 22 from causing an adverse effect on the operation of the memory cell will be described later.

The potential generating circuit 9A has the booster circuit (charge pump circuit), and generates, for example, the write potential Vpgm or the transfer potential Vpass used in the writing operation.

The booster circuits, for example, as shown in FIG. 24A, FIG. 24B and FIG. 25 are used so as to perform the mode switch which characterizes the flash memory according to the examples of the present invention.

The potential generating circuit 9A is connected to the switch circuit 9B. The switch circuit 9B allocates the potentials such as the write potential Vpgm, the transfer potential Vpass, the in-chip power supply potential Vdd and the ground potential Vss to signal lines CG1, . . . CG16 corresponding to the word lines WL1, . . . WL16.

The signal lines CG1, . . . CG16 are connected to the word line driver RMAINi. That is, the signal lines CG1, . . . CG16 are connected to the word lines WL1, . . . WL16 via potential transferring transistors HNt1, HNt2, . . . HNt16 (described later) in the word line driver RMAINi.

(10) Circuit Examples of Row Address Decoder and Word Line Driver

The flash memory according to the examples of the present invention can control the characteristics of the row address decoders and the word line drivers to switch the mode. Here, general examples of the configuration of the row address decoders and the word line drivers will be described.

Figure 40:
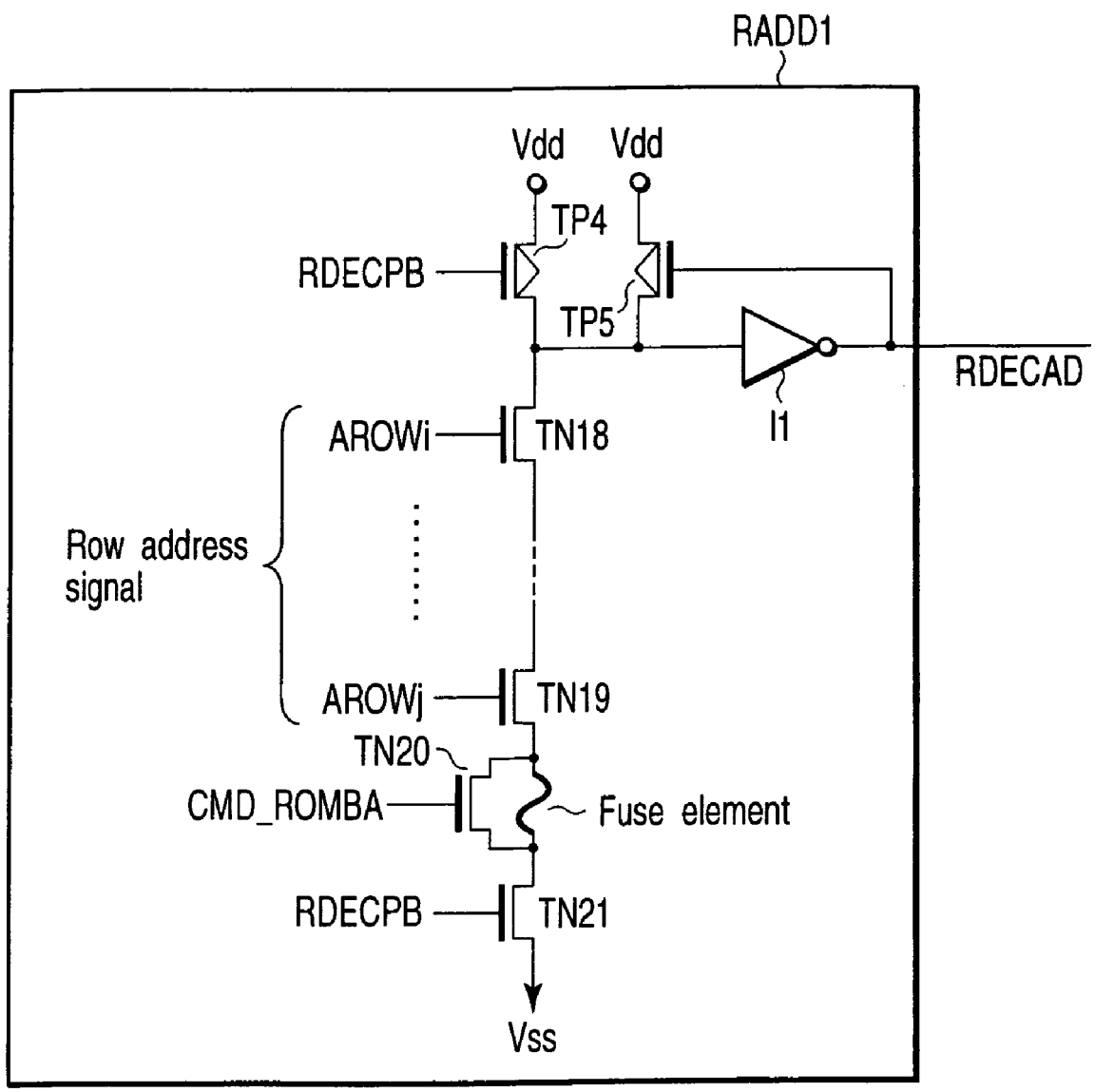
FIG. 40 is a diagram showing a circuit example of a RADD1 of FIG. 39.

FIG. 40 shows main parts of the row address decoder provided to correspond to the odd memory cell block.

Precisely, this row address decoder RADD1 functions as a block decoder. That is, for example, when the first memory cell block is selected, all row address signals AROWi, . . . AROWj are "H", and the output signal RDECAD is "H".

FIG. 41 shows main parts of the word line driver provided to correspond to the odd memory cell block.

Main components of the word line driver RMAIN1 are a high voltage switching circuit 26 and transferring MOS transistors HN5, HN6, HNt1, . . . HNt16.

The high voltage switching circuit 26 comprises a first step-up unit constituted of a MOS capacitor DHN4 and a MOS transistor IHN1, and a second step-up unit constituted of a MOS capacitor DHN5 and a MOS transistor IHN2. In addition, the high voltage switch circuit 26 includes transistors DHN1, DHN2 and DHN3, which are depression type high voltage N-channel MOS transistors.

A gate of a MOS transistor HN3 is connected to a connection node B of the MOS transistors IHN1 and IHN2.

In this case, the potential level of the gate and source of the MOS transistor HN3 synchronizes with a clock signal Owc while keeping a reversed phase, to gradually increase the potential of nodes A, B and TransferG1, thereby enhancing step-up efficiency.

The high voltage switching circuit 26 is in an active state when the output signal RDECAD of the row address decoder RADD1 is "H". That is, when the output signal RDECAD is "H", the output signal of a NAND circuit NAND 1 is a clock signal having a reversed phase to that of the clock signal Owc. The output signal of the NAND circuit NAND 1 is applied to one end of the MOS capacitors GHN4 and GHN5.

As a result, the step-up potential is applied to gates of the transferring MOS transistors HN5, HN6, HNt1, . . . HNt16, and the transferring MOS transistors HN5, HN6, HNt1, . . . HNt16 are in an on-state.

When the output signal RDECAD of the row address decoder RADD1 is "H", MOS transistors HN7 and HN8 are in an off-state. At this point, the signal lines SGD and SGS have, for example, the in-chip power supply potential Vdd, and this Vdd is supplied to the select gate lines SG1 and SGD2 via the transferring MOS transistors HN5 and HN6.

Furthermore, the signal lines CG1, CG2, . . . CG16 are respectively set to predetermined potentials in accordance with the operation mode by the switch circuit 9B (see FIG. 1). Then, the potential of the signal lines CG1, CG2, . . . CG16 is supplied to the word lines WL1, WL2, . . . WL16 via the transferring MOS transistors HNt1, . . . HNt16.

Figure 42:
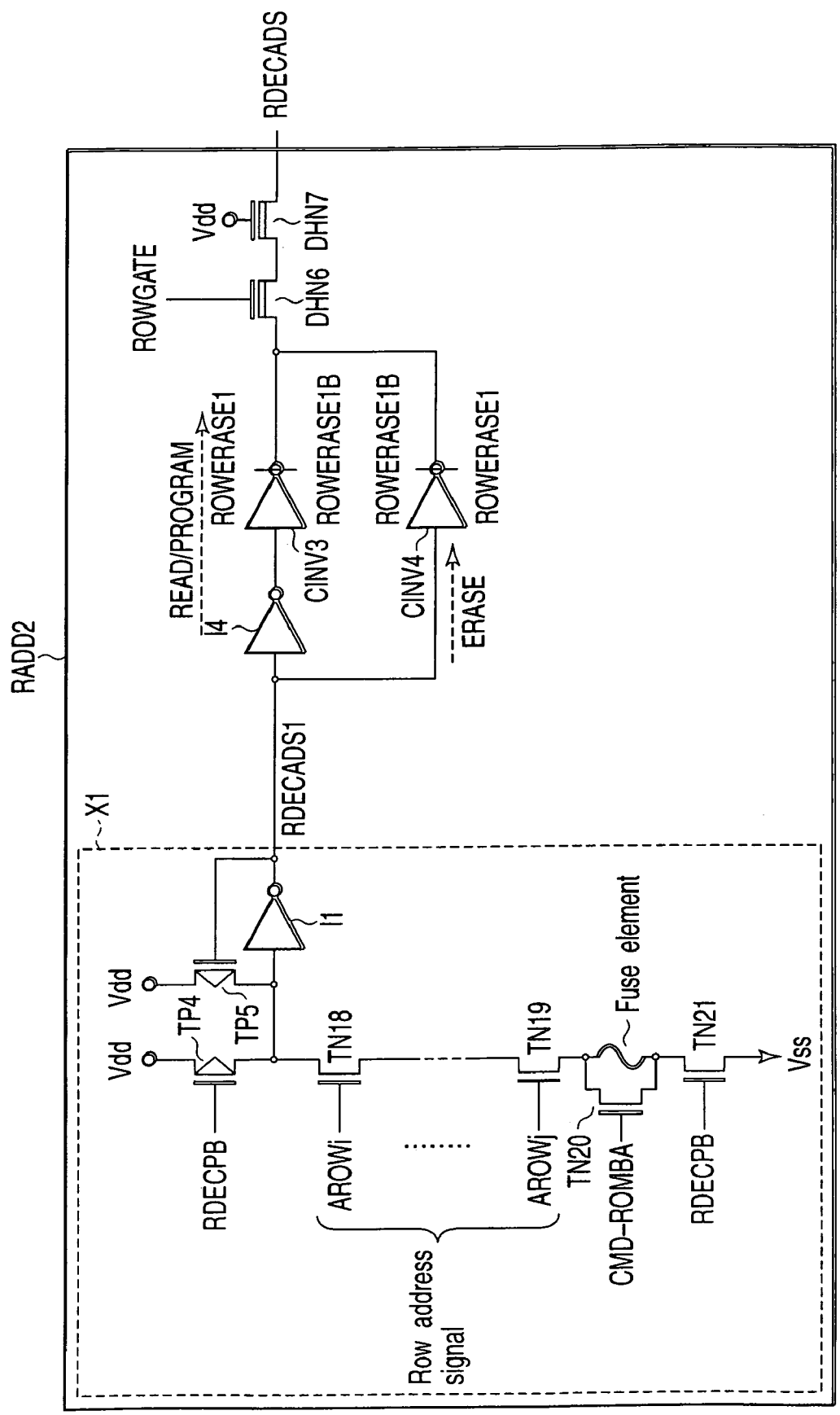
FIG. 42 is a diagram showing a circuit example of a RADD2 of FIG. 39.

FIG. 42 shows main parts of the row address decoder provided to correspond to the even memory cell block.

The row address decoder RADD2 includes the same circuits as the row address decoder RADD1 of FIG. 40. That is, the circuits surrounded by a broken line X1 are the same as those of the row address decoder RADD1 of FIG. 40. It is to be noted that, in FIG. 42, the same symbols are given to the same parts as FIG. 40.

This row address decoder RADD2 has an inverter 14, clocked inverters CINV3 and CINV4, and depression type high voltage N-channel MOS transistors DHN6 and DHN7.

The clocked inverter CINV4 has a function, during erasing, to turn the output signal RDECADS (potential of the signal line 22 in FIG. 39) of the row address decoder corresponding to the selected memory cell block to the ground potential Vss, and to turn the output signal RDEC-ADS of the row address decoder corresponding to the unselected memory cell block to the in-chip power supply potential Vdd.

The MOS transistor DHN6 has a function to bring the signal line 22 (see FIG. 39) into a floating state together with the transistor DHN9 in FIG. 43 which will be described later.

During erasing, a signal RDECADS1 is "H (Vdd)" in the selected memory block, and the signal RDECADS1 is "L (Vss)" in the unselected memory block.

If this signal RDECADS1 is given to the signal line 22 (see FIG. 39) on the memory cell array, the signal line 22 (see FIG. 39) on the memory cell array will be "L (Vss)" in the unselected memory block.

In this case, if an attempt is made to increase the potential of the word line in the unselected memory block when the erase potential Vera is given to a cell well by coupling capacitance of the cell well and the word line, the potential of the word line is not sufficiently increased due to the influence of the signal line 22 (see FIG. 39) which is the ground potential Vss.

In the present example, as the clocked inverter CINV4 is provided, the output signal RDECADS is "L (Vss)" in the selected memory block and the signal RDECADS is "H (Vdd)" in the unselected memory block during erasing.

That is, in the unselected memory block, the signal line 22 (see FIG. 39) on the memory cell array is "H (Vdd)", and is placed in a floating state by cutting off the MOS transistor DHN6 and the MOS transistor DHN9 (FIG. 43).

Therefore, when the potential of the word line in the unselected memory block is increased by the coupling capacitance of the cell well and the word line, the potential of the word line is sufficiently increased owing to a lowered effect of the signal line 22 (FIG. 39) which is the in-chip power supply potential Vdd.

FIG. 43 shows main parts of the word line driver provided to correspond to the even memory cell block.

Among main components of the word line driver RMAIN2, the high voltage switching circuit 26, and the transferring MOS transistors HN5, HN6, HNt1, . . . HNt16 are the same as in the word line driver RMAIN1 shown in FIG. 41. That is, the circuits surrounded by a broken line X2 are about the same as those of the row address decoder RADD1 of FIG. 41. It is to be noted that, in FIG. 43, the same symbols are given to the same parts as FIG. 41.

The word line driver RMAIN2 has clocked inverters CINV5, CINV6 and CINV7, depression type high voltage N-channel MOS transistors DHN8 and DHN9, and enhancement type P-channel MOS transistors TP6 and TP7.

The clocked inverter CINV7 has a function, during erasing, to return the output signal RDECADS (potential of the signal line 22 in FIG. 39) of the row address decoder corresponding to the selected memory cell block from the ground potential Vss to the in-chip power supply potential Vdd, and return the output signal RDECADS of the row address decoder corresponding to the unselected memory cell block from the in-chip power supply potential Vdd to the ground potential Vss, and then give the signal as a signal RDECADS2 to the circuits within the broken line X2.

The MOS transistor DHN9 has a function to bring the signal line 22 (see FIG. 39) into a floating state together with the transistor DHN6 in FIG. 42.

In this way, the inverter 14, the clocked inverters CINV3 and CINV4, and the depression type high voltage N-channel MOS transistors DHN6 and DHN7 that are in the row address decoder RADD2 of FIG. 42, and the clocked inverters CINV5, CINV6 and CINV7, the depression type high voltage N-channel MOS transistors DHN8 and DHN9, and the enhancement type P-channel MOS transistors TP6 and TP7 that are in the word line driver RMAIN2 of FIG. 43 are used as pairs to accomplish the same object.

In addition, these circuits are supplied with the Vdd (in-chip power supply potential lower than an external power supply potential Vcc) as the power supply potential in FIG. 40 to FIG. 43, but, for example, the external power supply potential Vcc may be supplied instead.

(11) Regarding the Potential Level of the Signal Line 22

Next, how the potential level of the signal line 22 (see FIG. 39) will be in each operation mode will be described. It should be noted that only the potential level of the signal line 22 will be described here.

In the present example, the signal line 22 (FIG. 39) connects the word line driver (FIG. 43) to the row address decoder (FIG. 42) corresponding to the even memory cell block. Therefore, the potential level of the word line driver selection signal RDECADS transmitting through the signal line 22 (FIG. 39) will be described referring to FIG. 42 and FIG. 43.

The potential level of the output signal RDECADS of the row address decoder RADD2 differs depending upon the operation mode.

In the operations (writing, reading, verification reading) other than the erase operation, ROWERASE1B, ROWPROG1, ROWERASE2B, ROWERASE3n and ROWGATE are respectively set to the power supply potential Vdd (the in-chip power supply potential lower than the external power supply potential Vcc. However, it may also be the external power supply potential Vcc.), and ROWERASE1, ROWPROG1B and ROWERASE2 are respectively set to the ground potential Vss.

At this point, the clocked inverters CINV3, CINV5 and CINV6 are in an active state, and the clocked inverters CINV4 and CINV7 are in a non-active state. Further, the MOS transistor TP6 is in an off state.

In the selected memory cell block, the output signal RDECADS1 in the part surrounded by the broken line X1 is "H", that is, the in-chip power supply potential Vdd, and the output signal RDECADS of the row address decoder RADD2 is also "H", that is, the in-chip power supply potential Vdd.

On the other hand, in the unselected memory cell block, the output signal RDECADS1 in the part surrounded by the broken line X1 is "L", that is, the ground potential Vss, and the output signal RDECADS of the row address decoder RADD2 is also "L", that is, the ground potential Vss.

Therefore, in the operations other than the erase operation, the signal line 22 (see FIG. 39) disposed on the memory cell array in the unselected memory cell block is the ground potential Vss, and the select gate lines SG1 and SG2 in the unselected memory cell block are also the ground potential Vss, and the signal lines 22, SG1 and SG2 function as shield lines between the bit line and word line. As a result, coupling noise produced in data transmitting through the bit line can be reduced.

In the erase operation, the ROWERASE1B, ROWPROG1, ROWERASE2B, ROWERASE3n and ROWGATE are respectively set to the ground potential Vss, and the ROWERASE1, ROWPROG1B and ROWERASE2 are respectively set to the in-chip power supply potential Vdd (may also be set to the power supply potential Vcc).

At this point, the clocked inverters CINV4 and CINV7 are in an active state, and the clocked inverters CINV3, CINV5 and CINV6 are in a non-active state. Further, the MOS transistor TP6 is in an on state.

In the selected memory cell block, the output signal RDECADS1 in the part surrounded by the broken line X1 is "H", that is, the in-chip power supply potential Vdd, and the output signal RDECADS of the row address decoder RADD2 is "L", that is, the ground potential Vss.

On the other hand, in the unselected memory cell block, the output signal RDECADS1 in the part surrounded by the broken line X1 is "L", that is, the ground potential Vss, and the output signal RDECADS of the row address decoder RADD2 is "H", that is, the in-chip power supply potential Vdd.

Furthermore, as the ROWGATE has the ground potential Vss, the signal line 22 (see FIG. 39) in the unselected memory cell block is placed in a floating state by cutting off the MOS transistors DHN6 and DHN9 if the potential (potential of the RDECADS) is about 1 to 1.5V.

In this way, in the erase operation, the signal line 22 (see FIG. 39) disposed on the memory cell array in the unselected memory cell block is 1 to 1.5V, and in a floating state. In other words, when the erase potential Vera is given to the cell well, the potential of the signal line 22 (FIG. 39) also increases due to the coupling capacitance in the same way as the word line, so that the signal line 22 (FIG. 39) does not prevent the potential of the word line from increasing.

Therefore, it is possible to obtain an effect that the potential of the word line in the unselected memory cell block is easily increased owing to the coupling capacitance between the cell well and the word line when the erase potential Vera is given to the cell well.

In connection with this, since the tunnel oxide film of the memory cell in the unselected memory cell block is not subjected to a large electric field, erroneous erase can be prevented in the unselected memory cell block.

By the way, the fuse element (also the fuse element of FIG. 40) within the broken line X1 of FIG. 42 is not blown when the memory cell block corresponding to the fuse element (row address decoder) is used as an ordinary memory area for a user.

However, when the memory cell block corresponding to the fuse element (row address decoder) is used as, for example, a ROM-BLOCK area to store device codes, the fuse element is blown, so that the user can not freely write/erase data in the ROM-BLOCK area.

This ROM-BLOCK area has the following meanings.

Recently, the NAND-structured flash memories have been used in memories of various electronic devices. However, the NAND-structured flash memory is in some cases used as a memory for data associated with copyright such as a memory for storing music information through a telephone communication.

Therefore, a chip number, that is, a device code is stored in the NAND-structured flash memory in order to prevent illegal copy.

This device code is unique to the individual NAND-structured flash memory, but if the user can freely rewrite this device code, the original purpose of the device code can not be attained.

For this reason, the device code is written into the ROM-BLOCK area of the NAND-structured flash memory before product shipment, so that the user can not write/erase data in the ROM-BLOCK area. In other words, the fuse element is blown in the memory cell block to be the ROM-BLOCK area.

Thus, it is impossible to copy for example when the music information is to be copied from the NAND-structured flash memory at an information providing end to the NAND-structured flash memory at an information receiving end, or when the device code is read from the NAND-structured flash memory at the information providing end, and this device code is different from the device code of the NAND-structured flash memory at the information receiving end.

The fuse element is blown immediately after the device code is programmed into the memory cell block to be the ROM-BLOCK area.

This is because if a pre-shipment test is performed without blowing the fuse element, the device code is erased in this test.

Thus, all the blocks are simultaneously selected to perform writing/erasing to reduce test time in the pre-shipment test. That is, all the row address signals AROWi, . . . AROWj are "H", so that when the fuse element is not blown, the RDECADS1 will be "H", (the RDECAD is "H" in FIG. 40) even if a CMD ROMBA is "L", with the result that the memory cell block to be the ROM-BLOCK area is selected.

On the other hand, in the pre-shipment test, even when all the row address signals AROWi, . . . AROWj are "H", the CMD ROMBA is "L" if the fuse element is blown, so that the RDECADS1 is "L" (the RDECAD is "L" in FIG. 40), and the memory cell block to be the ROM-BLOCK area is not selected.

Even if the fuse element is blown, it is necessary to read the device code stored in the ROM-BLOCK area.

Data can be read from the ROM-BLOCK area by turning the CMD ROMBA to "H". That is, if the CMD ROMBA is "H" and the AROWi, . . . AROWj in the ROM-BLOCK area are "H", the memory cell block to be the ROM-BLOCK area will be selected.

Furthermore, also after the fuse element is blown, a specific command is input to turn the CMD ROMBA and the AROWi, . . . AROWj in the ROM-BLOCK area to "H", whereby the data in the ROM-BLOCK area can be rewritten. In this case, the command to turn the CMD ROMBA to "H" is not open to general users, so that the data in the ROM-BLOCK area can not be rewritten illegally.

In addition, it has been described in the present example that the fuse in the ROM-BLOCK area is blown, but the fuse in FIG. 40 and the fuse within the broken line X1 of FIG. 42 are blown also when the memory cell block is a defective block. In this case, the defective block is replaced with a preliminary block by the redundancy circuit.

3. Description of Basic Operation

The main parts of the flash memory (FIG. 1) according to the examples of the present invention in the operation modes such as write and read, particularly, the operation of the data circuit (FIG. 38) will be described in detail below.

Before describing the operation, a threshold voltage of the memory cell and one example of a writing/reading method will simply be described first.

(1) Threshold Voltage of Memory Cell and Writing/Reading Method

Figure 44:
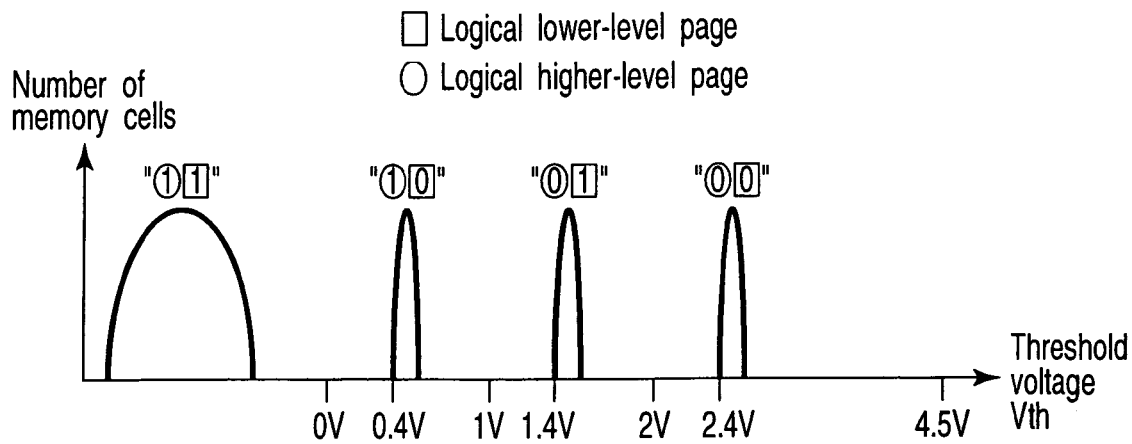
FIG. 44 is a diagram showing a relationship between data in the memory cell and threshold voltage distribution.

FIG. 44 shows threshold voltage (Vth) distributions of the memory cell of a quaternary NAND-structured flash memory.

2-bit data (quaternary data) is stored in one memory cell. In the present example, the 2-bit data includes "11", "10", "01" and "00", as described above. The same memory cell stores 1 bit of 2-bit data as the logical lower-level page data (indicated with an outline square), and the other 1 bit as the logical higher-level page data (indicated with a circle).

The relationship between the 2-bit data ("11", "10", "01" and "00") and the threshold voltage of the memory cell is as shown in FIG. 44.

"11" indicates an erased state. In the erased state, the value of the logical lower-level page data and the value of the logical higher-level page data are both "1". The memory cell in the erased state has a negative threshold voltage Vth.

"10", "01" and "00" indicate a written state. The memory cell in the written state has a positive threshold voltage Vth. Moreover, in the written state, the "10" state has the lowest threshold voltage, the "00" state has the highest threshold voltage, and the "01" state has a threshold voltage between the threshold voltages of the "10" state and the "00" state.

The 2-bit data is composed of theological lower-level page data and the logical higher-level page data as described above, and written into the memory cell by two writing operations.

First, the logical lower-level page data is written.

Figure 45:
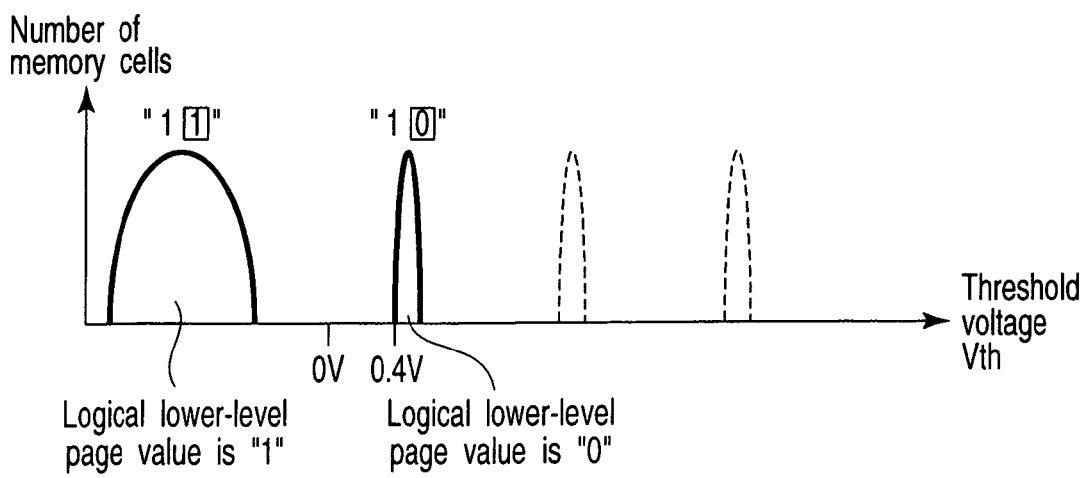
FIG. 45 is a diagram showing how the threshold voltage changes when logical lower-level page data is programmed.

Initially, all the memory cells are in the erased state, that is, in the "11" state. Subsequently, as shown in FIG. 45, if the logical lower-level page data is written, the distribution of the threshold voltage Vth of the memory cell is divided into two in accordance with the value ("1", "0") of the write data (logical lower-level page data).

In other words, if the logical lower-level page data is "1", the bit line is turned to "H" (the word line is turned to the write potential) so that the tunnel oxide film of the memory cell is not subjected to a high electric field, thereby preventing the threshold voltage Vth of the memory cell from increasing. As a result, the memory cell maintains the erased state ("11" state) (the logical lower-level page data "1" is written).

On the other hand, if the logical lower-level page data "0", the bit line is turned to "L" (the word line is turned to the write potential) to apply the high electric field to the tunnel oxide film of the memory cell, and electrons are injected into the floating gate electrode, thereby increasing a predetermined amount of threshold voltage Vth of the memory cell. As a result, the memory cell is changed to the written state ("10" state) (the logical lower-level page data "0" is written).

Subsequently, the logical higher-level page data is written.

The logical higher-level page data is written on the basis of the write data input from the outside of the chip (i.e., the higher-level page data) and the logical lower-level page data already written into the memory cell.

In addition, the logical lower-level page data is read from the memory cell to the data circuit and retained before the logical higher-level page data is written (internal data load).

Figure 46:
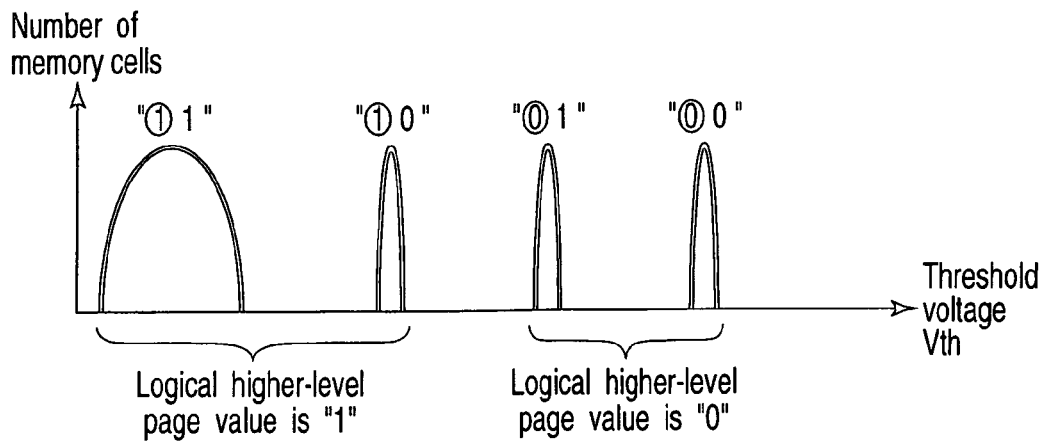
FIG. 46 is a diagram showing how the threshold voltage changes when logical higher-level page data is programmed.

As shown in FIG. 46, when the logical higher-level page data is "1", the bit line is turned to "H" (the word line is turned to the write potential) so that the tunnel oxide film of the memory cell is not subjected to the high electric field, thereby preventing the threshold voltage Vth of the memory cell from increasing. As a result, the memory cell in the "11" state (erased state) in which the logical lower-level page data is "1" maintains the "11" state (the logical higher-level page data "1" is written). Further, the memory cell in the "10" state in which the logical lower-level page data is "0" maintains the "10" state (the logical higher-level page data "1" is written).

On the other hand, as shown in FIG. 46, if the logical higher-level page data is "0", the bit line is turned to "L" to apply the high electric field to the tunnel oxide film of the memory cell, and electrons are injected into the floating gate electrode, thereby increasing a predetermined amount of threshold voltage Vth of the memory cell. As a result, memory cell in the "11" state (erased state) in which the logical lower-level page data is "1" changes to the "01" state (the logical higher-level page data "0" is written). Further, the memory cell in the "10" state in which the logical lower-level page data is "0" changes to the "00" state (the logical higher-level page data "0" is written).

That is, in the present example, "11" is written into the memory cell when the logical lower-level page data is "1" and the logical higher-level page data is "1", and "10" is written into the memory cell when the logical lower-level page data is "0" and the logical higher-level page data is "1". Moreover, "01" is written into the memory cell when the logical lower-level page data is "1" and the logical higher-level page data is "0", and "00" is written into the memory cell when the logical lower-level page data is "0" and the logical higher-level page data is "0".

In this way, the distribution of the threshold voltage Vth of the memory cell is divided into four ("11", "10", "11" and "00") by two writing operations.

In the present example, the memory cell in the "11" state changes to the "01" state when the logical higher-level page data is "0", and the memory cell in the "10" state changes to the "00" state (see FIG. 46).

In addition, in FIG. 44, a Vcgv10 is the read potential used for the verification reading of "10", and is, for example, 0.4V. A Vcgv01 is the read potential (e.g., 1.4V) used for the verification reading of "01", and a Vcgv00 is the read potential (e.g., 2.4V) used for the verification reading of "00". A Vread is the transfer potential given to the unselected word line.

The data in the memory cell is "11" if the threshold voltage of the memory cell is below Vcgr10. The data in the memory cell is "10" if the threshold voltage of the memory cell exceeds Vcgr10 and is below the Vcgv01. The data in the memory cell is "01" if the threshold voltage of the memory cell exceeds Vcgr01 and is below Vcgr00. The data in the memory cell is "00" if the threshold voltage of the memory cell exceeds Vcgr00.

Ordinary reading of the logical lower-level page data can be achieved by, for example, two reading operations ("READ 00", "READ 10"). The READ 00 means a reading operation using Vcgr00 (e.g., 2V) as the read potential, and the READ 10 means a reading operation using Vcgr10 (e.g., 0V) as the read potential. Moreover, reading of the logical higher-level page data can be achieved by, for example, one reading operation ("READ 01"). The READ 01 means a reading operation using Vcgr01 (e.g., 1V) as the read potential.

As described above, in the present example, the 2-bit data can be read by a total of three reading operations, and it is thus possible to reduce reading time or increase the spread of the reading operation.

(2) Write, Erase and Read Operations

Specific examples of the write, erase and read operations will be described below.

Table 2 and Table 3 show the potentials of the parts in the flash memory in erase, write, read and write verification.

where BLe indicates the even bit line, BLo indicates the odd bit line, SGD indicates the select gate line of the drain side (bit line side) select gate transistor, SGS indicates the select gate line of the source side (source line side) select gate transistor, and WL1, WL2, WL3 and WL4 indicate the word lines, C-source indicates the source line, and C-p-well indicates the well (cell p-well) in which the memory cell is formed.

Furthermore, in the present example, the word line WL2 and the even bit line BLe are selected during writing/reading.

In an initial state, the memory cell is in the "11" state. Further, in the erasing operation, the cell p-well C-p-well is set at 20V, and all the word lines WL0, WL1, WL2 and WL3 in the selected block are set at 0V, whereby electrons are discharged from the floating gate in the memory cell within the selected block, and the memory cell will be in the "11" state.

Here, in the erasing operation, the word line within the unselected block, all the bit lines and control gate lines, and the source line are brought into a floating state. Therefore, the potentials of these conductive lines increase to about 20V due to coupling capacitance with the cell p-well C-p-well.

Writing is performed by giving a voltage of 14V to 20V to the selected word line WL2 as the write potential Vpgm. As the selected bit line BLe is set to 0V, electrons are injected into the floating gate electrode and the threshold value rapidly increases in the selected memory cell connected to the selected word line WL2 and bit line BLe (first step writing).

When the threshold value of the selected memory cell has risen to the vicinity of a targeted value, the selected bit line BLe is increased to about 0.4V so as to reduce an increasing

TABLE 2

|  | Erasure | First step writing | Second step writing | Write protect | 10 reading | 01 reading | 00 reading |
|---|---|---|---|---|---|---|---|
| BLe | Floating | 0 V | 0.4 V | Vdd | H or L | H or L | H or L |
| BLo | Floating | Vdd | Vdd | Vdd | 0 V | 0 V | 0 V |
| SGD | Floating | Vdd | Vdd | Vdd | 4.5 V | 4.5 V | 4.5 V |
| WL3 | 0 V | 10 V | 10 V | 10 V | 4.5 V | 4.5 V | 4.5 V |
| WL2 | 0 V | Vpgm | Vpgm | Vpgm | 0 V | 1 V | 2 V |
| WL1 | 0 V | 0 V | 0 V | 0 V | 4.5 V | 4.5 V | 4.5 V |
| WL0 | 0 V | 10 V | 10 V | 10 V | 4.5 V | 4.5 V | 4.5 V |
| SGS | Floating | 0 V | 0 V | 0 V | 4.5 V | 4.5 V | 4.5 V |
| C-source | Floating | 0 V | 0 V | 0 V | 0 V | 0 V | 0 V |
| C-p-well | 20 V | 0 V | 0 V | 0 V | 0 V | 0 V | 0 V |

TABLE 3

|  | 10 first step write verification | 10 second step write verification | 01 first step write verification | 01 second step write verification | 00 first step write verification | 00 second step write verification |
|---|---|---|---|---|---|---|
| BLe | H or L | H or L | H or L | H or L | H or L | H or L |
| BLo | 0 V | 0 V | 0 V | 0 V | 0 V | 0 V |
| SGD | 4.5 V | 4.5 V | 4.5 V | 4.5 V | 4.5 V | 4.5 V |
| WL3 | 4.5 V | 4.5 V | 4.5 V | 4.5 V | 4.5 V | 4.5 V |
| WL2 | 0.2 V | 0.4 V | 1.2 V | 1.4 V | 2.2 V | 2.4 V |
| WL1 | 4.5 V | 4.5 V | 4.5 V | 4.5 V | 4.5 V | 4.5 V |
| WL0 | 4.5 V | 4.5 V | 4.5 V | 4.5 V | 4.5 V | 4.5 V |
| SGS | 4.5 V | 4.5 V | 4.5 V | 4.5 V | 4.5 V | 4.5 V |
| C-source | 0 V | 0 V | 0 V | 0 V | 0 V | 0 V |
| C-p-well | 0 V | 0 V | 0 V | 0 V | 0 V | 0 V | speed of the threshold value to retain the threshold value of the selected memory cell in the vicinity of the targeted value (second step writing).

In the unselected memory cell, the bit line BLe is set to the power supply potential Vdd (e.g., 3V) to prohibit the increase of the threshold value (write protect).

Reading is performed by giving a voltage of 0V, 1V or 2V (see FIG. 44) as the read potential to the selected word line WL2.

At this point, if the threshold value of the selected memory cell is below the read potential, the bit line BLe and the common source line C-source cause a short-circuit, and the potential of the bit line BLe will be on the low level "L". On the contrary, if the threshold value of the selected memory cell has exceeded the read potential, the potential of the bit line BLe will be on the high level "H" because the bit line BLe and the common source line C-source are not conductive.

It is possible to judge whether the memory cell is in the "11" state, or in the "10" state or "01" state or "00" state by setting the read potential to 0V (10 reading). Further, it is possible to judge whether the memory cell is in the "11" state or "10" state, or in the "01" state or "00" state by setting the read potential to 1V (01 reading). Still further, it is possible to judge whether the memory cell is in the "11" state, in the "10" state or "01" state, or in the "00" state by setting the read potential to 2V (00 reading).

The lower limit of threshold distribution of the memory cell in the "10" state is set to a value of 0.4V or higher, or 0.4V in the present example, so that, for example, a read potential of 0V in the 10 reading has a reading margin of 0.4V or higher. Whether or not the threshold values of all the memory cells in the "10" state are 0.4V or higher is verified by 10 write verification. Then, in the memory cell in which the threshold value has reached 0.4V, writing is prohibited to prohibit the increase of the threshold value.

In the same manner, the lower limit of threshold distribution of the memory cell in the "01" state is set to a value of 1.4V or higher, or 1.4V in the present example, so that, for example, a read potential of 1V in the 01 reading has a reading margin of 0.4V or higher. Whether or not the threshold values of all the memory cells in the "01" state are 1.4V or higher is verified by 01 write verification. Then, in the memory cell in which the threshold value has reached 1.4V, writing is prohibited to prohibit the increase of the threshold value.

Furthermore, the lower limit of threshold distribution of the memory cell in the "00" state is set to a value of 2.4V or higher, or 2.4V in the present example, so that, for example, a read potential of 2V in the 00 reading has a reading margin of 0.4V or higher. Whether or not the threshold values of all the memory cells in the "00" state are 2.4V or higher is verified by 00 write verification. Then, in the memory cell in which the threshold value has reached 2.4V, writing is prohibited to prohibit the increase of the threshold value.

Write verification is performed by giving the Vcgv10 (=0.4V), the Vcgv01 (=1.4V), the Vcgv00 (=2.4V) to the selected word line WL2 as the read verification potential.

Here, two-step write verification is effective to narrow the width of threshold distribution. The two-step write verification is a verification in which two kinds of verification potentials including a regular value and a value lower than the regular value are prepared, and the two kinds of verification potentials are used to perform the write verification.

For example, in the 10 write verification, first, a voltage of 0.2V is given to the selected word line WL2 as the verification potential Vcgv10, and a 10 first step write verification is performed. Then, in the memory cell in which the 10 first step write verification has been completed, a voltage of 0.4V is individually given as the verification potential Vcgv10, and a 10 second step write verification is performed.

In the same manner, in the 01 write verification, a voltage of 1.2V (01 first step write verification) and a voltage of 1.4V (01 second step write verification) are used as the verification potential Vcgv01, and in the 00 write verification, a voltage of 2.2V (00 first step write verification) and a voltage of 2.4V (00 second step write verification) are used as the verification potential Vcgv00.

If the threshold value of the memory cell has not reached the verification potential, the bit line BLe and the common source line C-source cause a short-circuit, and the potential of the bit line BLe will therefore be on the low level "L". If the threshold value of the memory cell has exceeded the verification potential, the potential of the bit line BLe will be on the high level "H" because the bit line BLe and the common source line C-source are not conductive.

(3) Writing and Threshold Value Control

In a multi-level flash memory, one memory cell stores n-bit (n is plural) or 2-n-value data. It is therefore desirable that the threshold distribution of the memory cell be sharp and narrow. Therefore, a writing and threshold value control method to obtain such a sharp and narrow threshold distribution will be described below.

Figure 47:
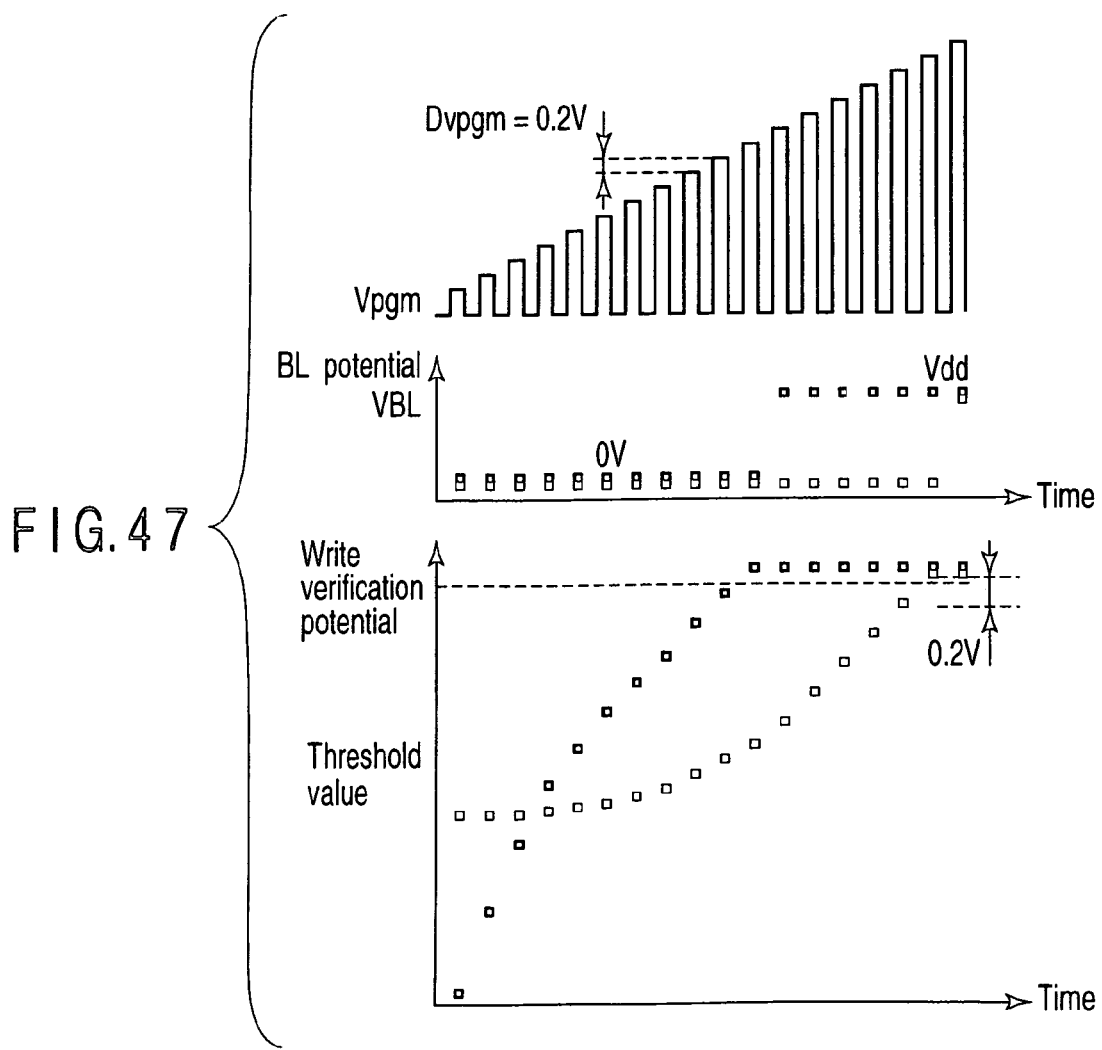
FIG. 47 is a diagram showing a first example of a writing and threshold value control method.

FIG. 47 shows a first example of the writing and threshold value control method.

Outline squares indicate how the threshold value changes in writing into an easily written memory cell, and black squares indicate how the threshold value changes in writing into a not-easily-written memory cell.

These two memory cells belong to the same page, and store the same data. For example, these two memory cells are both in the erased state ("11" state), and have a negative threshold value.

The write potential Vpgm is stepped up from an initial value at a fixed rate Dvpgm (e.g., 0.2V). The write potential Vpgm is applied as a pulse signal (write pulse) to the memory cell, and its degree (write potential Vpgm) is increased every time the pulse signal is given to the memory cell.

If a voltage of 0V is given to the bit line connected to the memory cell targeted for writing, the threshold value of the memory cell increases at the same increase rate (0.2V/pulse) as that of the write potential Vpgm after several pulse signals are given.

The write verification is performed after writing is performed by use of the pulse signals. In the write verification, for the memory cell in which the threshold value has reached the verification potential, the potential of the bit line connected thereto is set to the Vdd (power supply potential). That is, whether or not the writing is completed is verified in each memory cell, and the memory cells completed with the writing are individually set to the write protect state.

According to such a writing and threshold value control method, the width of threshold distribution can be restricted to about the same degree as the increase rate of threshold value per pulse, that is, 0.2V.

Figure 48:
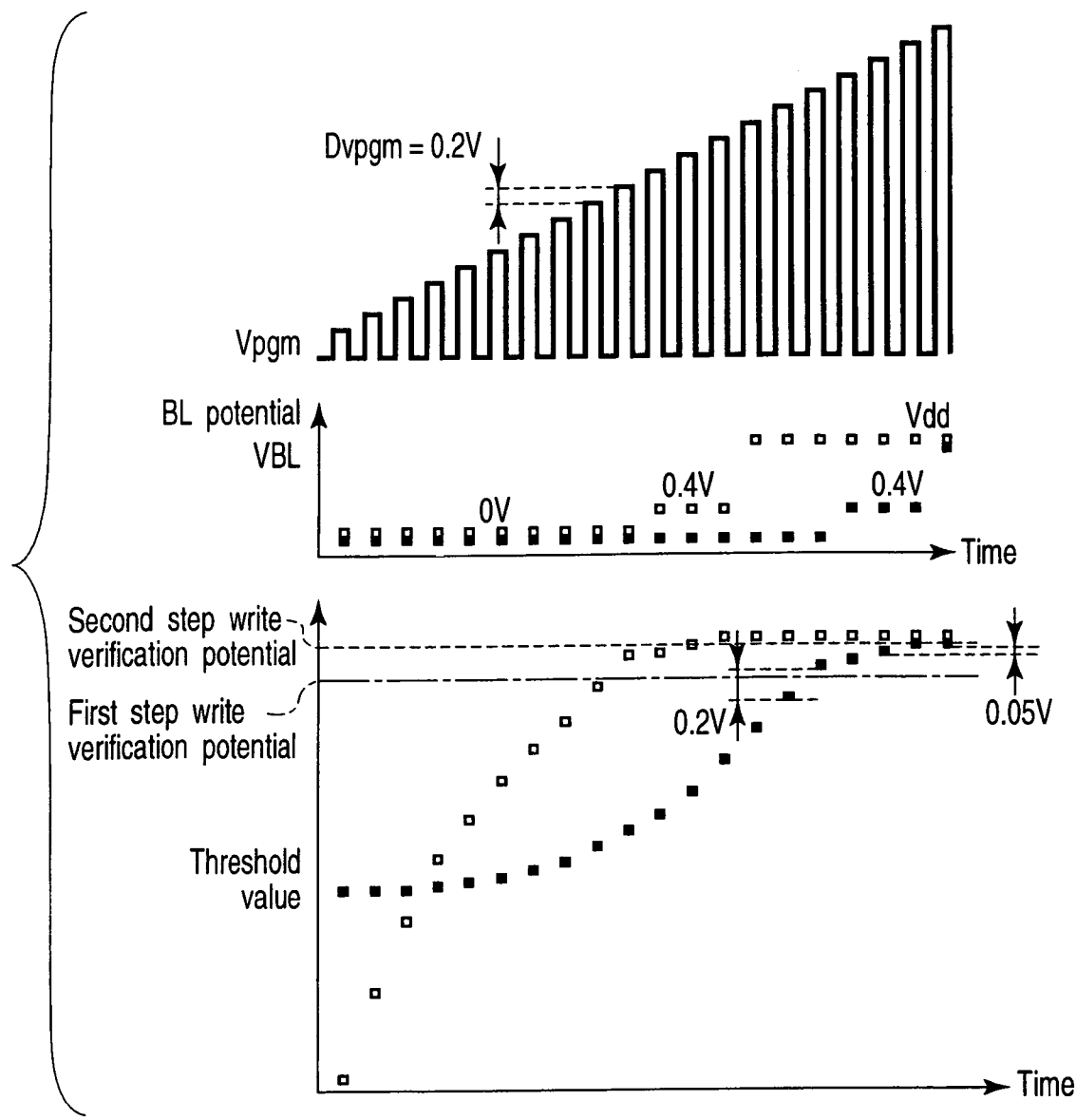
FIG. 48 is a diagram showing a second example of the writing and threshold value control method.

FIG. 48 shows a second example of the writing and threshold value control method.

Outline squares indicate how the threshold value changes in writing into the easily written memory cell, and black squares indicate how the threshold value changes in writing into the not-easily-written memory cell.

These two memory cells belong to the same page, and store the same data. For example, these two memory cells are both in the erased state ("11" state), and have a negative threshold value.

The write potential Vpgm is stepped up from the initial value at the fixed rate Dvpgm (e.g., 0.2V). The write potential Vpgm is applied as the pulse signal to the memory cell, and its degree (write potential Vpgm) is increased every time the pulse signal is given to the memory cell.

If a voltage of 0V is given to the bit line connected to the memory cell targeted for writing, the threshold value of the memory cell increases at the same increase rate (0.2V/pulse) as that of the write potential Vpgm after several pulse signals are given.

The first step write verification and second step write verification are performed after the writing is performed by use of the pulse signals.

In the first step write verification, for the memory cell in which the threshold value has reached the write verification potential, the potential of the bit line connected thereto is set to 0.4V. For the memory cell in which the first step write verification is finished, the second step write verification is subsequently performed in each memory cell. In the second step write verification, for the memory cell in which the threshold value has reached the write verification potential, the potential of the bit line connected thereto is set to, for example, the Vdd (power supply potential). For the memory cell in which the second step write verification is finished, writing is prohibited in each memory cell.

In the second step write verification, the increase rate of threshold value attained by giving one pulse signal is about 0V/pulse to 0.05V/pulse.

Therefore, according to such a writing and threshold value control method, the width of threshold distribution can be restricted to about the same degree as the increase rate of threshold value per pulse in the second step write verification, that is, to 0.05V.

By the way, if the width of the pulse signal is 20 μsec and time required for one write verification is 5 μsec, write time in the first example of FIG. 47 will be (20 μsec+5 μsec)×18 pulses=450 μsec.

However, in the first example, the increase rate of the write potential Vpgm must be reduced from 0.2V/pulse to 0.05V/pulse (quarter of 0.2V) in order to achieve a threshold value width of 0.05V. This means that the number of pulse signals needed before the completion of writing quadruples.

Therefore, the write time will be

450 μm×4=1800 μsec.

On the other hand, according to the second example of FIG. 48, a threshold value width of 0.05V can be achieved while the increase rate of the write potential Vpgm is kept at 0.2V/pulse.

The write time in this case will be (20 μsec+5 μsec+5 μsec)×20 pulses=600 μsec.

In this way, the write time needed to achieve a threshold value width of 0.05V under the same condition can be significantly reduced to one-third in the second example, as compared to the first example.

(4) Method of Controlling Writing into Lower-Level Page and Threshold Value

The write verification potential of FIG. 47 is set to the Vcgv10 (=0.4V) to set the first step write verification potential of FIG. 48 to the Vcgv10 (=0.2V), and the second step write verification potential of FIG. 48 is set to the Vcgv10 (=0.4V) to perform 10 writing, that is, to write "0" into the lower-level page.

The "11" state is maintained in the memory cell which is not targeted for writing, in other words, in the memory cell into which "1" is written as the lower-level page data.

(5) Method of Controlling Writing into Higher-Level Page and Threshold Value

FIG. 49 shows an example of the method of writing into the higher-level page and controlling.

Outline squares indicate how the threshold value changes in writing into the easily written memory cell, and black squares indicate how the threshold value changes in writing into the not-easily-written memory cell.

Furthermore, the memory cell indicated by the outline squares is in the erased state, that is, the "11" state having a negative threshold value at the time when the writing of the lower-level page data is finished, and the memory cell changes from the "11" state to the "01" state when the higher-level page data "0" is written. In addition, the threshold value is not changed and the "11" state is maintained in the memory cell which is not targeted for "0" writing.

The memory cell indicated by the black squares is in the "10" state at the time when the writing of the lower-level page data is finished, and the memory cell changes from the "10" state to the "00" state when the higher-level page data "0" is written. In addition, the threshold value is not changed and the "10" state is maintained in the memory cell which is not targeted for "0" writing.

The write potential Vpgm is stepped up from the initial value at the fixed rate Dvpgm (e.g., 0.2V). The write potential Vpgm is applied as the pulse signal to the memory cell, and its degree (write potential Vpgm) is increased every time the pulse signal is given to the memory cell.

If a voltage of 0V is given to the bit line connected to the memory cell targeted for writing, the threshold value of the memory cell increases at the same increase rate (0.2V/pulse) as that of the write potential Vpgm after several pulse signals are given.

The 01 first step write verification and 01 second step write verification are performed after the writing is performed by use of the pulse signals, and then, the 00 first step write verification and 00 second step write verification are performed.

In the 01 first step write verification, when the threshold value of the memory cell indicated by the outline squares reaches the write verification potential, the potential of the bit line connected thereto is set to 0.4V. For the memory cell in which the 01 first step write verification is finished, the 01 second step write verification is subsequently performed in each memory cell.

Furthermore, in the 00 first step write verification, when the threshold value of the memory cell indicated by the black squares reaches the write verification potential, the potential of the bit line connected thereto is set to 0.4V. For the memory cell in which the 00 first step write verification is finished, the 00 second step write verification is subsequently performed in each memory cell.

In the 01 second step write verification, when the threshold value of the memory cell indicated by the outline squares reaches the write verification potential, the potential of the bit line connected thereto is set to the Vdd (power supply potential). For the memory cell in which the 01 second step write verification is finished, writing is prohibited in each memory cell.

Furthermore, in the 00 second step write verification, when the threshold value of the memory cell indicated by the black squares reaches the write verification potential, the potential of the bit line connected thereto is set to the Vdd (power supply potential). For the memory cell in which the 00 second step write verification is finished, writing is prohibited in each memory cell.

Regarding both the memory cell of the outline squares and the memory cell of the black squares, in the second step write verification, the increase rate of threshold value attained by giving one pulse signal is about 0V/pulse to 0.05V/pulse.

Therefore, according to such a writing and threshold value control method, the width of threshold distribution can be restricted to about the same degree as the increase rate of threshold value per pulse in the second step write verification, that is, to 0.05V.

(6) Operating Waveform in Writing Lower-Level Page Data

FIG. 50 shows operating waveforms in writing the lower-level page data.

A write step continues from time tp0 to time tp7, and during this period, the pulse signal (write pulse) is given to the memory cell. The 10 first step write verification continues from time tfv0 to time tfv6, and the 10 second step write verification continues from time tsv0 to time tsv6.

This waveform chart shows an example in which the word line WL2 and the even bit line BLe are selected.

In the write step, the selected bit line BLe is set to 0V in the case of a write control potential, that is, the first step writing. The selected bit line BLe is set to 0.4V in the case of the second step writing. The selected bit line BLe is set to the Vdd (e.g., 2.5V) in the case of the write protect state.

In the 10 first and second step write verifications, first, the selected bit line BLe is charged to 0.7V. Subsequently, when the selected word line WL2 reaches a write verification potential (0.2 or 0.4V), the potential of the selected bit line BLe changes in the following manner in accordance with the threshold value of the memory cell.

When the threshold value of the memory cell has reached the write verification potential (0.2 or 0.4V), the bit line BLe maintains 0.7V, and when the threshold value of the memory cell has not reached the write verification potential, the potential of the bit line BLe gradually decreases from 0.7V toward 0V.

If the potential of the bit line BLe is detected at the time of tfv4, tsv4, it is possible to detect whether or not the threshold value of the memory cell has reached the write verification potential. If the threshold value of the memory cell has reached the write verification potential, a detection result is "pass".

In the first example (e.g., see FIG. 1) of the present invention, the mode is switched between the low current consumption mode and the high-speed operation mode.

Here, for example, the flash memory is operated with the operating waveform as shown in FIG. 50 in the high-speed operation mode.

Furthermore, as the bit line needs to be charged slower in the low current consumption mode than, for example, in the high-speed operation mode, the period from time tp1 to time tp2 is set longer than in the example of FIG. 50. In this case, the period from time tfv1 to time tfv2 and the period from time tsv1 to time tsv2 are also set longer for the first and second step write verifications.

Furthermore, as the speed to increase the potential of the word line to the step-up potential needs to be slower in the low current consumption mode than, for example, in the high-speed operation mode, the period from time tp2 to time tp4 is set longer than in the example of FIG. 50. In this case, the period from time tfv2 to time tfv4 and the period from time tsv2 to time tsv4 are also set longer for the first and second step write verifications.

(7) Algorithm of Writing Lower-Level Page Data

Figure 51:
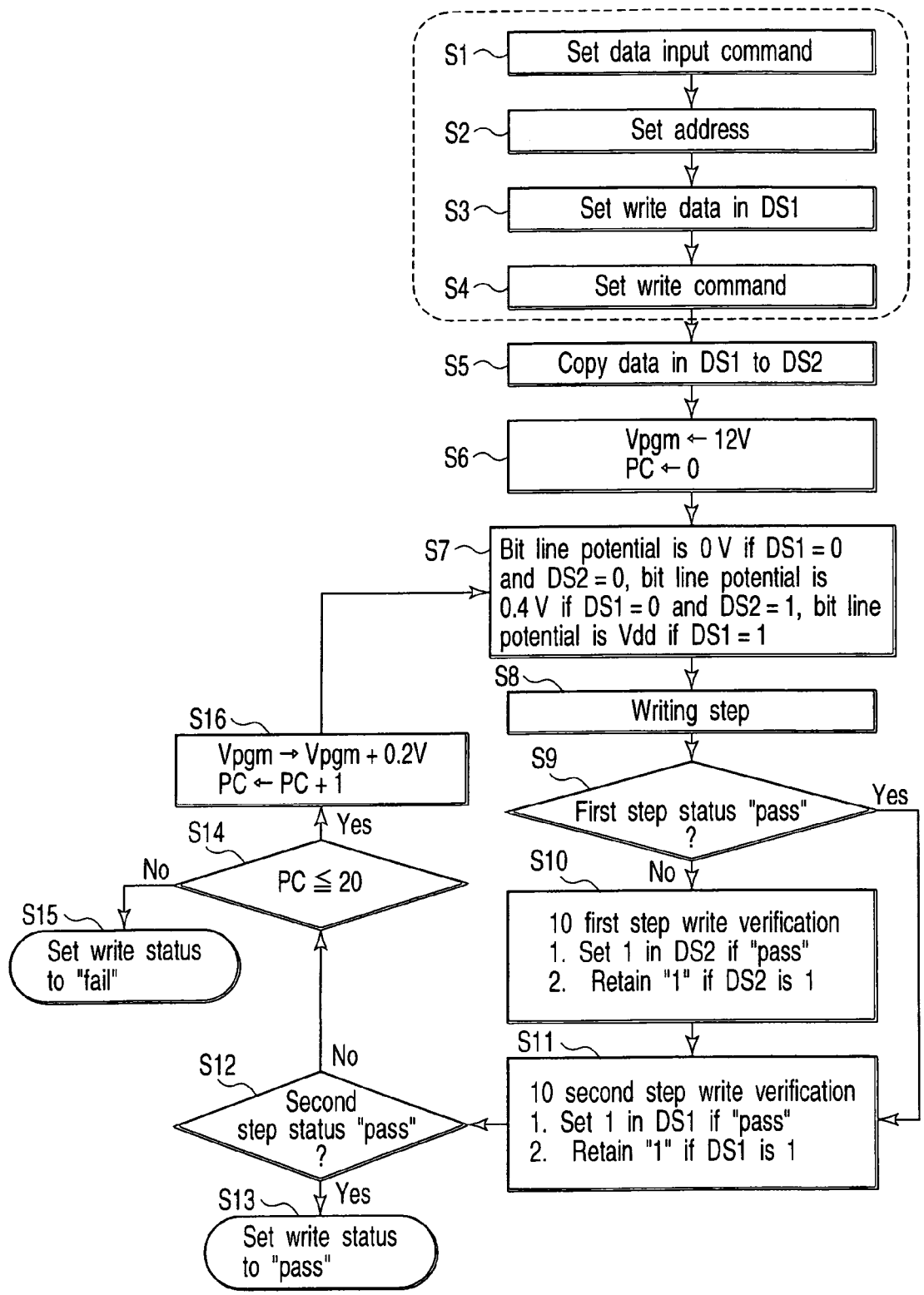
FIG. 51 is a diagram showing an algorithm of writing the lower-level-page data.

FIG. 51 shows an algorithm of writing the lower-level page data.

Here, DS1, DS2 and DS3 indicate the storage circuits disposed in the data circuit, and for example, the DS1 corresponds to the page buffer PB in FIG. 38, the DS2 corresponds to the latch circuit LATCH in FIG. 38, and the DS3 corresponds to the MOS capacitor C1 in FIG. 38. Moreover, PC stands for a program cycle, that is, the number of writing.

First, when a data input command is received from the host microcomputer, the data input command is set in the state machine (step S1). Further, when address data is received from the host microcomputer, an address for selecting a write page is set in the state machine (step S2).

Next, when a one-page amount of write data is received, the write data is stored in the storage circuit DS1 in the data circuit, and the write data is set (step S3). Subsequently, when a write command issued by the host microcomputer is received, the write command is set in the state machine (step S4).

When the write command is set, the state machine automatically executes the following steps S5 to S16.

First, data in the storage circuit DS1 is copied to the storage circuit DS2 (step S5). Subsequently, the initial value of the write potential Vpgm is set to about 12V, and the count number PC of a write counter is set to "0" (step S6)

If the data in the storage circuit DS1 and the data in the storage circuit DS2 are both "0", it means the first step writing, so that 0V which is the write control potential is given to the selected bit line. Further, if the data in the storage circuit DS1 is "0" and the data in the storage circuit DS2 is "1", it means the second step writing, so that 0.4V is given to the selected bit line as the write control potential.

Furthermore, if the data in the storage circuit DS1 and the data in the storage circuit DS2 are both "1", it means the write protect, so that the Vdd is given to the selected bit line as the write control potential (step S7).

Thus, writing is performed into the one-page amount memory cells by use of the write potential Vpgm and the write control potential given to the bit line (step S8).

Furthermore, whether or not all the data in the storage circuit DS2 in one page is "1" is detected by the 10 first step write verification, and if all is "1", the first step writing (status) is given "pass", and from next time, the 10 second step write verification is performed (steps S9, S10, S11).

On the other hand, if all the data in the storage circuit DS2 in one page is not "1", the first step writing (status) is not given "pass".

If the first step writing is not given "pass", the 10 first step write verification is performed (step S10). At this point, the data in the storage circuit DS2, which corresponds to the memory cell in which the detection result is "pass" among the one-page amount memory cells, changes from "0" to "1". Subsequently, the storage circuit DS2 storing "1" keeps holding "1".

If the first step writing is given "pass", or if the 10 first step write verification is finished, the 10 second step write verification is performed (step S11). At this point, the data in the storage circuit DS1, which corresponds to the memory cell in which the detection result is "pass" among the one-page amount memory cells, changes from "0" to "1". Subsequently, the storage circuit DS1 storing "1" keeps holding "1".

After the 10 first step write verification, whether or not all the data in the storage circuit DS1 in one page is "1" is detected by the 10 second step write verification, and if all is "1", the second step writing (status) is given "pass", and from next time, the write protect state is set (steps S11, S12, S13).

On the other hand, if all the data in the storage circuit DS1 in one page is not "1", the second step writing (status) is not given "pass".

If the second step writing is given "pass", writing is regarded as having been normally completed, and the write status is set to "pass" to finish writing (step S13).

If the second step writing is not given "pass", the count value PC of the write counter is checked (step S14), and if the value exceeds 20, writing is regarded as having not been normally completed, and the write status is set to "fail" to finish writing (step S15). If the count value PC of the write counter is 20 or less, the count value PC of the write counter is increased by 1, and a set value of the write potential Vpgm is increased by 0.2V (step S16), and then the write step (step S8) is again executed through step S7.

Table 4 shows the relationship between data before and after the 10 first step write verification and the threshold value of the memory cell.

TABLE 4

| | Threshold value of memory cell Vth | | |
| --- | --- | --- | --- |
| | | Lower than 0.2 V | Higher than 0.2 V |
| Data DS1/DS2 before | 0/0 | 0/0 | 0/1 |
| n-th 10 first step | 0/1 | 0/1 | 0/1 |
| write verification | 1/1 | 1/1 | 1/1 |

Data DS1/DS2 after n-th 10 first step write verification

Before the n-th 10 first step write verification, the storage circuits DS1 and DS2 can have a value of 0/0, 0/1 or 1/1.

0/0 means that the threshold value of the memory cell has not reached the 10 first step write verification potential by an (n−1)th write step.

0/1 means that the threshold value of the memory cell has reached the 10 first step write verification potential by the (n−1)th write step, but not reached the 10 second step write verification potential.

1/1 means that the threshold value of the memory cell has reached the 10 second step write verification potential by the (n−1)th write step.

It is impossible that the threshold value of the memory cell has reached the 10 second step write verification potential but not reached the 10 first step write verification potential by the (n−1)th write step, so that a state I/O does not exist in the present example.

Before the 1st 10 first step write verification, the storage circuits DS1 and DS2 can have a value of 0/0 or 1/1.

If the threshold value of the memory cell has not reached 0.2V which is the 10 first step write verification potential in the n-th write step, the detection result in the 10 first step write verification is not "pass", so that the value of the data in the storage circuit DS2 is not changed.

If the threshold value of the memory cell has reached 0.2V which is the 10 first step write verification potential in the n-th write step, the detection result in the 10 first step write verification is "pass", so that the value of the data in the storage circuit DS2 is changed to "1".

If the value of the storage circuit DS2 is "1", the data in the storage circuit DS2 is not changed irrespective of the threshold value of the memory cell.

Table 5 shows the relationship between data before and after the 10 second step write verification and the threshold value of the memory cell.

TABLE 5

| | Threshold value of memory cell Vth | | |
| --- | --- | --- | --- |
| | | Lower than 0.4 V | Higher than 0.4 V |
| Data DS1/DS2 before | 0/0 | 0/0 | — |
| n-th 10 second step | 0/1 | 0/1 | 1/1 |
| write verification | 1/1 | 1/1 | 1/1 |

Data DS1/DS2 after n-th 10 second step write verification

Before the n-th 10 second step write verification, the storage circuits DS1 and DS2 can have a value of 0/0, 0/1 or 1/1.

0/0 means that the threshold value of the memory cell has not reached the 10 first step write verification potential by the n-th write step.

0/1 means that the threshold value of the memory cell has reached the 10 first step write verification potential by the n-th write step, but the threshold value of the memory cell has not reached the 10 second step write verification potential by the (n−1)th write step.

1/1 means that the threshold value of the memory cell has reached the 10 second step write verification potential by the (n−1)th write step.

It is impossible that the threshold value of the memory cell has reached the 10 second step write verification potential by the (n−1)th write step but not reached the 10 first step write verification potential by the n-th write step, so that the state I/O does not exist in the present example.

If the threshold value of the memory cell has not reached 0.4V which is the 10 second step write verification potential in the n-th write step, the detection result in the 10 second step write verification is not "pass", so that the data in the storage circuit DS1 is not changed.

If the threshold value of the memory cell has reached 0.4V which is the 10 second step write verification potential in the n-th write step, the detection result in the 10 second step write verification is "pass", so that the data in the storage circuit DS1 is changed to "1".

If the value of the storage circuit DS1 is "1", the data in the storage circuit DS1 is not changed irrespective of the threshold value of the memory cell. 0/0 is not changed by the 10 second step write verification.

(8) Algorithm of Writing Higher-Level Page Data

Figure 52:
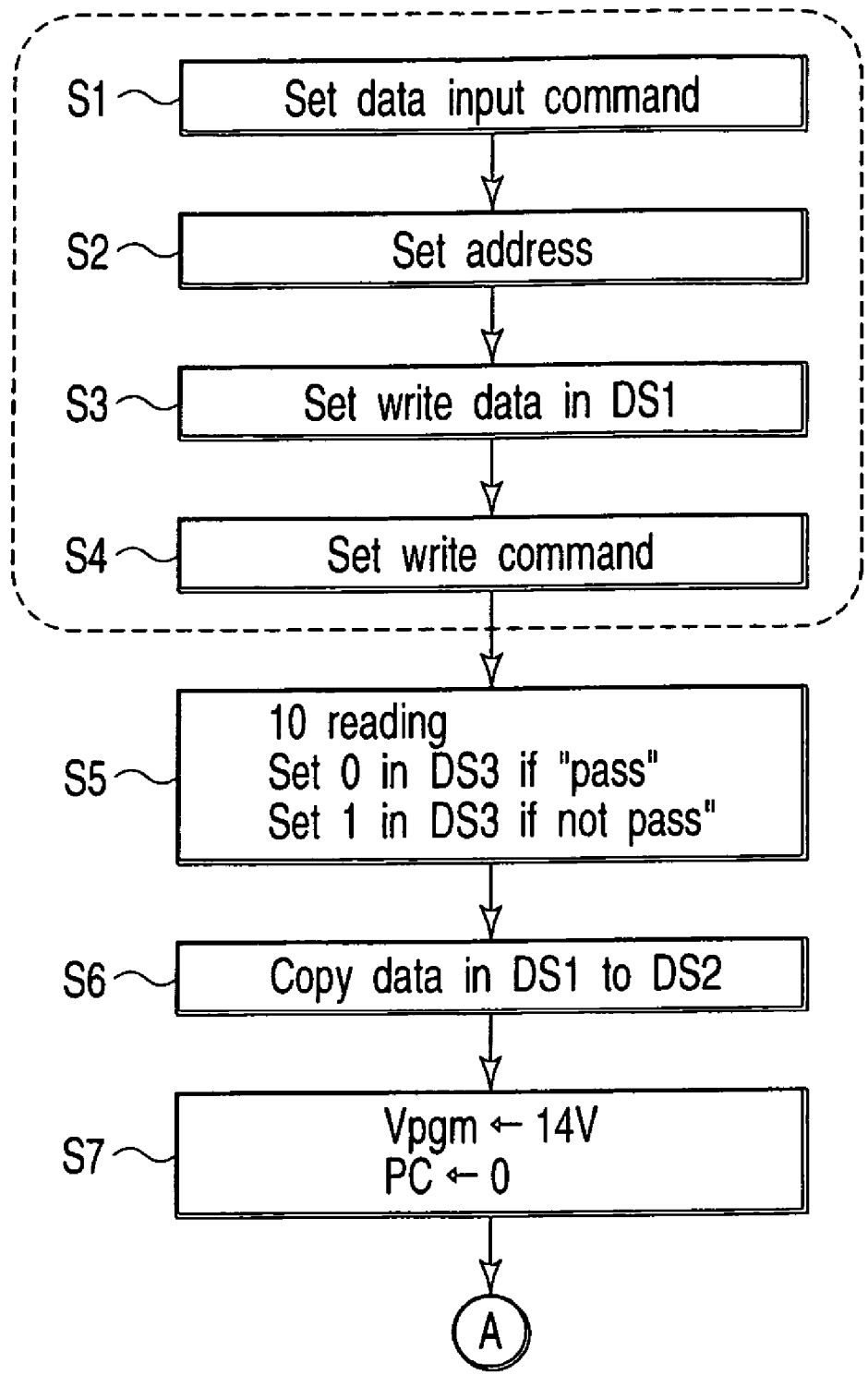
FIG. 52 is a diagram showing an algorithm of writing the higher-level page data.
Figure 53:
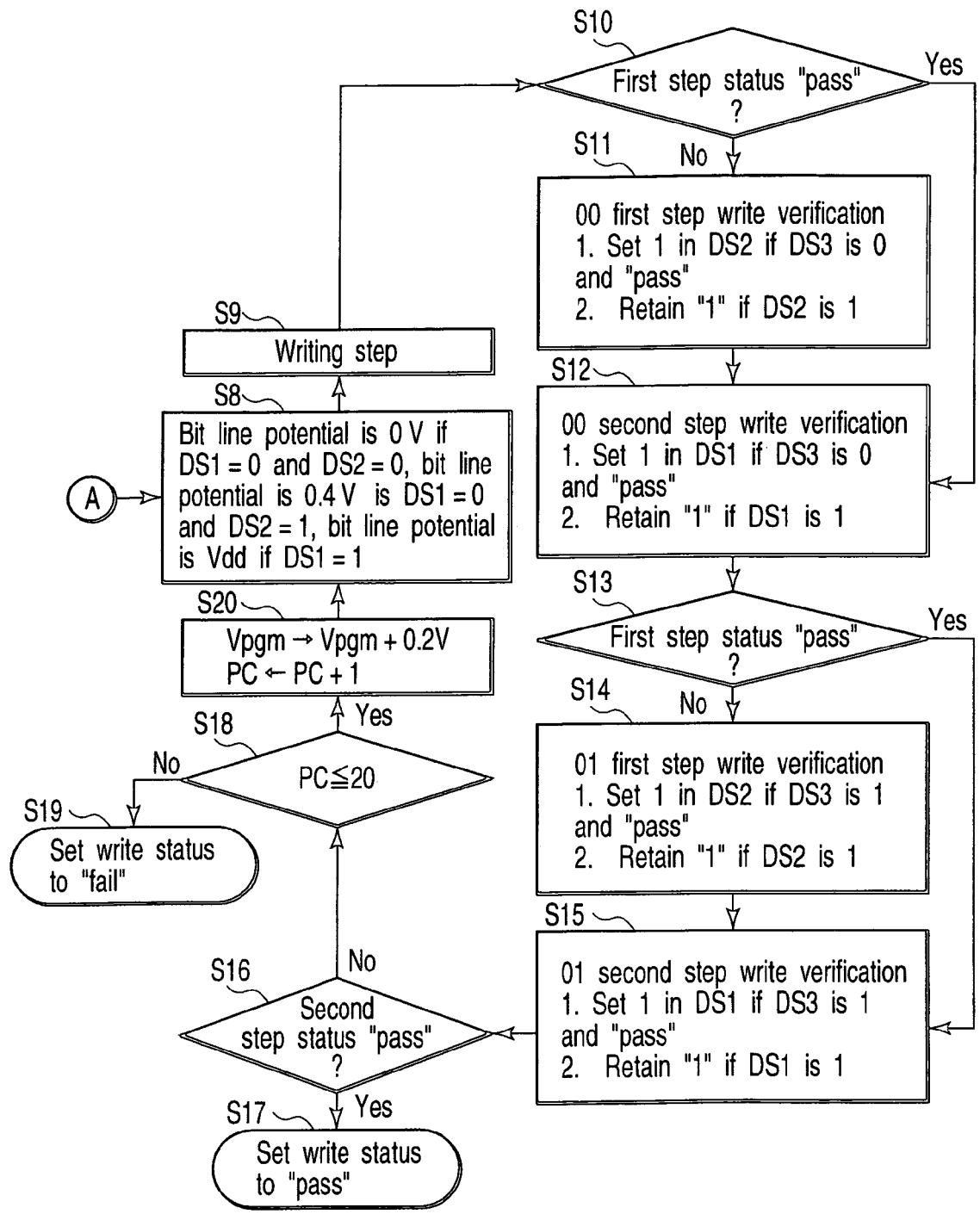
FIG. 53 is a diagram showing an algorithm of writing the higher-level page data.

FIG. 52 and FIG. 53 show an algorithm of writing the higher-level page data.

Here, as in FIG. 51, DS1, DS2 and DS3 indicate the storage circuits disposed in the data circuit, and for example, the DS1 corresponds to the page buffer PB in FIG. 38, the DS2 corresponds to the latch circuit LATCH in FIG. 38, and the DS3 corresponds to the MOS capacitor C1 in FIG. 38. Moreover, PC stands for the program cycle, that is, the number of writing.

First, when a data input command is received from the host microcomputer, the data input command is set in the state machine (step S1). Further, when an address data is received from the host microcomputer, an address for selecting a write page is set in the state machine (step S2).

Next, when a one-page amount of write data is received, the write data is stored in the storage circuit DS1 in the data circuit, and the write data is set (step S3). Subsequently, when a write command issued by the host microcomputer is received, the write command is set in the state machine (step S4).

When the write command is set, the state machine automatically executes the following steps S5 to S20.

First, the 10 reading is performed (step S5). When data in the memory cell is "10" in this reading, it is judged as "pass", and the value of the data in the storage circuit DS3 is set to "0". On the other hand, if the data in the memory cell is "11", it is not judged as "pass", and the value of the data in the storage circuit DS3 is set to "1".

Next, the data in the storage circuit DS1 is copied to the storage circuit DS2 (step S6). Subsequently, the initial value of the write potential Vpgm is set to about 14V, and the count number PC of the write counter is set to "0" (step S7).

If the data in the storage circuit DS1 is "0" and the data in the storage circuit DS2 is "0", it means the first step writing, so that 0V is given to the bit line as the write control potential.

If the data in the storage circuit DS1 is "0" and the data in the storage circuit DS2 is "1", it means the second step writing, so that 0.4V is given to the bit line as the write control potential.

If the data in the storage circuit DS1 is "1" and the data in the storage circuit DS2 is "1", it means the write protect, so that the power supply potential Vdd is given to the bit line as the write control potential (step S8).

Thus, writing is performed into the one-page amount memory cells by use of the write potential Vpgm and the write control potential given to the bit line (step S9).

In the sub-data circuit in which "0" is stored in the storage circuit DS3, whether or not all the data in the storage circuit DS2 is "1" is detected, and if all is "1", the 00 first step writing (status) is given "pass", and if not, it is not given "pass" (step S10). In the sub-data circuit in which "0" is stored in the storage circuit DS3, if all the data in the storage circuit DS2 is "1", the memory cell in which the 00 first step writing is performed in the write step (step S9) does not exist.

If the 00 first step writing is not given "pass", the 00 first step write verification is performed (step S11). At this point, in the sub-data circuit in which "0" is stored in the storage circuit DS3 corresponding to the memory cell with the detection result "pass" among the one-page amount memory cells, the data in the storage circuit DS2 changes from "0" to "1". The storage circuit DS2 storing "1" keeps holding "1".

If the 00 first step writing is given "pass", or if the 00 first step write verification is finished, the 00 second step write verification is performed (step S12). At this point, in the sub-data circuit in which "0" is stored in the storage circuit DS3 corresponding to the memory cell with the detection result "pass" among the one-page amount memory cells, the data in the storage circuit DS1 changes from "0" to "1". The storage circuit DS1 storing "1" keeps holding "1".

Next, in the sub-data circuit in which "1" is stored in the storage circuit DS3, whether or not all the data in the storage circuit DS2 is "1" is detected, and if all is "1", the 01 first step writing (status) is given "pass", and if not, it is not given "pass" (step S13). In the sub-data circuit in which "1" is stored in the storage circuit DS3, if all the data in the storage circuit DS2 is "1", the memory cell in which the 01 first step writing is performed in the write step (step S9) does not exist.

If the 01 first step writing is not given "pass", the 01 first step write verification is performed (step S14). At this point, in the sub-data circuit in which "1" is stored in the storage circuit DS3 corresponding to the memory cell with the detection result "pass" among the one-page amount memory cells, the data in the storage circuit DS2 changes from "0" to "1". The storage circuit DS2 storing "1" keeps holding "1".

If the 01 first step writing is given "pass", or if the 01 first step write verification is finished, the 01 second step write verification is performed (step S15). At this point, in the sub-data circuit in which "1" is stored in the storage circuit DS3 corresponding to the memory cell with the detection result "pass" among the one-page amount memory cells, the data in the storage circuit DS1 changes from "0" to "1". The storage circuit DS1 storing "1" keeps holding "1".

After the 01 second step write verification, whether or not all the data in the storage circuit DS1 is "1" is detected, and if all is "1", the second step writing is given "pass", and if not, it is not given "pass" (step S16).

If the second step writing is given "pass", writing is regarded as having been normally completed, and the write status is set to "pass" to finish writing (step S17).

If the second step status is not given "pass", the count value PC of the write counter is checked (step S18), and if the value exceeds 20, writing is regarded as having not been normally performed, and the write status is set to "fail" to finish writing (step S19). If the count value PC of the write counter is 20 or less, the count value PC of the write counter is increased by 1, and the set value of the write potential Vpgm is increased by 0.2V (step S20), and then the write step (step S9) is again executed through step S8.

Table 6 shows the relationship between data before and after the 01 first step write verification and the threshold value of the memory cell.

TABLE 6

|  | | Threshold value of memory cell Vth | |
|---|---|---|---|
|  | | Lower than 1.2 V | Higher than 1.2 V |
| Data DS1/DS2/DS3 | 0/0/1 | 0/0/1 | 0/1/1 |
| before n-th 01 | 0/1/1 | 0/1/1 | 0/1/1 |
| first step write | 1/1/1 | 1/1/1 | 1/1/1 |
| verification | 0/0/0 | 0/0/0 | 0/0/0 |
|  | 0/1/0 | 0/1/0 | 0/1/0 |
|  | 1/1/0 | 1/1/0 | 1/1/0 |

Data DS1/DS2/DS3 after n-th 01 first step write verification

Before the n-th 01 first step write verification, the storage circuits DS1, DS2 and DS3 can have a value of 0/0/1, 0/1/1, 1/1/1, 0/0/0/, 0/1/0 or 1/1/0.

0/0/1 means that the threshold value of the memory cell has not reached the 01 first step write verification potential by the (n−1)th write step.

0/1/1 means that the threshold value of the memory cell has reached the 01 first step write verification potential by the (n−1)th write step, but not reached the 01 second step write verification potential.

1/1/1 means that the threshold value of the memory cell has reached the 01 second step write verification potential by the (n−1)th write step.

It is impossible that the threshold value of the memory cell has reached the 01 second step write verification potential but not reached the 01 first step write verification potential by the (n−1)th write step, so that a state 1/0/1 does not exist in the present example.

If the threshold value of the memory cell has not reached 1.2V which is the 01 first step write verification potential in the n-th write step, the detection result in the 01 first step write verification is not "pass", so that the value of the data in the storage circuit DS2 is not changed.

If the threshold value of the memory cell has reached 1.2V which is the 01 first step write verification potential in the n-th write step, the detection result in the 01 first step write verification is "pass", so that the value of the data in the storage circuit DS2 is changed to "1".

If the value of the storage circuit DS2 is "1", the data in the storage circuit DS2 is not changed irrespective of the threshold value of the memory cell. Further, because 0/0/0, 0/1/0 and 1/1/0 are not targeted for the 01 first step write verification, data in each circuit is not changed.

Table 7 shows the relationship between data before and after the 01 second step write verification and the threshold value of the memory cell.

TABLE 7

| | Threshold value of memory cell Vth | |
|---|---|---|
| | Lower than 1.4 V | Higher than 1.4 V |
| Data DS1/DS2/DS3 0/0/1 | 0/0/1 | — |
| before n-th 01 0/1/1 | 0/1/1 | 1/1/1 |
| second step write 1/1/1 | 1/1/1 | 1/1/1 |
| verification 0/0/0 | 0/0/0 | 0/0/0 |
| 0/1/0 | 0/1/0 | 0/1/0 |
| 1/1/0 | 1/1/0 | 1/1/0 |

Data DS1/DS2/DS3 after n-th 01 second step write verification

Before the n-th 01 second step write verification, the storage circuits DS1, DS2 and DS3 can have a value of 0/0/1, 0/1/1, 1/1/1, 0/0/0/, 0/1/0 or 1/1/0.

0/0/1 means that the threshold value of the memory cell has not reached the 01 first step write verification potential after the n-th write step.

0/1/1 means that the threshold value of the memory cell has reached the 01 first step write verification potential by the n-th write step, but the threshold value of the memory cell has not reached the 01 second step write verification potential before the (n−1)th write step.

1/1/1 means that the threshold value of the memory cell has reached the 01 second step write verification potential by the (n−1)th write step.

It is impossible that the threshold value of the memory cell has reached the 01 second step write verification potential by the (n−1)th write step but the threshold value of the memory cell has not reached the 01 first step write verification potential by the n-th write step, so that the state 1/0/1 does not exist in the present example.

If the threshold value of the memory cell has not reached 1.4V which is the 01 second step write verification potential in the n-th write step, the detection result in the 01 second step write verification is not "pass", so that the data in the storage circuit DS1 is not changed.

If the threshold value of the memory cell has reached 1.4V which is the 01 second step write verification potential in the n-th write step, the detection result in the 01 second step write verification is "pass", so that the data in the storage circuit DS1 is changed to "1".

If the value of the storage circuit DS1 is "1", the data in the storage circuit DS1 is not changed irrespective of the threshold value of the memory cell. 0/0/1 is not changed by the 01 second step write verification. Further, because 0/0/0, 0/1/0 and 1/1/0 are not targeted for the 01 second step write verification, data in each storage circuit is not changed.

Table 8 shows the relationship between data before and after the 00 first step write verification and the threshold value of the memory cell.

TABLE 8

| | Threshold value of memory cell Vth | |
|---|---|---|
| | Lower than 2.2 V | Higher than 2.2 V |
| Data DS1/DS2/DS3 0/0/1 | 0/0/1 | — |
| before n-th 00 0/1/1 | 0/1/1 | — |
| first step write 1/1/1 | 1/1/1 | — |
| verification 0/0/0 | 0/0/0 | 0/1/0 |
| 0/1/0 | 0/1/0 | 0/1/0 |
| 1/1/0 | 1/1/0 | 1/1/0 |

Data DS1/DS2/DS3 after n-th 00 first step write verification

Before the n-th 00 first step write verification, the storage circuits DS1, DS2 and DS3 can have a value of 0/0/1, 0/1/1, 1/1/1, 0/0/0/, 0/1/0 or 1/1/0.

0/0/0 means that the threshold value of the memory cell has not reached the 00 first step write verification potential after the (n−1)th write step.

0/1/0 means that the threshold value of the memory cell has reached the 00 first step write verification potential, but not reached the 00 second step write verification potential by the (n−1)th write step.

1/1/0 means that the threshold value of the memory cell has reached the 00 second step write verification potential by the (n−1)th write step.

It is impossible that the threshold value of the memory cell has reached the 00 second step write verification potential but not reached the 00 first step write verification potential by the (n−1)th write step, so that the state 1/0/0 does not exist in the present example.

If the threshold value of the memory cell has not reached 2.2V which is the 00 first step write verification potential in the n-th write step, the detection result in the 00 first step write verification is not "pass", so that the value of the data in the storage circuit DS2 is not changed.

If the threshold value of the memory cell has reached 2.2V which is the 00 first step write verification potential in the n-th write step, the detection result in the 00 first step write verification is "pass", so that the data in the storage circuit DS2 is changed to "1".

If the value of the storage circuit DS2 is "1", the data in the storage circuit DS2 is not changed irrespective of the threshold value of the memory cell.

Further, because 0/0/1, 0/1/1 and 1/1/1 are not targeted for the 00 first step write verification, data in each storage circuit is not changed.

Table 9 shows the relationship between data before and after the 00 second step write verification and the threshold value of the memory cell.

TABLE 9

| | Threshold value of memory cell Vth | |
|---|---|---|
| | Lower than 2.4 V | Higher than 2.4 V |
| Data DS1/DS2/DS3 0/0/1 | 0/0/1 | — |
| before n-th 00 0/1/1 | 0/1/1 | — |
| second step write 1/1/1 | 1/1/1 | — |
| verification 0/0/0 | 0/0/0 | — |
| 0/1/0 | 0/1/0 | 1/1/0 |
| 1/1/0 | 1/1/0 | 1/1/0 |

Data DS1/DS2/DS3 after n-th 00 second step write verification

Before the n-th 01 second step write verification, the storage circuits DS1, DS2 and DS3 can have a value of 0/0/1, 0/1/1, 1/1/1, 0/0/0/, 0/1/0 or 1/1/0.

0/0/0 means that the threshold value of the memory cell has not reached the 00 first step write verification potential after the n-th write step.

0/1/0 means that the threshold value of the memory cell has reached the 00 first step write verification potential by the n-th write step, but the threshold value of the memory cell has not reached the 00 second step write verification potential before the (n−1)th write step.

1/1/0 means that the threshold value of the memory cell has reached the 00 second step write verification potential by the (n−1)th write step.

It is impossible that the threshold value of the memory cell has reached the 00 second step write verification potential by the (n−1)th write step but the threshold value of the memory cell has not reached the 00 first step write verification potential by the n-th write step, so that the state 1/0/0 does not exist in the present example.

If the threshold value of the memory cell has not reached 2.4V which is the 00 second step write verification potential in the n-th write step, the detection result in the 00 second step write verification is not "pass", so that the data in the storage circuit DS1 is not changed.

If the threshold value of the memory cell has reached 2.4V which is the 00 second step write verification potential in the n-th write step, the detection result in the 00 second step write verification is "pass", so that the data in the storage circuit DS1 is changed to "1".

If the value of the storage circuit DS1 is "1", the data in the storage circuit DS1 is not changed irrespective of the threshold value of the memory cell. 0/0/0 is not changed by the 00 second step write verification. Further, because 0/0/1, 0/1/1 and 1/1/1 are not targeted for the 00 second step write verification, data in each storage circuit is not changed.

(9) Relationship between Dimension of Memory Cell and Threshold Distribution

Figure 54:
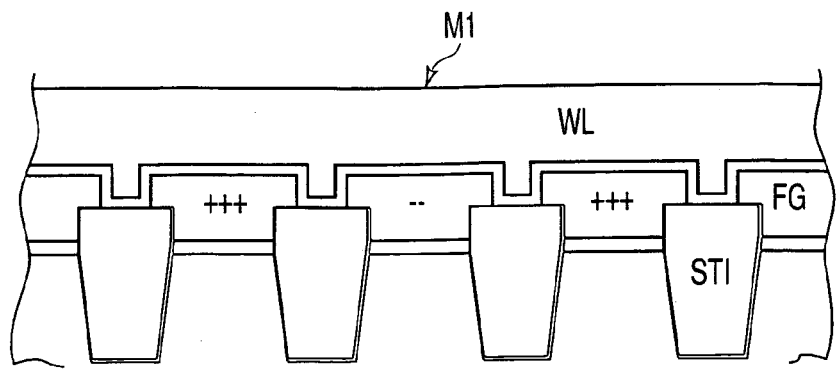
FIG. 54 is a diagram showing a state of electric charges in a floating gate electrode.
Figure 55:
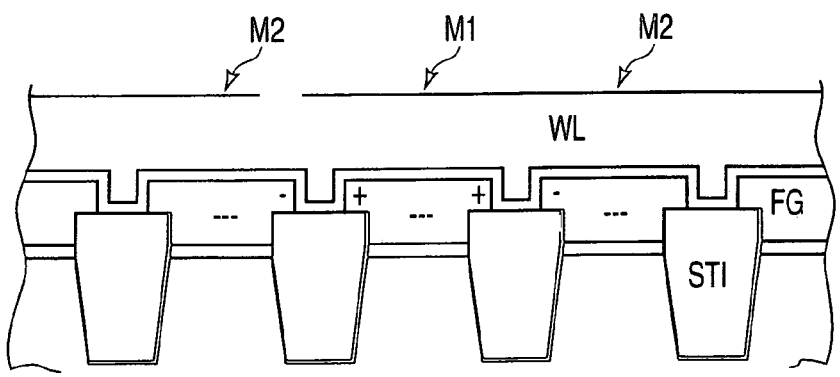
FIG. 55 is a diagram showing a state of electric charges in the floating gate electrode.

FIG. 54 and FIG. 55 show how electric charges in the floating gate electrode change before and after writing into the memory cell linked to the odd bit line.

In the initial state, all the memory cells are in the erased state.

Subsequently, as shown in FIG. 54, if, for example, the 10 writing is performed in the memory cell M1 linked to the even bit line, negative electric charges are injected into the floating gate electrode of the memory cell M1. This state is before writing into the memory cell linked to the odd bit line.

Next, as shown in FIG. 55, if, for example, the 10 writing is performed in the memory cells M2 and M3 linked to the odd bit line, negative electric charges are injected into the floating gate electrodes of the memory cells M2 and M3.

At this point, the electric charges in the floating gate electrode of the memory cell M1 change due to electrostatic coupling capacitance produced between the floating gate electrode of the memory cell M1 and the floating gate electrodes of the memory cells M2 and M3.

Figure 56:
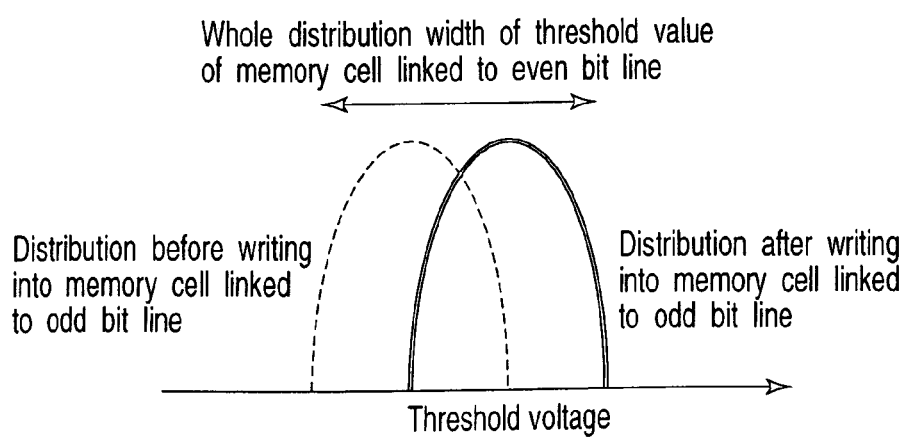
FIG. 56 is a diagram showing the spread of the threshold distribution of the memory cell.

In other words, as shown in FIG. 56, the amount of negative electric charges in the floating gate electrode of the memory cell M1 linked to the even bit line increases, and the threshold value of the memory cell M1 increases.

The threshold value changes more largely as the size of the memory cell decreases and parasitic capacitance produced between the floating gate electrodes of the adjacent memory cells increases. Further, such a phenomenon also apply to the memory cells M2 and M3 linked to the odd bit line before and after writing into the memory cell linked to the even bit line.

In this way, the width of threshold distribution of the memory cell tends to be wider along with the miniaturization of the memory cell. It is therefore conceived that the technique to reduce the width of the threshold distribution as described above will be significantly important in the future.

(10) Procedure of Writing into Memory Cells in Block

Figure 57:
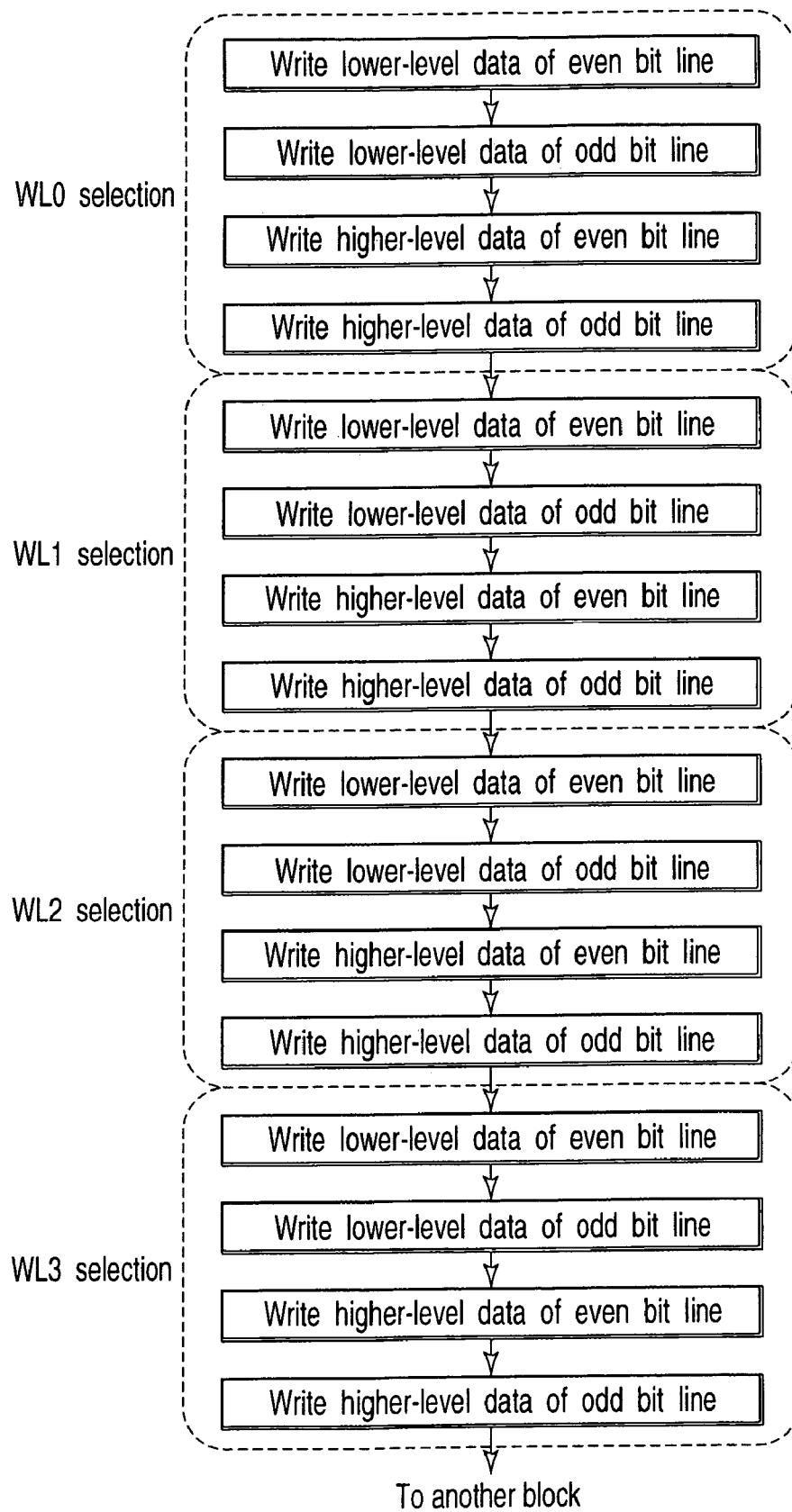
FIG. 57 is a diagram showing a procedure of writing into the memory cells in a block.

FIG. 57 shows an example of order of writing into the memory cells in the block.

Initially, the word line WL0 is selected, and the lower-level data (lower-level page data) is written into one page composed of the memory cells linked to the even bit line. Next, the lower-level data is written into one page composed of the memory cells linked to the odd bit line.

Subsequently, the higher-level data (higher-level page data) is written into one page composed of the memory cells linked to the even bit line. Finally, the higher-level data is written into one page composed of the memory cells linked to the odd bit line.

In the same manner, the word lines WL1, WL2 and WL3 are sequentially selected, and writing into the memory cells in the block is completed.

According to such writing procedure, interference caused between the floating gate electrodes of the adjacent memory cells can be reduced to the minimum. That is, since the higher-level data is written after the lower-level data is written into all the memory cells in one page, it is possible to reduce the difference between the threshold values of the adjacent memory cells during writing, and to reduce a fluctuation amount of the threshold value.

(11) Read Algorithm

Figure 58:
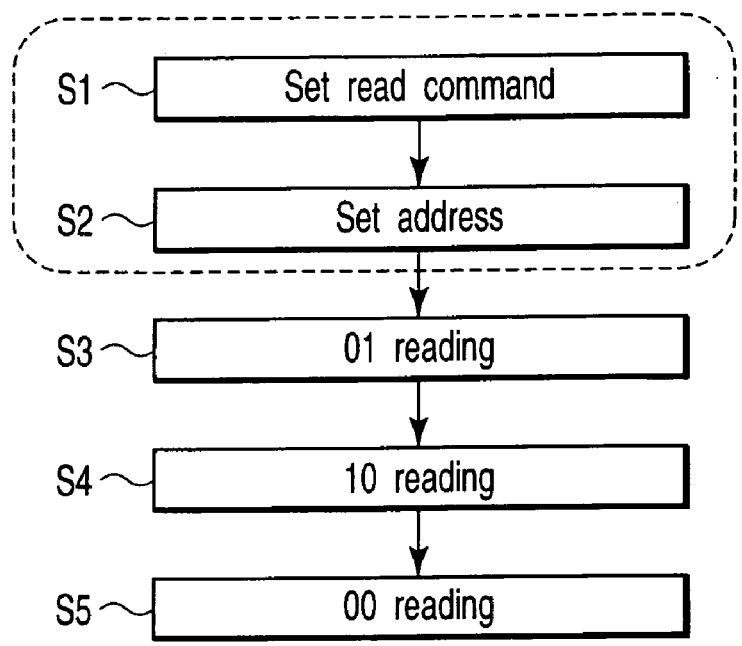
FIG. 58 is a diagram showing an algorithm of reading from a lower-level page.

FIG. 58 shows an algorithm of reading the lower-level page.

First, when a read command is received from the host microcomputer, the state machine sets the read command (step S1). Next, receiving address data from the host microcomputer, the state machine sets an address for selecting a read page (step S2). When the address is set, the state machine automatically executes steps S3 to S5.

First, the 01 reading is performed (step S3). The read data is stored in the storage circuit in the data circuit.

As a result of the 01 reading, if the read data is "1", that is, if the higher-level page data is 1, the 10 reading is performed (step S4). As a result of the 10 reading, if the read data is "1", the lower-level page data is judged to be "1", and if it is "0", the lower-level page data is judged to be "0".

Furthermore, as a result of the 01 reading, if the read data is "0", that is, if the higher-level page data is "0", the 00 reading is performed (step S5). As a result of the 00 reading, if the read data is "1", the lower-level page data is judged to be "1", and if it is "0", the lower-level page data is judged to be "0".

Figure 59:
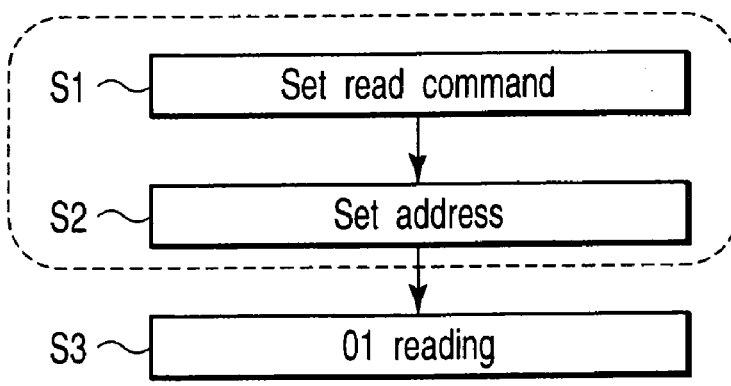
FIG. 59 is a diagram showing an algorithm of reading from a higher-level page.

FIG. 59 shows an algorithm of reading the higher-level page.

First, when a read command is received from the host microcomputer, the state machine sets the read command (step S1). Next, receiving an address data from the host microcomputer, the state machine sets an address for selecting a read page (step S2).

When the address is set, the state machine executes the 01 reading (step S3). The read data is stored in the storage circuit in the data circuit. As a result of the 01 reading, if the read data is "1", the higher-level page data is judged to be "1", and if it is "0", the higher-level page data is judged to be "0".

(12) Modification of Write Step

Figure 60:
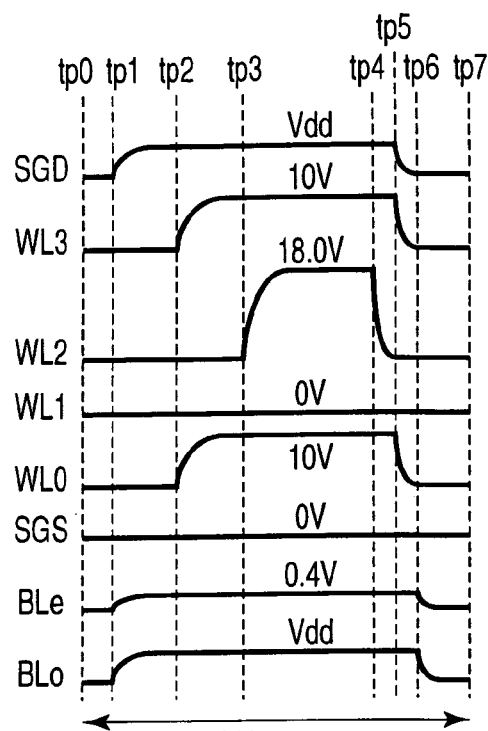
FIG. 60 is a waveform chart showing an example of a write step.
Figure 61:
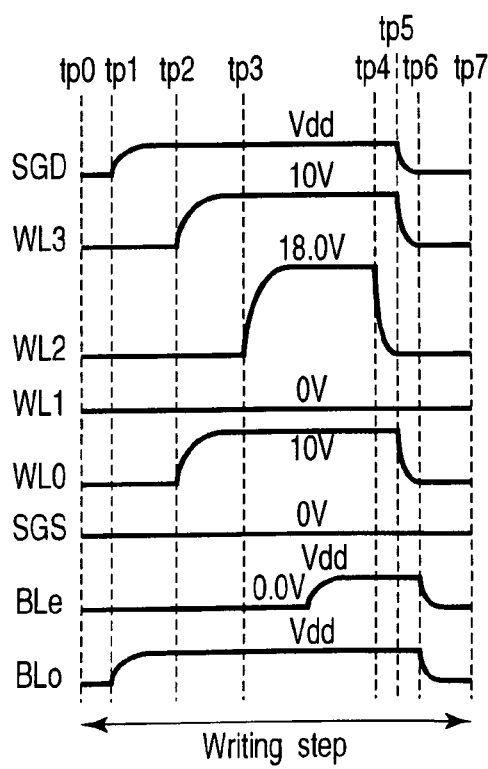
FIG. 61 is a waveform chart showing an example of the write step.

FIG. 60 shows the write step in the waveform chart of FIG. 50. FIG. 61 shows a modification of the write step of FIG. 60.

In an example of FIG. 60, 0.4V is given to the selected bit line BLe as the write control potential. On the contrary, in an example of FIG. 61, the selected bit line BLe is maintained at 0V until a certain period passes after the write potential Vpgm has been given to the word line WL2, and after that period has passed, the selected bit line BLe is set to a write protect potential (e.g., Vdd). In this way, effective write pulse width is decreased, and the threshold value of the memory cell is prevented from increasing.

(13) Modification of Write verification Step

Figure 62:
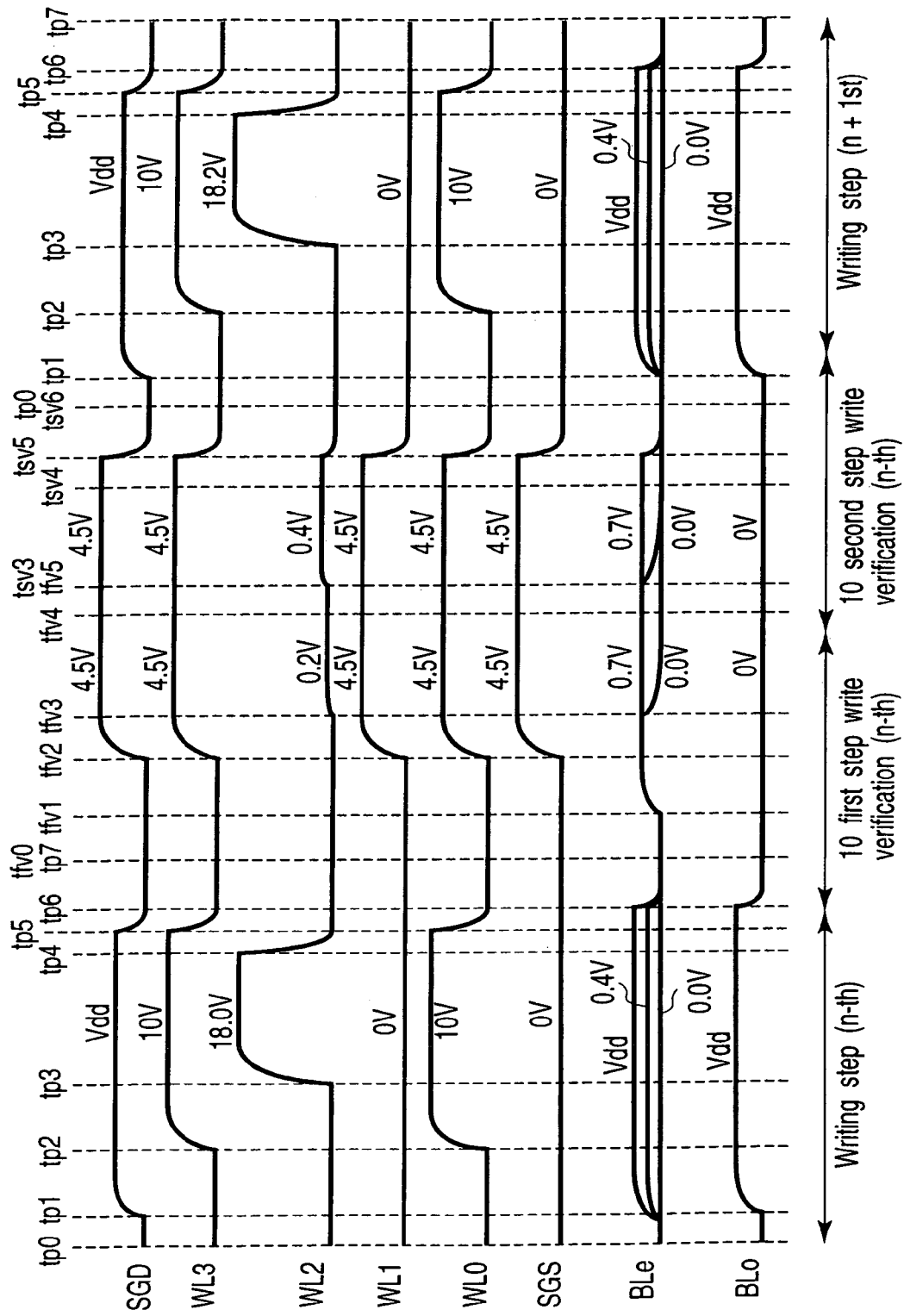
FIG. 62 is a waveform chart showing an example of a write verification step.

FIG. 62 shows a modification of the write verification in the waveform chart of FIG. 50.

In the first step write verification, the selected bit line BLe is first charged to 0.7V. Subsequently, when the selected word line WL2 reaches a first step write verification potential, the potential of the bit line BLe changes in accordance with the threshold value of the memory cell.

For example, when the threshold value of the memory cell has reached the first step write verification potential, the bit line BLe maintains 0.7V, and when it has not reached, the potential of the bit line BLe decreases toward 0V.

Therefore, if the potential of the bit line BLe is detected at time tfv4, it is possible to detect whether or not the threshold value of the memory cell has reached the first step write verification potential. If the threshold value of the memory cell has reached the write verification potential, the detection result will be "pass".

Subsequently, at time tfv5 (time tfv3), the potential of the selected word line WL2 is switched from the first step write verification potential to a second step write verification potential. At this point, if the threshold value of the memory cell has reached the second step write verification potential, the bit line BLe maintains 0.7V, or contrarily, if it has not reached, the potential of the bit line BLe decreases toward 0V.

Therefore, if the potential of the bit line BLe is detected at time tsv4, it is possible to detect whether or not the threshold value of the memory cell has reached the second step write verification potential. If the threshold value of the memory cell has reached the write verification potential, the detection result will be "pass".

Thus, according to the present example, since the time to charge the bit line BLe in the second step write verification can be eliminated, high-speed writing is possible.

It should be noted that the write verification step of the present example can be applied not only to the 10 first and second step write verifications, but also to the 01 first and second step write verifications or the 00 first and second step write verifications.

3. Others

The multi-level NAND-structured flash memory has been described in the above embodiments, but the examples of the present invention can also be applied to ordinary binary NAND-structured flash memories, or flash memories having other types of configurations such as NOR, AND, DINOR.

Furthermore, the examples of the present invention can be applied not only to the flash memory but also to general nonvolatile semiconductor memories.

The examples of the present invention are especially effective in the nonvolatile semiconductor memories generally applied to various systems.

According to the examples of the present invention, it is possible to prevent the erroneous operation caused by a decrease in the power supply voltage of the entire system due to the peak current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A system comprising:
a nonvolatile semiconductor memory; and
an electronic device which includes the nonvolatile semiconductor memory,
wherein the nonvolatile semiconductor memory selects a first operation mode while the nonvolatile semiconductor memory is connected to a first capacitor having a first capacity, and the nonvolatile semiconductor memory selects a second operation mode while the nonvolatile semiconductor memory is connected to a second capacitor having a second capacity higher than a first capacity, and
wherein the nonvolatile semiconductor memory operates in the selected one of the first and second operation modes, the first operation mode is a mode in which a peak of current consumption takes a first value, and a second operation mode is a mode in which a peak of current consumption takes a second value lower than the first value.

2. The system according to claim 1,
wherein the nonvolatile semiconductor memory selects the first operation mode, while the electronic device is connected to an electronic apparatus which includes the first capacitor.

3. The system according to claim 2,
wherein the nonvolatile semiconductor memory selects the second operation mode, while the electronic device is connected to an electronic apparatus which includes the second capacitor.

4. The system according to claim 1,
wherein the nonvolatile semiconductor memory selects one of the first and second operation modes based on a electronic apparatus which is connected to the electronic device.

5. The system according to claim 4,
wherein the electronic apparatus is a digital camera and the nonvolatile semiconductor memory selects the first operation mode.

6. The system according to claim 4,
wherein the electronic apparatus is a computer and the nonvolatile semiconductor memory selects the first operation mode.

7. The system according to claim 4,
wherein the electronic apparatus is a mobile phone and the nonvolatile semiconductor memory selects the second operation mode.

8. The system according to claim 1,
wherein a bit line is charged or discharged at a higher speed in the first operation mode than in the second operation mode.

9. The system according to claim 1,
wherein the peak of current consumption during charging or discharging of a bit line is lower in the second operation mode than in the first operation mode.

10. The system according to claim 9,
wherein the peak of current consumption is decided by a size or a gate potential of a transistor which generates a constant current or a transistor which transfers the constant current.

11. The system according to claim 9,
wherein the peak of current consumption is decided by performance of a page buffer.

12. The system according to claim 1,
wherein a booster circuit is operated at a higher speed in the first operation mode than in the second operation mode.

13. The system according to claim 1,
wherein the peak of current consumption during operation of a booster circuit is lower in the second operation mode than in the first operation mode.

14. The system according to claim 13,
wherein the peak of current consumption is decided by a frequency of a clock signal which drives the booster circuit.

15. The system according to claim 13,
wherein the peak of current consumption is decided by a value of a power supply potential supplied to the booster circuit.

16. The system according to claim 1,
wherein the switchover between the first and second operation modes is performed on the basis of a command input from the outside of a chip.

17. The system according to claim 1,
wherein the switchover between the first and second operation modes is performed on the basis of data stored in a memory cell array inside a chip.

18. The system according to claim 1,
wherein the switchover between the first and second operation modes is performed on the basis of data stored in a fuse element inside a chip.

19. The system according to claim 1,
wherein the switchover between the first and second operation modes is performed on the basis of a signal whose value is fixed during a wafer process or during chip bonding.

20. The system according to claim 1,
wherein the nonvolatile semiconductor memory is a NAND-type flash memory whose memory cell stores one or more bit data.

* * * * *